(12) United States Patent
Yoo et al.

(10) Patent No.: US 11,615,824 B2
(45) Date of Patent: Mar. 28, 2023

(54) SERIALIZER AND MEMORY DEVICE INCLUDING THE SAME

(71) Applicant: Samsung Electronics Co., Ltd., Suwon-si (KR)

(72) Inventors: Changsik Yoo, Seoul (KR); Hyunah An, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/536,282

(22) Filed: Nov. 29, 2021

(65) Prior Publication Data

US 2022/0351763 A1 Nov. 3, 2022

(30) Foreign Application Priority Data

Apr. 28, 2021 (KR) .................. 10-2021-0054800

(51) Int. Cl.
*G11C 7/22* (2006.01)
*G11C 5/14* (2006.01)
*G11C 7/10* (2006.01)

(52) U.S. Cl.
CPC ............. *G11C 7/222* (2013.01); *G11C 5/14* (2013.01); *G11C 7/1039* (2013.01); *G11C 7/1048* (2013.01)

(58) Field of Classification Search
CPC ...... G11C 7/222; G11C 7/1039; G11C 7/1048
USPC .................. 365/233, 219, 220, 221
See application file for complete search history.

(56) References Cited

U.S. PATENT DOCUMENTS

| 5,798,720 | A | 8/1998 | Yano |
| 7,796,064 | B2 | 9/2010 | Kim et al. |
| 9,685,978 | B2 | 6/2017 | Choi et al. |
| 10,644,722 | B2 | 5/2020 | Kim |
| 2009/0161451 | A1* | 6/2009 | Kim .......... G11C 5/14 365/191 |
| 2013/0141994 | A1* | 6/2013 | Ito .......... G11C 7/222 365/193 |
| 2013/0155792 | A1* | 6/2013 | Matsui .......... G11C 11/4096 365/219 |
| 2020/0304114 | A1 | 9/2020 | Arai et al. |
| 2020/0321977 | A1 | 10/2020 | Choi et al. |

FOREIGN PATENT DOCUMENTS

KR 1020120075806 A 7/2012

* cited by examiner

*Primary Examiner* — Connie C Yoha
(74) *Attorney, Agent, or Firm* — Muir Patent Law, PLLC

(57) ABSTRACT

A serializer includes data input circuits configured to receive N-number of pieces of data in parallel, where N is an even number, data connection circuits configured to receive internal clock signals having different phases in different arrangements, and data output circuits configured to output the N-number of pieces of data in sequence in a single cycle of each of the internal clock signals, wherein the data connection circuits operate the data output circuits such that the data output circuits, in response to the internal clock signals, output corresponding data of the N-number of pieces of data in an enable period in the single cycle and have a high impedance state in a disable period in the single cycle.

20 Claims, 53 Drawing Sheets

SERIALIZER AND MEMORY DEVICE INCLUDING THE SAME

CROSS TO REFERENCE TO RELATED APPLICATION(S)

This application claims benefit of priority to Korean Patent Application No. 10-2021-0054800 filed on Apr. 28, 2021 in the Korean Intellectual Property Office, the disclosure of which is incorporated herein by reference in its entirety.

BACKGROUND

Example embodiments of the present disclosure relate to a serializer and a memory device including the same.

A semiconductor device may receive data input in series from another semiconductor device and may convert the data into a parallel form to swiftly process high-capacity data in the semiconductor device. Also, a semiconductor device may convert internal data in parallel form into serial form and may output the converted data to another semiconductor device. In other words, a semiconductor device may include a serializer configured to convert data in parallel form into data in serial form such that serial communication may be performed through a data bus.

Generally, a serializer may have a component for outputting a plurality of pieces of data in sequence in response to a clock signal. As a high-speed semiconductor system has been necessary, a technique for reducing the time for which data is output to a semiconductor device and also to improve signal integrity has been necessary.

SUMMARY

An example embodiment of the present disclosure is to provide a serializer which may sample data using internal clock signals as they are without converting the internal clock signals into signals having a pulse width corresponding to a unit period of output data.

According to an example embodiment of the present disclosure, a serializer includes data input circuits configured to receive N-number of pieces of data in parallel, where N is an even number, data connection circuits configured to receive internal clock signals having different phases in different arrangements, and data output circuits configured to output the N-number of pieces of data in sequence in a single cycle of each of the internal clock signals, wherein the data connection circuits operate the data output circuits such that the data output circuits, in response to the internal clock signals, output corresponding data of the N-number of pieces of data in an enable period in the single cycle, and have a high impedance state in a disable period in the single cycle.

According to an example embodiment of the present disclosure, a serializer includes a plurality of data selectors configured to receive N-number of pieces of data in parallel, to receive internal clock signals having different phases, and to output the N-number of pieces of data in sequence in a single cycle of the internal clock signal, where N is an even number, wherein each of the plurality of data selectors includes a first circuit connected between a first node supplied with a first voltage and a second node, and configured to supply the first voltage from the first node to the second node in response to a corresponding data among the N-number of pieces of data and at least a portion of the internal clock signals, a second circuit connected between a third node supplied with a second voltage and a fourth node, and configured to supply the second voltage from the third node to the fourth node in response to the corresponding data and at least a portion of the internal clock signals, a third circuit configured to electrically connect the second node to the fourth node or to electrically float between the second node and the fourth node in response to at least a portion of the internal clock signals, and a fourth circuit configured to output the corresponding data based on a voltage level of the second node and a voltage level of the fourth node.

According to an example embodiment of the present disclosure, a memory device includes an internal clock generation circuit configured to receive a reference clock signal output from a memory controller and to generate internal clock signals having different phases based on the reference clock signal, and a serializer configured to receive N-number of pieces of data output from a memory core through a data path in parallel, where N is an even number, to receive the internal clock signals output from the internal clock generation circuit, and to output the N-number of pieces of data in sequence in a single cycle of each of the internal clock signals in response to the internal clock signals, wherein the serializer includes a plurality of data selectors, and wherein the plurality of data selectors receive the internal clock signals in different arrangements.

BRIEF DESCRIPTION OF DRAWINGS

The above and other aspects, features, and advantages of the present disclosure will be more clearly understood from the following detailed description, taken in conjunction with the accompanying drawings, in which:

FIGS. 7A to 10A and 7B to 10B are diagrams illustrating an operation of a first data selector according to an example embodiment of the present disclosure;

FIGS. 11A to 14A and 11B to 14B are diagrams illustrating an operation of a second data selector according to an example embodiment of the present disclosure;

FIGS. 15A to 18A and 15B to 18B are diagrams illustrating an operation of a third data selector according to an example embodiment of the present disclosure;

FIGS. 19A to 22A and 19B to 22B are diagrams illustrating an operation of a fourth data selector according to an example embodiment of the present disclosure;

FIGS. 25A to 30A and 25B to 30B are diagrams illustrating an operation of a first data selector according to an example embodiment of the present disclosure.

DETAILED DESCRIPTION

Hereinafter, embodiments of the present disclosure will be described as follows with reference to the accompanying drawings.

Figure 1:
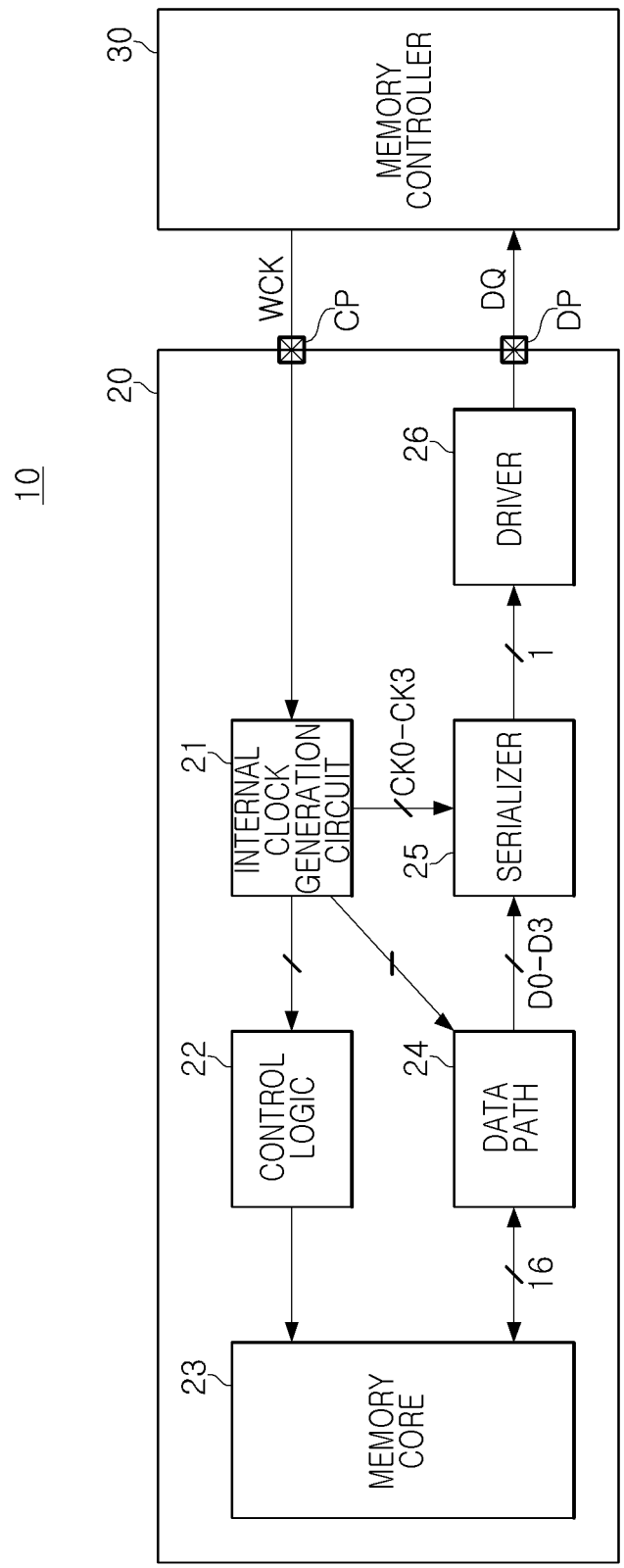
FIG. 1 is a block diagram illustrating a memory system according to an example embodiment of the present disclosure.

FIG. 1 is a block diagram illustrating a memory system according to an example embodiment.

Referring to FIG. 1, a memory system 10 may include a memory device 20 and a memory controller 30. The memory device 20 may be implemented by a graphics double data rate (GDDR5) memory (version 5). The memory controller 30 may be implemented by an application processor (AP), a central processing unit (CPU), or the like.

A data bus for exchanging data and an address/command bus for transmitting addresses/commands may be connected between the memory device 20 and the memory controller 30. The memory device 20 may transmit a clock signal to and receive a clock signal from the memory controller 30 through a clock port CP, and may transmit data to and receive data from the memory controller 30 through a data port DP.

The memory device 20 may include an internal clock generation circuit 21, a control logic 22, a memory core 23, a data path 24, a serializer 25, and a driver 26. The internal clock generation circuit 21 may receive a reference clock signal WCK output from the memory controller 30. The reference clock signal WCK may be a clock signal related to input/output of data. The internal clock generation circuit 21 may generate internal clock signals based on the reference clock signal WCK. The internal clock signals generated from the internal clock generation circuit 21 may be output to the control logic 22, the data path 24, the serializer 25, and the like. For example, the internal clock generation circuit 21 may generate internal clock signals CK0-CK3 having different phases, and output the internal clock signals CK0-CK3 to the serializer 25.

The control logic 22 may control an operation of the memory device 20. The control logic 22 may generate control signals to perform a program or read operation on the memory device 20. The control logic 22 may include a command decoder for decoding a command received from the memory controller 30.

The memory core 23 may include a memory cell array for storing data.

The data path 24 may receive data from the memory core 23. The data path 24 may select the data in response to internal clock signals generated from the internal clock generation circuit 21, and may provide the selected data to the serializer 25. For example, the data path 24 may receive 16 pieces of parallel data from the memory core 23 and may output 4 pieces of parallel data D0-D3 in a single cycle (e.g., T1).

The serializer 25 may be an N:1 serializer configured to serialize N (N is an even number) number of pieces of parallel data using the internal clock signals CK0-CK3. For example, the serializer 25 may receive four pieces of parallel data D0-D3 from the data path 24, and may receive the internal clock signals CK0-CK3 having different phases from the clock generation circuit 21. The serializer 25 may serialize the four pieces of parallel data D0-D3 in response to the internal clock signals CK0-CK3 and may output the serialized data to the driver 26.

The driver 26 may perform impedance matching. Accordingly, when data is transmitted to the memory controller 30 through the data port DP, signal loss may be reduced.

In an example embodiment, when the serializer 25 samples data, the serializer 25 may sample the data using the internal clock signals CK0-CK3 as is without converting the internal clock signals CK0-CK3 into signals having a pulse width corresponding to a unit interval (UI) of the output data. For example, since the internal clock signals CK0-CK3 may not need to go through an UI pulse generator when data is sampled, a transmission path of the internal clock signals CK0-CK3 may be reduced. Accordingly, the time for which the data is output to an external entity from the memory device 20 may be reduced. Also, a phase skew of the signal which may occur due to the UI pulse generator, a jitter factor may be eliminated.

Hereinafter, a 4:1 serializer for serializing four pieces of parallel data using internal clock signals having different phases will be described as an example.

Figure 2:
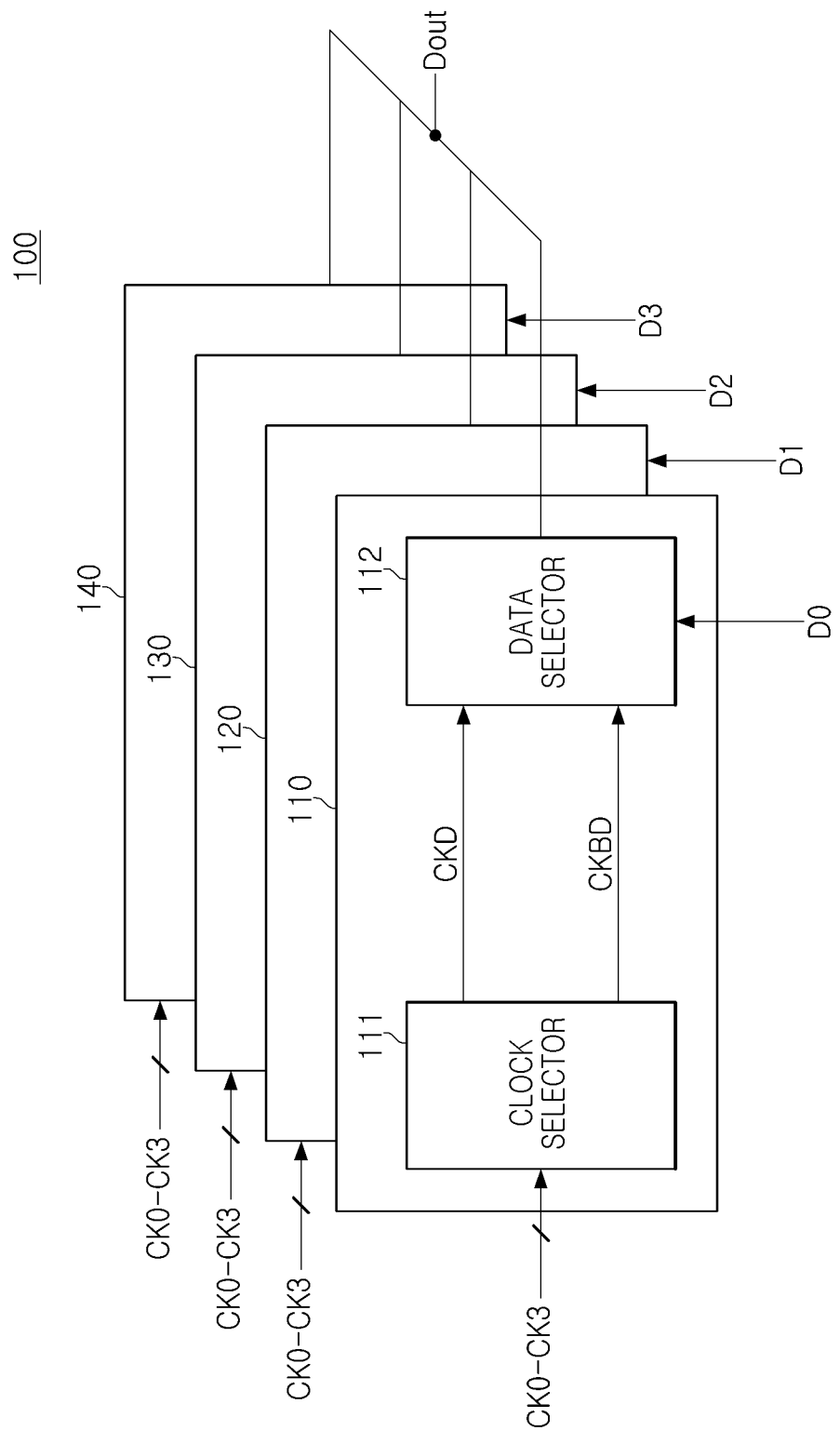
FIG. 2 is a block diagram illustrating a comparative example of a serializer according to an example embodiment of the present disclosure.
Figure 3:
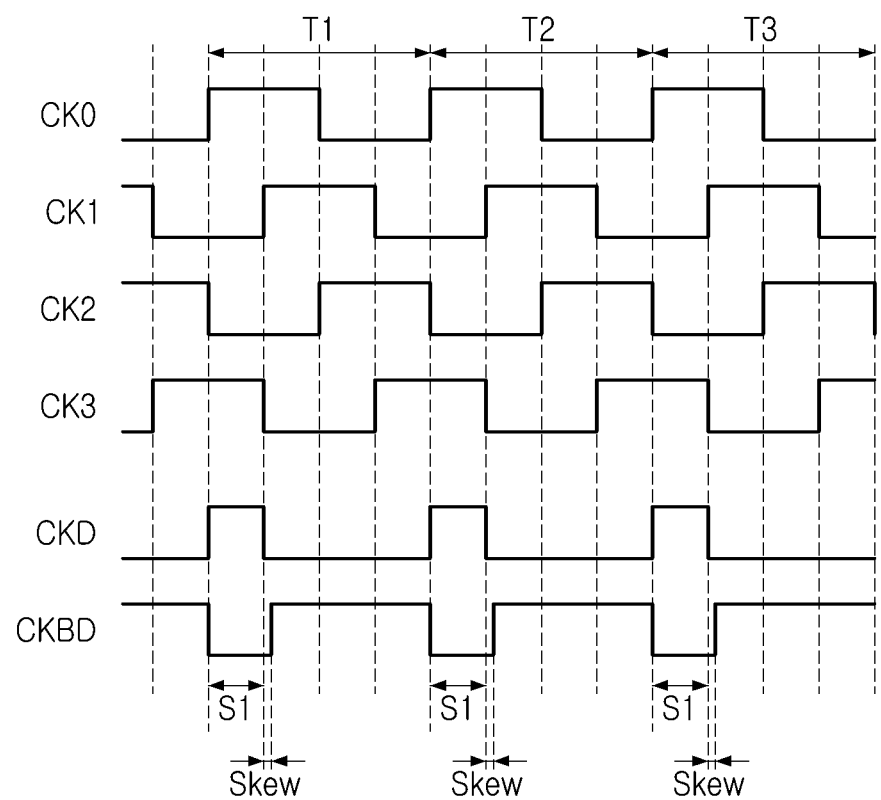
FIG. 3 is a timing diagram illustrating a comparative example of an operation of a serializer according to an example embodiment of the present disclosure.

FIG. 2 is a block diagram illustrating a comparative example of a serializer according to an example embodiment. FIG. 3 is a timing diagram illustrating a comparative example of an operation of a serializer according to an example embodiment.

Referring to FIG. 2, a serializer 100 may include a plurality of selectors 110-140. The plurality of selectors 110-140 may receive four internal clock signals CK0-CK3 having different phases in different arrangements. Each of the plurality of selectors 110-140 may generate selection clock signals CKD and CKBD having a pulse width corresponding to a UI of output data based on the internal clock signals CK0-CK3. The plurality of selectors 110-140 may serialize the data D0-D3 input in parallel in response to the selection clock signals CKD and CKBD and may output the serialized data Dout.

Each of the plurality of selectors 110-140 may include a clock selector 111 and a data selector 112. The clock selector 111 may generate the selection clock signals CKD and CKBD having a pulse width corresponding to the UI of the output data based on the four internal clock signals CK0-CK3 having different phases. The data selector 112 may receive a corresponding data among the data D0-D3 and may output the corresponding input data in response to the selection clock signals CKD and CKBD.

FIG. 3 is a timing diagram illustrating an operation of the first selector 110. Referring to FIGS. 2 and 3 together, the first selector 110 may output the first data D0 as valid data in a first period S1 of each of cycles T1, T2, and T3 of each of the internal clock signals. However, when the clock selector 111 generates the selection clock signals CKD and CKBD, a phase skew of the selection clock signals CKD and CKBD may occur. When a phase skew of the selection clock signals CKD and CKBD occurs, jitter caused by a duty offset may be induced. Accordingly, the size of an effective window of the first data D0 may decrease, which may be disadvantageous in terms of signal integrity (SI).

In an example embodiment, when the serializer samples data, the serializer may sample data using the internal clock signals CK0-CK3 as is without converting the internal clock signals CK0-CK3 into signals having a pulse width corresponding to the UI of the output data. Since the internal clock signals CK0-CK3 may not need to go through the clock selector, the transmission path of the internal clock signals CK0-CK3 may be reduced. Accordingly, the time for which data is output to an external entity may be reduced.

Also, the phase skew of the signal which may occur due to the clock selector may be eliminated, such that the jitter factor may be eliminated. Accordingly, signal integrity (SI) may improve.

Figure 4:
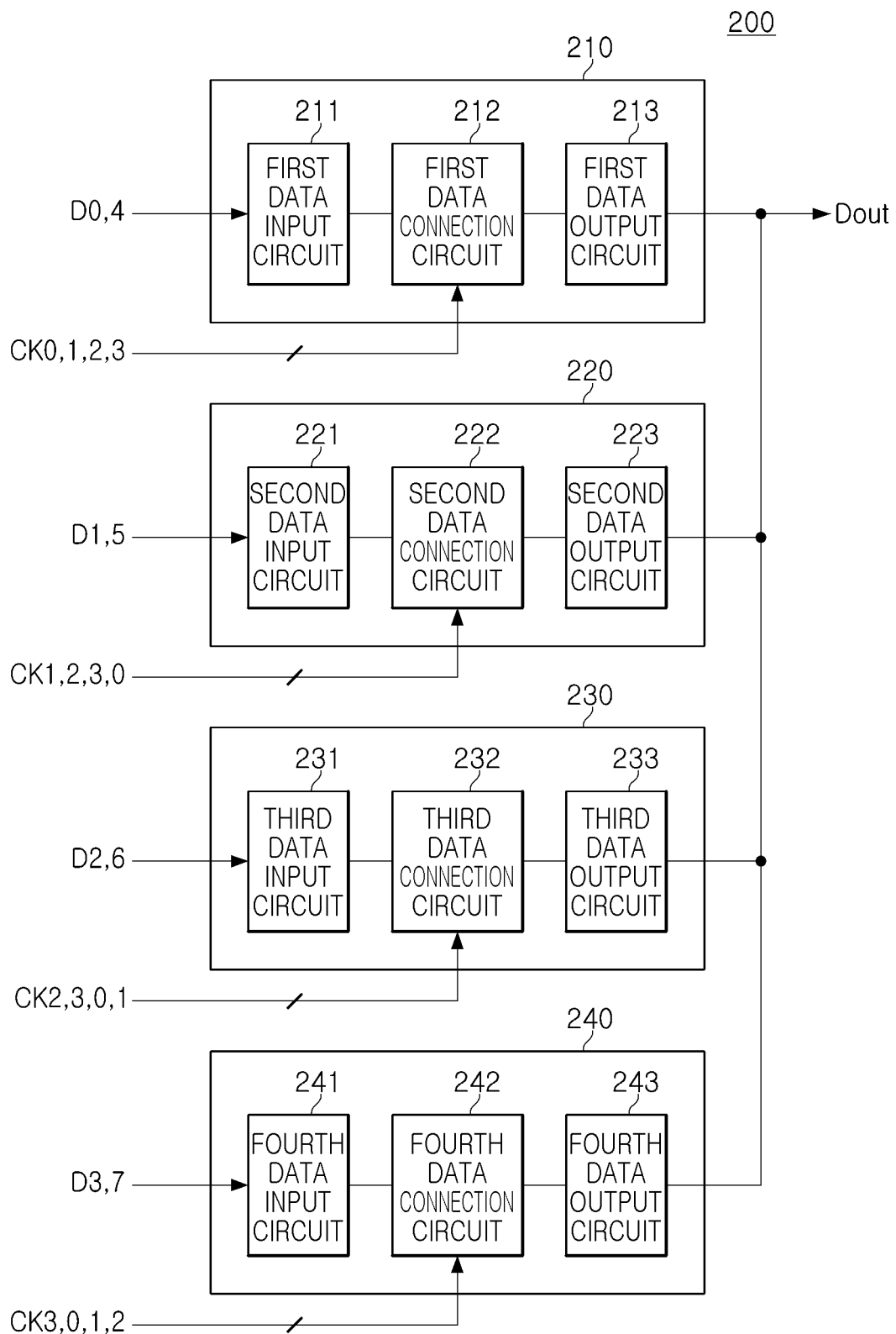
FIG. 4 is a block diagram illustrating a serializer according to an example embodiment of the present disclosure.
Figure 5:
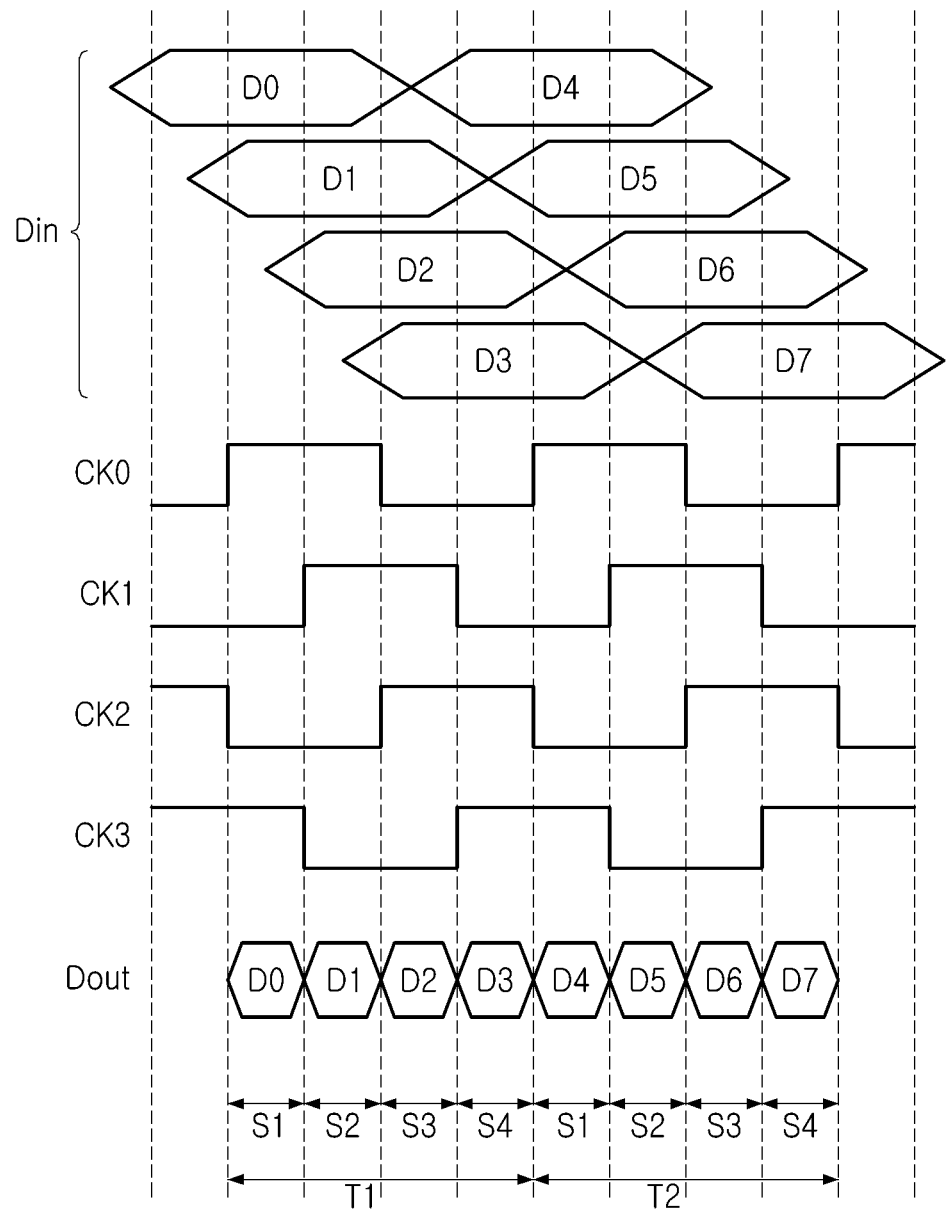
FIG. 5 is a timing diagram illustrating an operation of a serializer according to an example embodiment of the present disclosure.

FIG. 4 is a block diagram illustrating a serializer according to an example embodiment. FIG. 5 is a timing diagram illustrating an operation of the serializer of FIG. 4 according to an example embodiment.

Referring to FIG. 4, a serializer 200 may include first to fourth data selectors 210-240. The first to fourth data selectors 210-240 may receive internal clock signals CK0-CK3 having different phases. Circuits corresponding to each other in the first to fourth data selectors 210 to 240 may receive different internal clock signals. The first to fourth data selectors 210-240 may serialize data D0-D3 input in parallel in response to the internal clock signals CK0-CK3 and may output the serialized data Dout. The first to fourth data selectors 210 to 240 may have the same structure. The first to fourth data selectors 210 to 240 may include data input circuits 211, 221, 231, and 241, data connection circuits 212, 222, 223, and 224, and data output circuits 213, 223, 233, and 243, respectively.

The data input circuits 211, 221, 231, and 241 may receive four data D0-D3 in parallel.

The data connection circuits 212, 222, 223, and 224 may receive internal clock signals CK0-CK3 having different phases. The data connection circuits 212, 222, 223, and 224 may receive the internal clock signals CK0-CK3 in different arrangements. Accordingly, circuits corresponding to each other in the data connection circuits 212, 222, 223 and 224 may receive different internal clock signals. For example, when the internal clock signals are input in an arrangement of the first internal clock signal CK0, the second internal clock signal CK1, the third internal clock signal CK2, and the fourth internal clock signal CK3 to the first data connection circuit 212, the internal clock signals may be input to the second data connection circuit 222 in an arrangement of the second internal clock signal CK1, the third internal clock signal CK2, the fourth internal clock signal CK3, and the first internal clock signal CK0, the internal clock signals may be input to the third data connection circuit 232 in an arrangement of the third internal clock signal CK2, the fourth internal clock signal CK3, the first internal clock signal CK0, and the second internal clock signal CK1, and the internal clock signals may be input to the fourth data connection circuit 242 in an arrangement of the fourth internal clock signal CK3, the first internal clock signal CK0, the second internal clock signal CK1, and the third internal clock signal CK2. The data connection circuits 212, 222, 223, and 224 may activate the data selectors 210-240 in sequence in a single cycle (e.g., T1) of the internal clock signal.

As the data selectors 210-240 are activated in sequence, the data output circuits 213, 223, 233, and 243 may transmit the four data D0-D3 in sequence in a single cycle (e.g., T1) of the internal clock signal.

Referring to FIGS. 4 and 5 together, phases of the first to fourth internal clock signals CK0-CK3 may be shifted from each other by 90 degrees. The first to fourth internal clock signals CK0-CK3 may have the same logic value or different logic values in the four periods S1, S2, S3, and S4 in each single cycle T1 and T2 of each of the internal clock signals.

For example, since the first data connection circuit 212 may receive the internal clock signals in an arrangement of the first internal clock signal CK0, the second internal clock signal CK1, the third internal clock signal CK2, and the fourth internal clock signal CK3, the logical values of the first to fourth internal clock signals CK0-CK3 may form a bit stream of "1001" in the first period S1, may form a bit stream of "1100" in the second period S2, may form a bit stream of "0110" in the third period S3, and may form a bit stream of "0011" in the fourth period S4. As for the first data selector 210, the first period S1 in which the logical values of the first to fourth internal clock signals CK0-CK3 form a bit stream of "1001" may be defined as an enable period, and the second to fourth periods S2-S4 may be defined as disable periods. Accordingly, when the first data input circuit 211 receives the first data D0, the first data output circuit 213 may output the first data D0 as valid data in the first period S1, and may have a high impedance Hi-Z state in the second to fourth periods S2-S4.

Similarly, since the second data connection circuit 222 may receive the internal clock signals in an arrangement of the second internal clock signal CK1, the third internal clock signal CK2, the fourth internal clock signal CK3, and the first internal clock signal CK0, the logical values of the second, third, fourth, and first internal clock signals CK1, CK2, CK3, and CK0 may form a bit stream of "0011" in the first period S1, may form a bit stream of "1001" in the second period S2, may form a bit stream of "1100" in the third period S3, and may form a bit stream of "0110" in the fourth period S4. As for the second data selector 220, the second period S2 in which the logical values of the second, third, fourth, and first internal clock signals CK1, CK2, CK3, and CK0 form a bit stream of "1001" may be defined as an enable period, and the first period S1, the third period S3, and the fourth period S4 may be defined as disable periods. Accordingly, when the second data input circuit 221 receives the second data D1, the second data output circuit 223 may output the second data D1 as valid data in the second period S2, and may have a high impedance Hi-Z state in the first period S1, the third period S3, and the fourth period S4.

Since the third data connection circuit 232 receives the internal clock signals in an arrangement of the third internal clock signal CK2, the fourth internal clock signal CK3, the first internal clock signal CK0, and the second internal clock signal CK1, the logical values of the third, fourth, first, and second internal clock signals CK2, CK3, CK0, and CK1 may form a bit stream of "0110" in the first period S1, may form a bit stream of "0011" in the second period S2, may form a bit stream of "1001" in the third period S3, and may form a bit stream of "1100" in the fourth period S4. As for the third data selector 230, the third period S3 in which the logical values of the third, fourth, first, and second internal clock signals CK2, CK3, CK0, and CK1 form a bit stream of "1001" may be defined as an enable period, and the first period S1, the second period S2, and the fourth period S4 may be defined as disable periods. Accordingly, when the third data input circuit 231 receives the third data D2, the third data output circuit 233 may output the third data D2 as valid data in the third period S3, and may have a high impedance Hi-Z state in the first period S1, the second period S2, and the fourth period S4.

Since the fourth data connection circuit 242 receives the internal clock signals in an arrangement of the fourth internal clock signal CK3, the first internal clock signal CK0, the second internal clock signal CK1, and the third internal clock signal CK2, the logical values of the fourth, first, second, and third internal clock signals CK3, CK0, CK1, and CK2 may form a bit stream of "1100" in the first period S1, may form a bit stream of "0110" in the second period S2, may form a bit stream of "0011" in the third period S3, and may form a bit stream of "1001" in the fourth period S4. As for the fourth data selector 240, the fourth period S4 in which the logical values of the fourth, first, second, and third internal clock signals CK3, CK0, CK1, and CK2 form a bit stream of "1001" may be defined as an enable period, and the first to third periods S1 to S3 may be defined as disable periods. Accordingly, when the fourth data input circuit 241 receives the fourth data D3, the fourth data output circuit 243 may output the fourth data D3 as valid data in the fourth period S4, and may have a high impedance Hi-Z state in the first to third periods S1 to S3.

In an example embodiment, the first to fourth data selectors 210 to 240 may receive the internal clock signals CK0-CK3 having different phases in different arrangements such that the first to fourth data selectors 210 to 240 may be activated in sequence in the single cycle T1 of each of the internal clock signals. The first to fourth data selectors 210-240 activated in sequence may output the data D0-D3 input in parallel in sequence. Since the first to fourth data selectors 210 to 240 may sample data using the internal clock signals CK0-CK3 as is, the transmission path of the internal clock signals CK0-CK3 may be reduced. Also, since it is not necessary to convert the internal clock signals CK0 to CK3 into a signal having a pulse width corresponding to the UI of the output data, a phase skew of a signal which may occur due to the clock selector may be eliminated.

In an example embodiment, the first to fourth data selectors 210 to 240 may receive the internal clock signals CK0-CK3 having different phases in different arrangements such that the first to fourth data selectors 210 to 240 may be activated in sequence in a single cycle T2 of each of the internal clock signals after the single cycle T1. The first to fourth data selectors 210-240 activated in sequence may output the data D4-D7 input in parallel in sequence.

Figure 6:
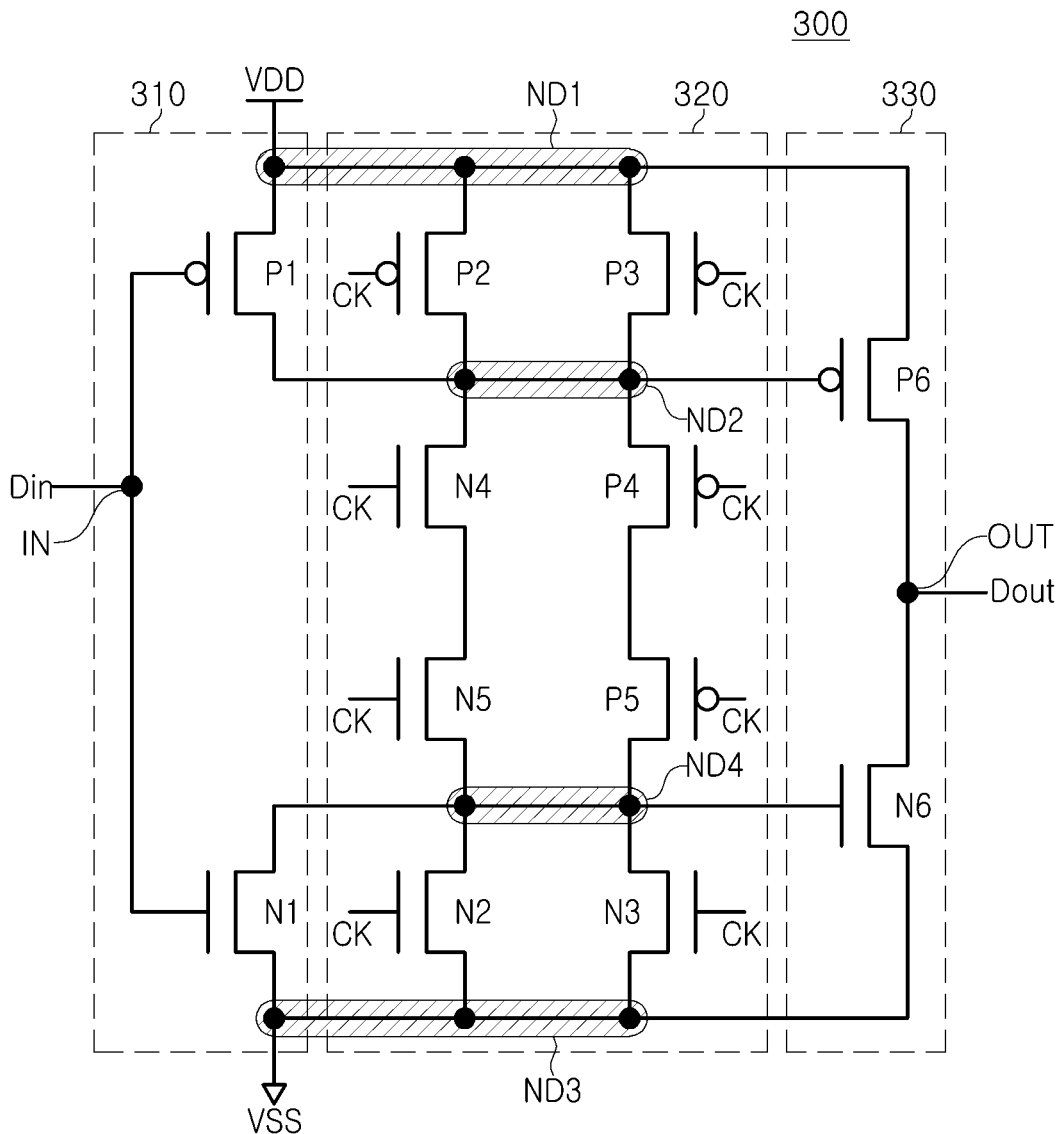
FIG. 6 is a circuit diagram illustrating a data selector according to an example embodiment of the present disclosure.

FIG. 6 is a circuit diagram illustrating a data selector according to an example embodiment.

Referring to FIG. 6, a data selector 300 may include a first node ND1 receiving a first voltage VDD (e.g., a power voltage), a second node ND2, a third node ND3 receiving a second voltage VSS (e.g., a ground voltage), a fourth node ND4, first to third PMOS transistors P1-P3, first to third NMOS transistors N1-N3, fourth and fifth NMOS transistors N4 and N5, fourth and fifth PMOS transistors P4 and P5, a sixth PMOS transistor P6, and a sixth NMOS transistor N6.

The first to third PMOS transistors P1 to P3 may refer to a first circuit which may be electrically connected in parallel between the first node ND1 and the second node ND2 and may supply the first voltage VDD from the first node ND1 to the second node ND2 in response to a corresponding data Din and at least a portion of the internal clock signals CK0-CK3.

The first to third NMOS transistors N1-N3 may refer to a second circuit which may be electrically connected between the third node ND3 and the fourth node ND4 in parallel and may supply the second voltage VSS from the third node ND3 to the fourth node ND4 in response to the corresponding data Din and at least a portion of the internal clock signals CK0-CK3.

The fourth and fifth NMOS transistors N4 and N5 may be connected in series between the second node ND2 and the fourth node ND4, the fourth and fifth PMOS transistors P4 and P5 may be connected in series between the second node ND2 and the fourth node ND4, and the fourth and fifth NMOS transistors N4 and N5 and the fourth and fifth PMOS transistors P4 and P5 may refer to a third circuit which may electrically connect the second node ND2 to the fourth node ND4 or may open the second node ND2 and the fourth node ND4 in response to at least a portion of the internal clock signals CK0-CK3.

The sixth PMOS transistor P6 and the sixth NMOS transistor N6 may be connected in series between the first node ND1 and the third node ND3, a gate of the sixth PMOS transistor P6 may be connected to the second node ND2, and a gate of the sixth NMOS transistor N6 may be connected to the fourth node ND4. The sixth PMOS transistor P6 and the sixth NMOS transistor N6 may refer to a fourth circuit which may output the corresponding data Din based on a voltage level of the second node ND2 and a voltage level of the fourth node ND4.

The data selector 300 may include a data input circuit 310, a data connection circuit 320, and a data output circuit 330.

The data input circuit 310 may include the first PMOS transistor P1 having one end connected to the first node ND1 and the other end connected to the second node ND2, and including a gate receiving the corresponding data Din through and input node IN, and the first NMOS transistor N1 having one end connected to the third node ND3 and the other end connected to the fourth node ND4, and including a gate receiving the responding data Din through the input node IN.

The data connection circuit 320 may include the second to fifth PMOS transistors P2-P5 and the second to fifth NMOS transistors N2-N5. Gates of each of the second to fifth PMOS transistors P2-P5 and the second to fifth NMOS transistors N2-N5 may receive one of the internal clock signals CK0-CK3.

The data output circuit 330 may include the sixth PMOS transistor P6 having one end connected to the first node ND1 and including a gate connected to the second node ND2, and the sixth NMOS transistor N6 having one end connected to the third node ND3 and including a gate connected to the fourth node ND4, and the other end of the sixth PMOS transistor P6 and the other end of the sixth NMOS transistor N6 may be connected to each other in an output node OUT. The data output circuit 330 may output data Dout through the output node OUT.

FIGS. 7A to 10A and 7B to 10B are diagrams illustrating an operation of a first data selector according to an example embodiment. FIGS. 11A to 14A and 11B to 14B are diagrams illustrating an operation of a second data selector according to an example embodiment. FIGS. 15A to 18A and 15B to 18B are diagrams illustrating an operation of a third data selector according to an example embodiment. FIGS. 19A to 22A and 19B to 22B are diagrams illustrating an operation of a fourth data selector according to an example embodiment.

Operations of first data selectors 400A-400D will be described with reference to FIGS. 7A to 10A and 7B to 10B. Each of first data selectors 400A-400D may include a first data input circuit 410, a first data connection circuit 420, and a first data output circuit 430. The first data connection circuit 420 may receive the internal clock signals CK0-CK3 in an arrangement of the first internal clock signal CK0, the second internal clock signal CK1, the third internal clock signal CK2, and the fourth internal clock signal CK3. The first data input circuit 410 may operate in response to the first data D0. When the logic level of the first data D0 is a first level (e.g., low level), the first PMOS transistor P1 may be turned on, and the first NMOS transistor N1 may be turned off. The first data connection circuit 420 may operate in response to the first to fourth internal clock signals CK0-CK3. The first data output circuit 430 may operate in response to the levels of the second node ND2 and the fourth node ND4.

Figure 7A:
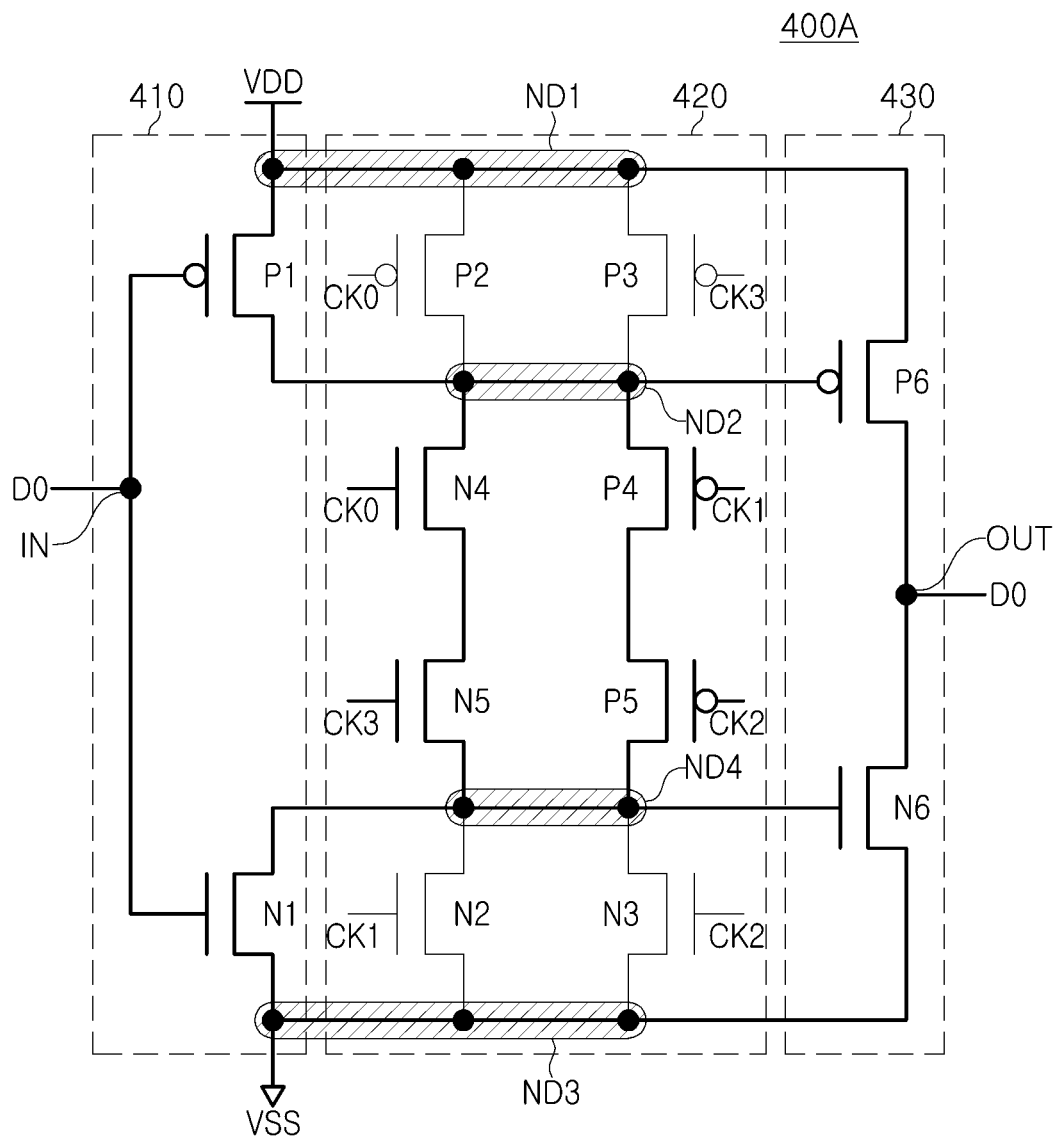
Figure 7B:
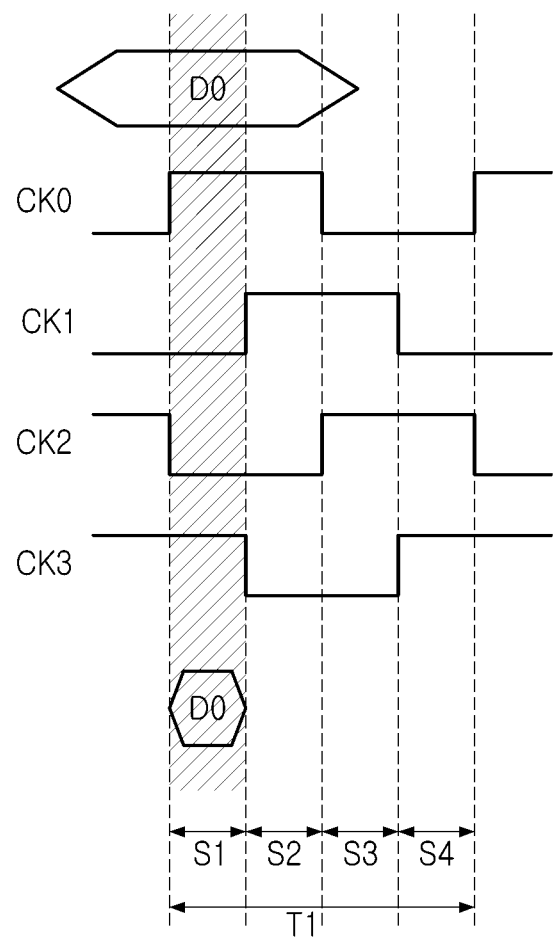

Referring to FIGS. 7A and 7B, in the first period S1 in a single cycle T1 of each of the internal clock signals, the first to fourth internal clock signals CK0-CK3 may have a logic value of "1001". The second PMOS transistor P2, the third PMOS transistor P3, the second NMOS transistor N2, and the third NMOS transistor N3 may be turned off, and the fourth NMOS transistor N4, the fifth NMOS transistor N5, the fourth PMOS transistor P4, and the fifth PMOS transistor P5 may be turned on. Accordingly, the second node ND2 may be electrically connected to the fourth node ND4.

When the first data D0 has a first level (e.g., low level), the second node ND2 may have a second level (e.g., a high level) by the power voltage VDD, and the fourth node ND4 electrically connected to the second node ND2 may also have the second level.

The sixth PMOS transistor P6 may be turned off by the level of the second node ND2 having the second level (e.g., high level), and the sixth NMOS transistor N6 may be turned on by the level of the fourth node ND4 having the second level (e.g., high level). The output node OUT may have the same first level (e.g., low level) as the logic level of the first data D0 by the ground voltage VSS.

When the first data D0 has a second level (e.g., high level), the fourth node ND4 may have a first level (e.g., low level) by the second voltage VSS, and the second node ND2 electrically connected to the fourth node ND4 may also have the first level.

The sixth PMOS transistor P6 may be turned on by the level of the second node ND2 having the first level (e.g., low level), and the sixth NMOS transistor N6 may be turned off by the level of the fourth node ND4 having the first level (e.g., low level). The output node OUT may have the same second level as the logic level of the first data D0 by the power voltage VDD.

Accordingly, the first data selector 400A may output the input data D0 as valid data in the first period S1 in the single cycle T1 of each of the internal clock signals, and may operate as an equivalent circuit in which two inverters are connected to each other.

Figure 8A:
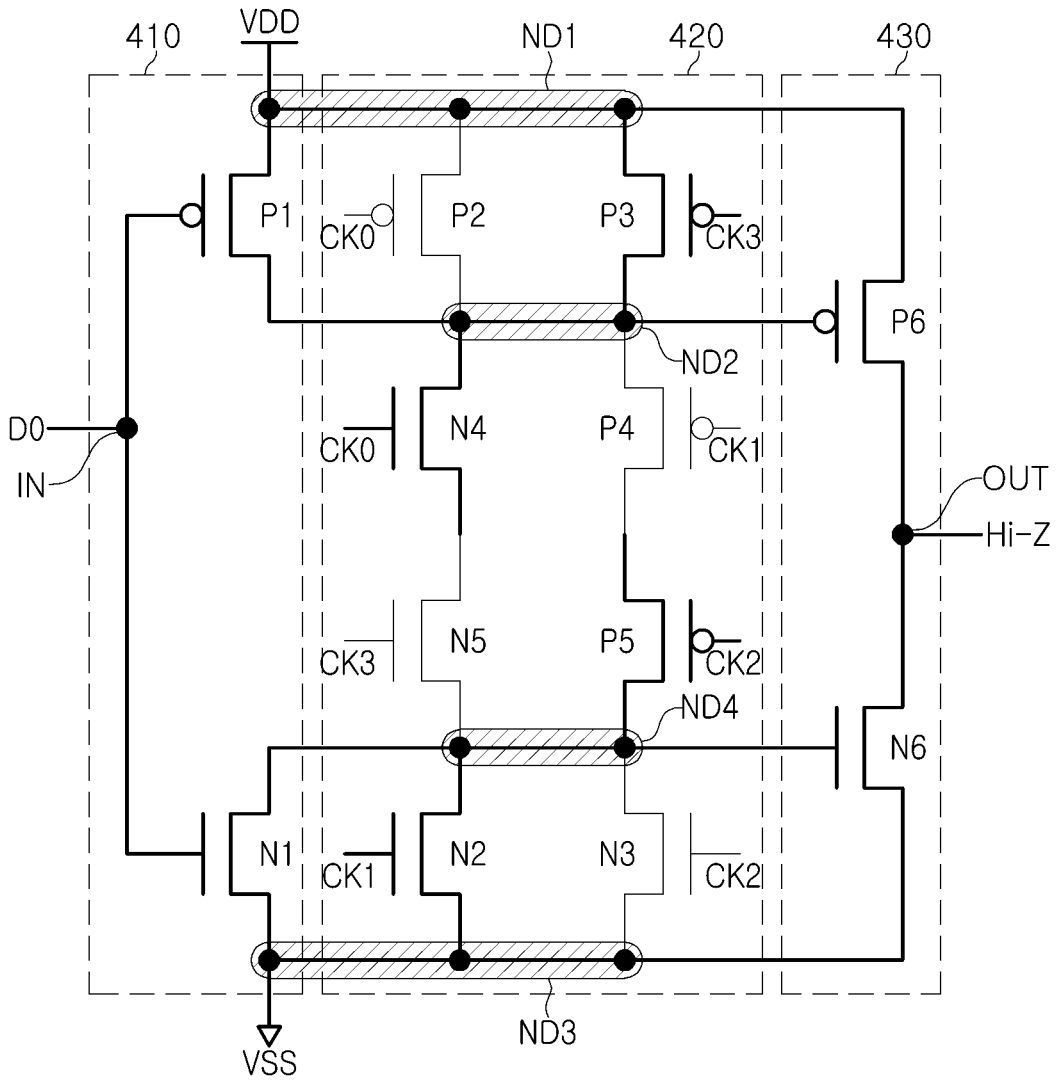
Figure 8B:
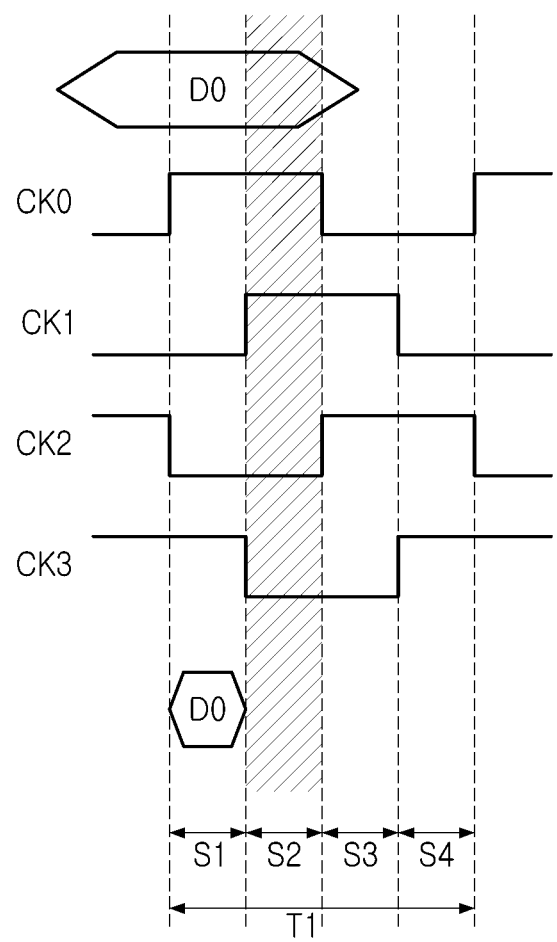

As illustrated in FIGS. 8A and 8B, the logic values of the first to fourth internal clock signals CK0-CK3 may form a bit stream of "1100" in the second period S2 in the single cycle T1 of each of the internal clock signals. The second PMOS transistor P2, the fourth PMOS transistor P4, the third NMOS transistor N3, and the fifth NMOS transistor N5 may be turned off, and the second NMOS transistor N2, the fourth NMOS transistor N4, the third PMOS transistor P3, and the fifth PMOS transistor P5 may be turned on. Accordingly, the section between the second node ND2 and the fourth node ND4 may be open, or the third circuit may be electrically floated between the second node ND2 and the fourth node ND4. The second node ND2 may have a second level (e.g., a high level) by the power voltage VDD, and the fourth node ND4 may have the first level by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 400B may have a high impedance Hi-Z state in the second period S2 in the single cycle T1 of each of the internal clock signals.

Figure 9A:
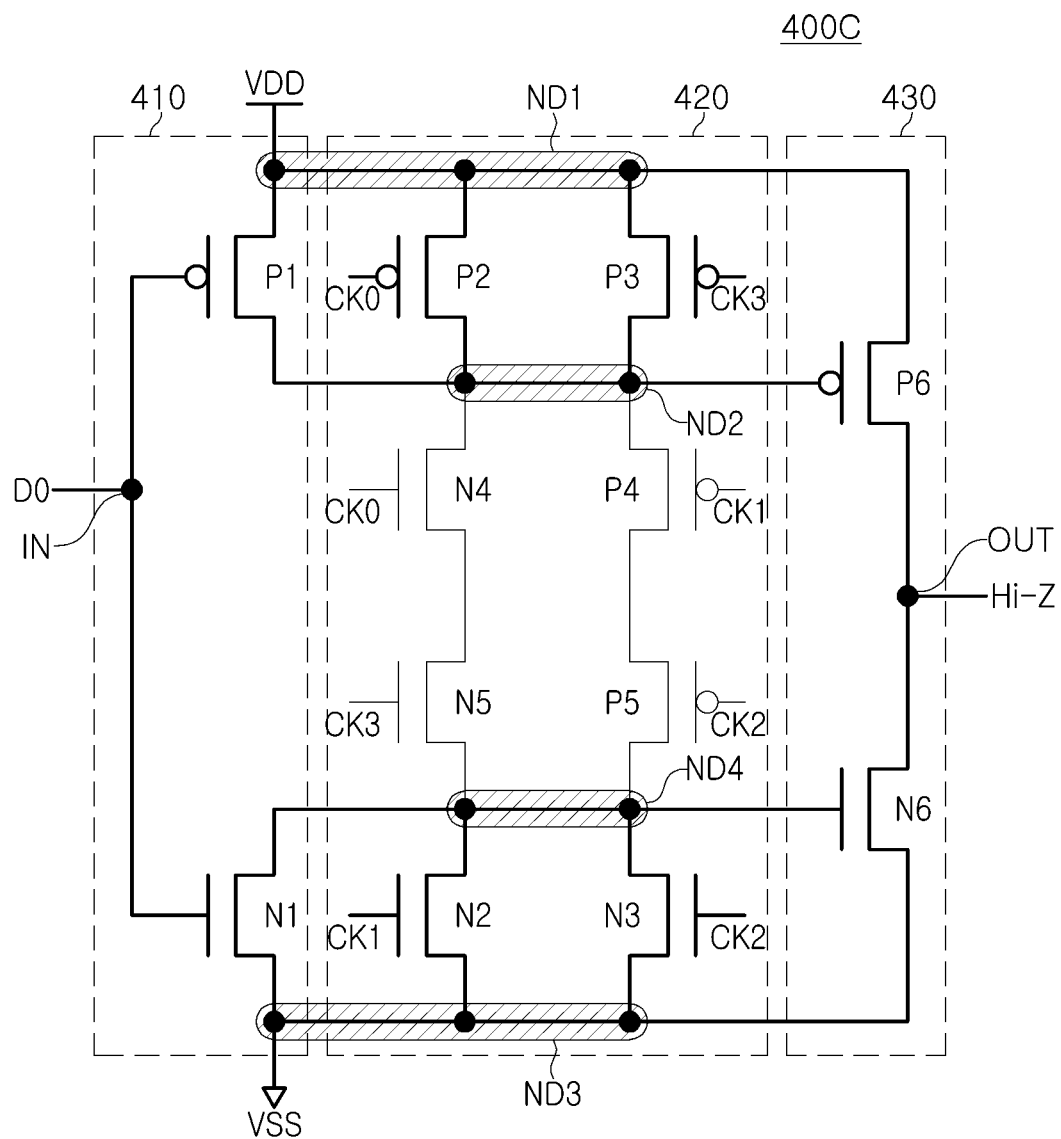
Figure 9B:
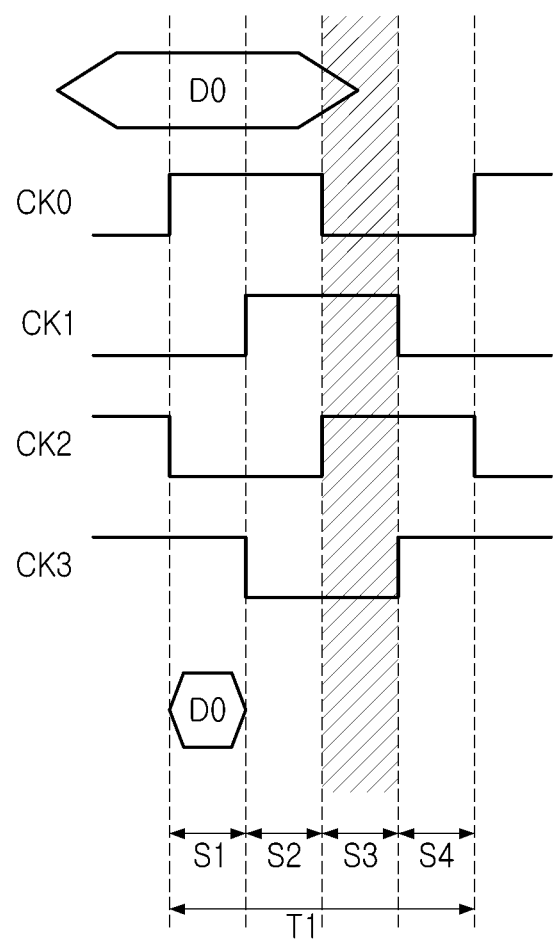

Referring to FIGS. 9A and 9B, the logic values of the first to fourth internal clock signals CK0-CK3 may form a bit stream of "0110" in the third period S3 in the single cycle T1 of each of the internal clock signals. The fourth PMOS transistor P4, the fifth PMOS transistor P5, the fourth NMOS transistor N4, and the fifth NMOS transistor N5 may be turned off, and the second NMOS transistor N2, the third NMOS transistor N3, the second PMOS transistor P2, and the third PMOS transistor P3 may be turned on. Accordingly, the section between the second node ND2 and the fourth node ND4 may be open, or the third circuit may be electrically floated between the second node ND2 and the fourth node ND4. The second node ND2 may have a second level (e.g., a high level) by the power voltage VDD, and the fourth node ND4 may have a first level by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 400C may have a high impedance Hi-Z state in the third period S3 in the single cycle T1 of each of the internal clock signals.

Figure 10A:
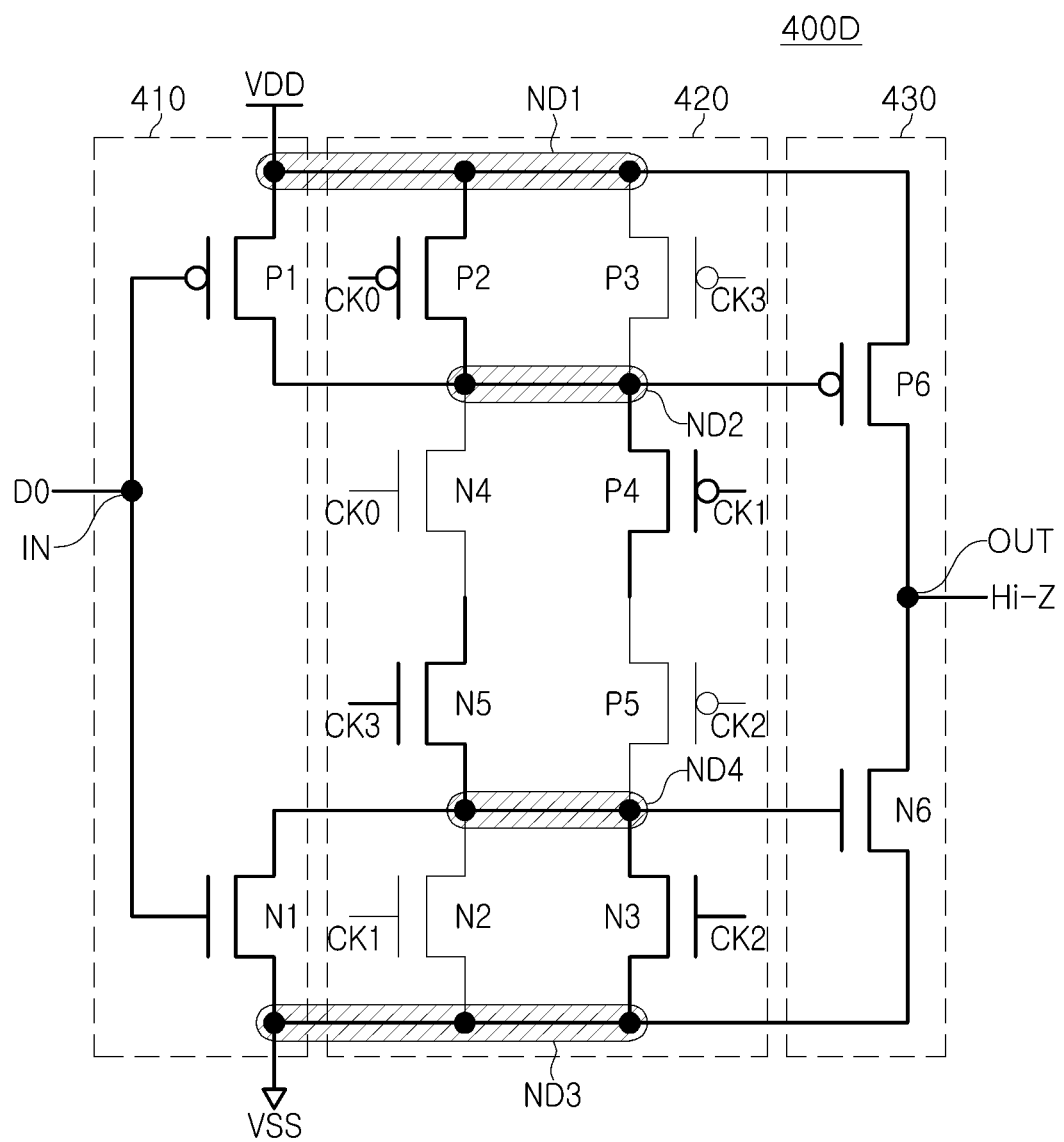
Figure 10B:
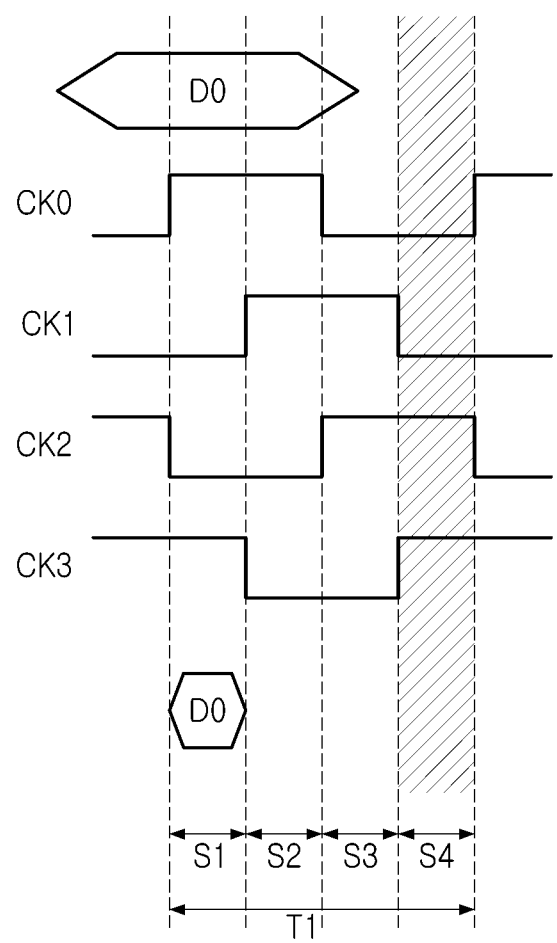

As illustrated in FIGS. 10A and 10B, the logic values of the first to fourth internal clock signals CK0-CK3 may form a bit stream of "0011" in the fourth period S4 in a single cycle T1 of each of the internal clock signals. The third PMOS transistor P3, the fifth PMOS transistor P5, the fourth NMOS transistor N4, and the second NMOS transistor N2 may be turned off, and the fifth NMOS transistor N5, the third NMOS transistor N3, the second PMOS transistor P2, and the fourth PMOS transistor P4 may be turned on. Accordingly, the section between the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 400D may have a high impedance state Hi-Z state in the fourth period S4 in the single cycle T1 of each of the internal clock signals.

Referring to FIGS. 7A to 10A and 7B to 10B, the first data selectors 400A-400D may output the input data D0 as valid data in the first period S1 in the single cycle T1 of each of the internal clock signals, and may have a high impedance Hi-Z state in the second to fourth periods S2-S4 regardless of the logic level of the data D0.

Referring to FIGS. 11A to 14A, each of second data selectors 500A-500D may include a second data input circuit 510, a second data connection circuit 520, and a second data output circuit 530.

Referring to FIGS. 11A to 14A and 11B to 14B, as for operations of the second data selectors 500A-500D, the second data connection circuit 520 may receive the internal clock signals in an arrangement of the second internal clock signal CK1, the third internal clock signal CK2, the fourth internal clock signal CK3, and the first internal clock signal CK0. The second data input circuit 510 may operate in response to the second data D1. When the logic level of the second data D1 is a first level (e.g., low level), the first PMOS transistor P1 may be turned on, and the first NMOS transistor N1 may be turned off. The second data connection circuit 520 may operate in response to the first to fourth internal clock signals CK0-CK3. The second data output circuit 530 may operate in response to the levels of the second node ND2 and the fourth node ND4.

Figure 11A:
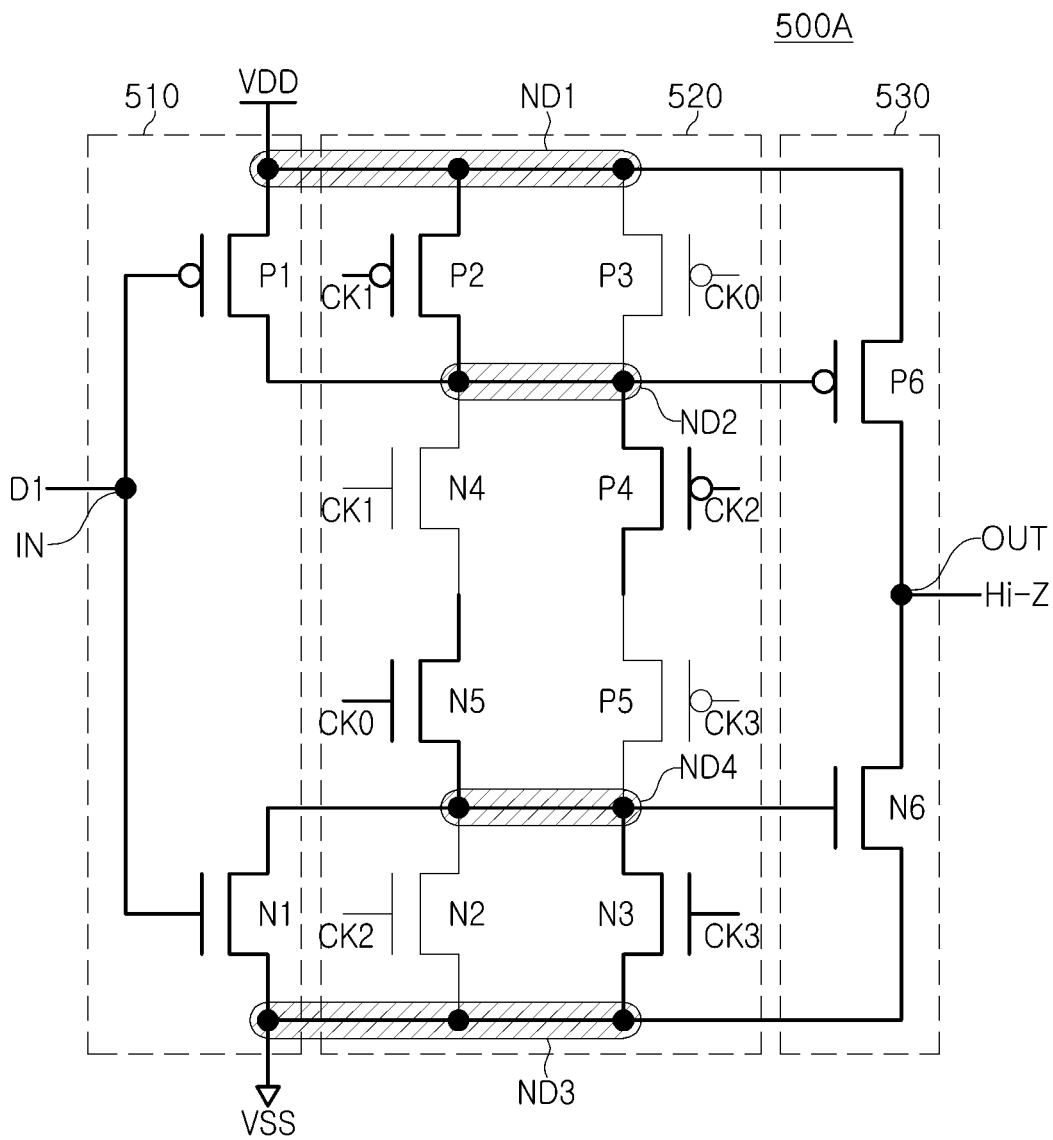
Figure 11B:
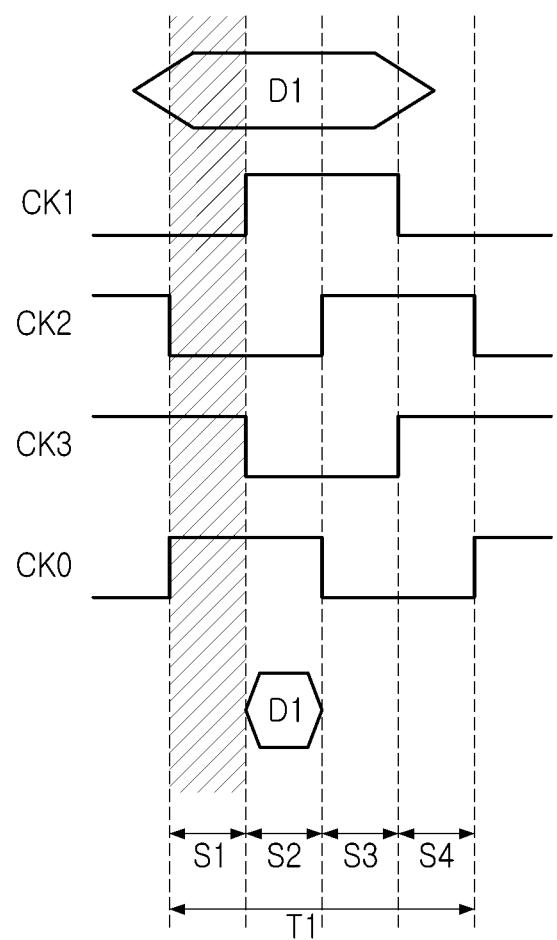

Referring to FIGS. 11A and 11B, the logic values of the second, third, fourth, and first internal clock signals CK1, CK2, CK3, and CK0 may form a bit stream of "0011" in the first period S1 in a single cycle T1 of each of the internal clock signals. The third PMOS transistor P3, the fifth PMOS transistor P5, the second NMOS transistor N2, and the fourth NMOS transistor N4 may be turned off, and the third NMOS transistor N3, the fifth NMOS transistor N5, the second PMOS transistor P2, and the fourth PMOS transistor P4 may be turned on. Accordingly, the section between the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the second data selector 500A may have a high impedance Hi-Z state in the first period S1 in the single cycle T1 of each of the internal clock signals.

Figure 12A:
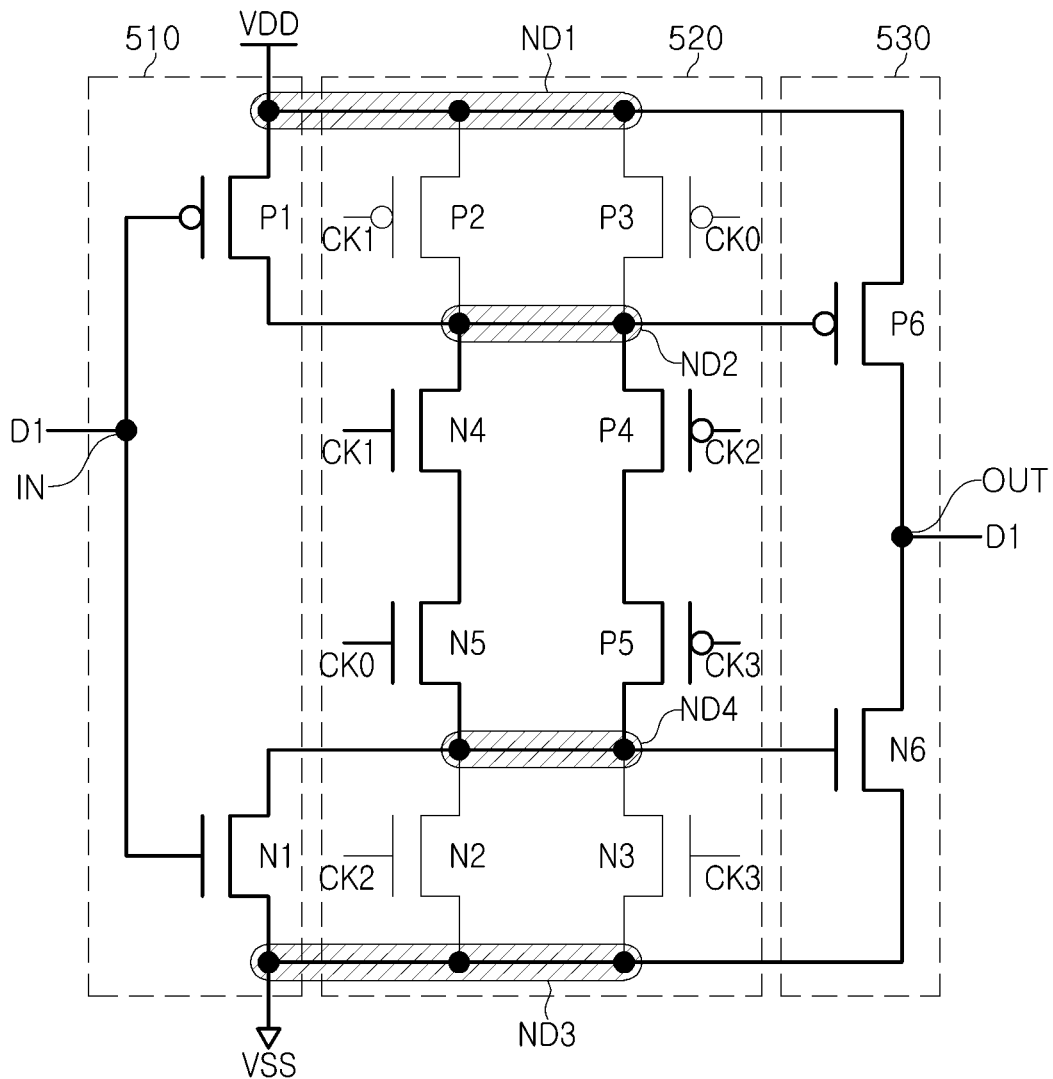
Figure 12B:
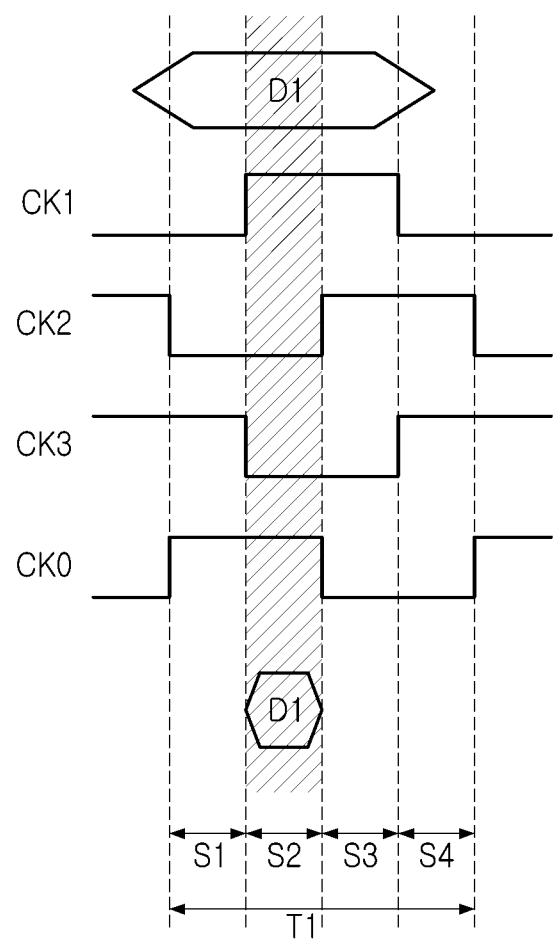

As illustrated in FIGS. 12A and 12B, the logic values of the second, third, fourth, and first internal clock signals CK1, CK2, CK3, and CK0 may form a bit stream of "1001" in the second period S2 in the single cycle T1 of each of the internal clock signals. The second PMOS transistor P2, the third PMOS transistor P3, the second NMOS transistor N2, and the third NMOS transistor N3 may be turned off, and the fourth NMOS transistor N4, the fifth NMOS transistor N5, the fourth PMOS transistor P4, and the fifth PMOS transistor P5 may be turned on. Accordingly, the second node ND2 may be electrically connected to the fourth node ND4.

When the second data D1 has a first level (e.g., low level), the second node ND2 may have a second level (e.g., high level) by the power voltage VDD, and the fourth node ND4 electrically connected to the second node ND2 may also have the second level.

The sixth PMOS transistor P6 may be turned off by the level of the second node ND2 having the second level (e.g., high level), and the sixth NMOS transistor N6 may be turned on by the level of the fourth node ND4 having the second level (e.g., high level). The output node OUT may have the same first level as the logic level of the second data D1 by the ground voltage VSS.

When the second data D1 has a second level (e.g., high level), the fourth node ND4 may have a first level (e.g., low level) by the ground voltage VSS, and the second node ND2 electrically connected to the fourth node ND4 may also have the first level.

The sixth PMOS transistor P6 may be turned on by the level of the second node ND2 having the first level (e.g., low level), and the sixth NMOS transistor N6 may be turned off by the level of the fourth node ND4 having the first level (e.g., low level). The output node OUT may have the same second level as the logic level of the second data D1 by the power voltage VDD.

Accordingly, the second data selector 500B may output the input data D1 as valid data in the second period S2 in a single cycle T1 of each of the internal clock signals, and may operate as an equivalent circuit in which two inverters are connected to each other.

Figure 13A:
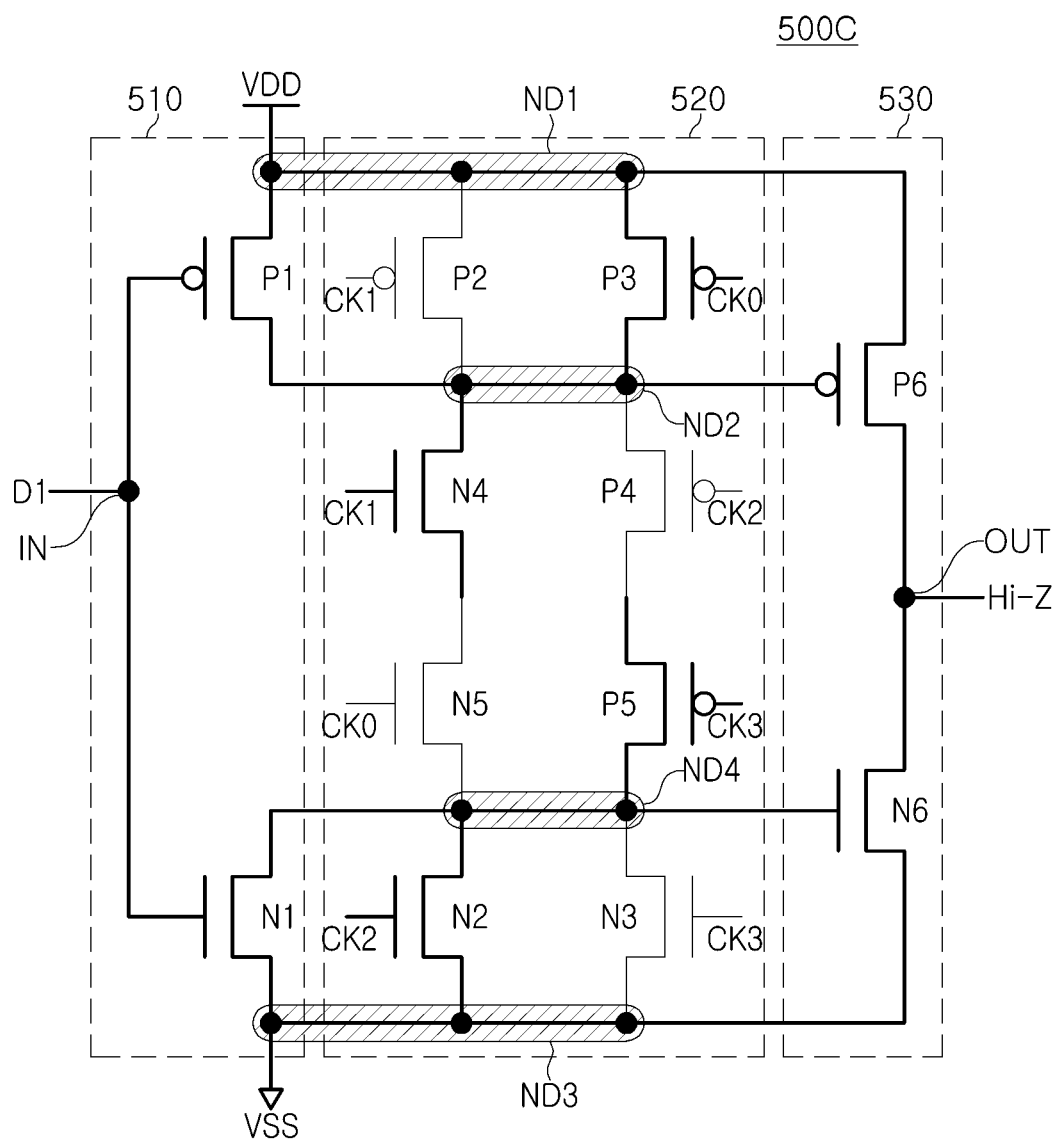
Figure 13B:
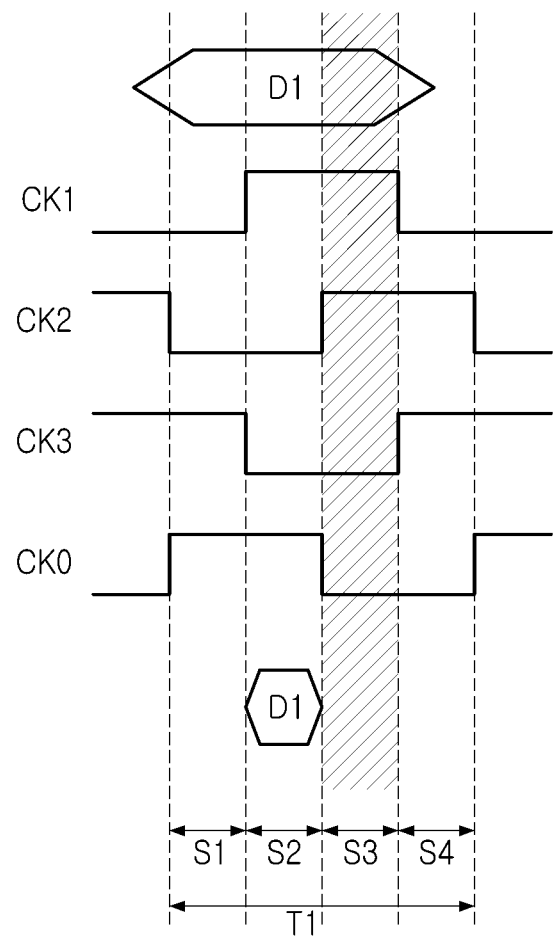

Referring to FIGS. 13A and 13B, the logic values of the second, third, fourth, and first internal clock signals CK1, CK2, CK3, and CK0 may form a bit stream of "1100" in the third period S3 in a single cycle T1 of each of the internal clock signals. The second PMOS transistor P2, the fourth PMOS transistor P4, the third NMOS transistor N3, and the fifth NMOS transistor N5 may be turned off, and the second NMOS transistor N2, the fourth NMOS transistor N4, the third PMOS transistor P3, and the fifth PMOS transistor P5 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the second data selector 400C may have a high impedance Hi-Z state in the third period S3 in the single cycle T1 of each of the internal clock signals.

Figure 14A:
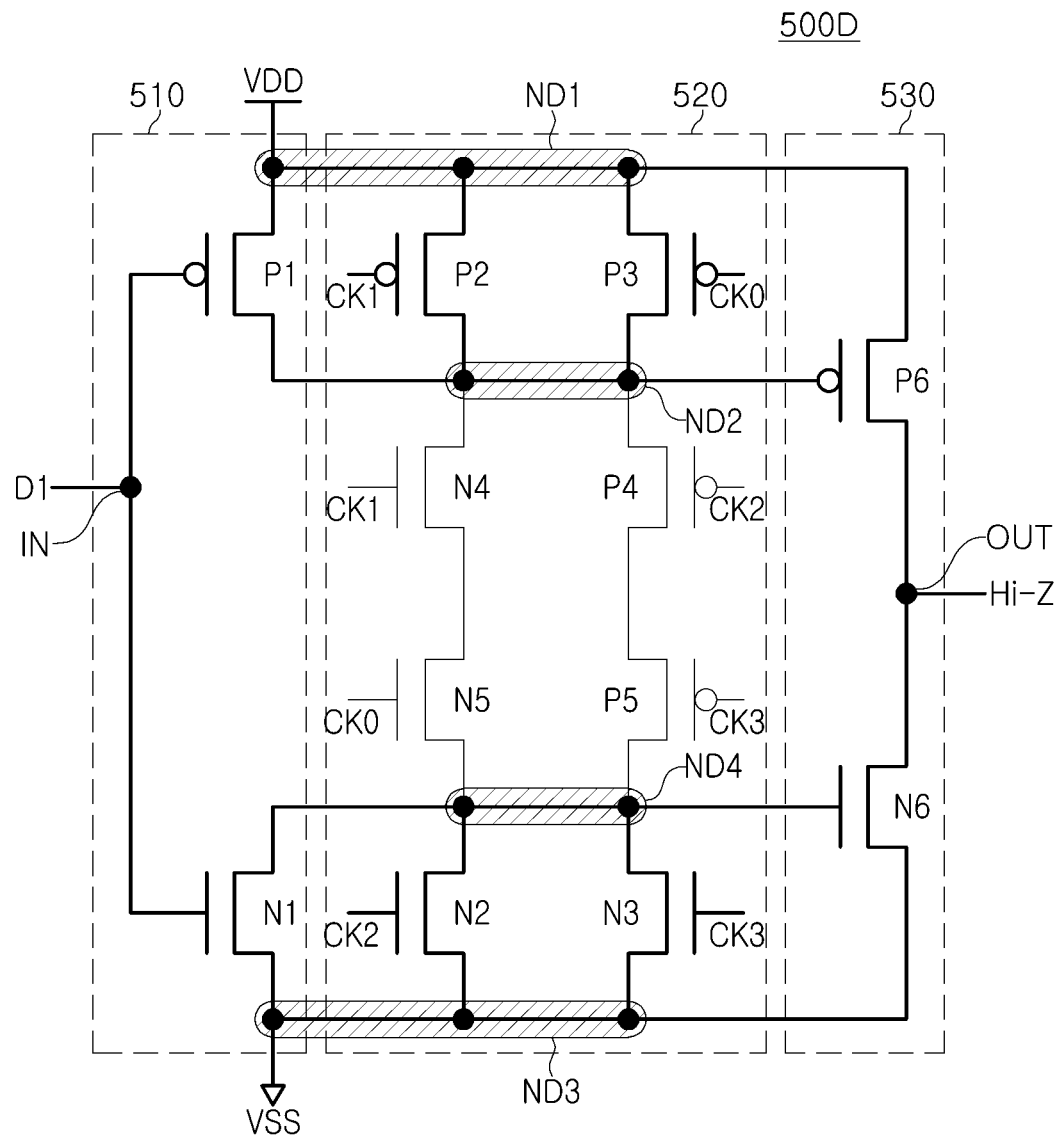
Figure 14B:
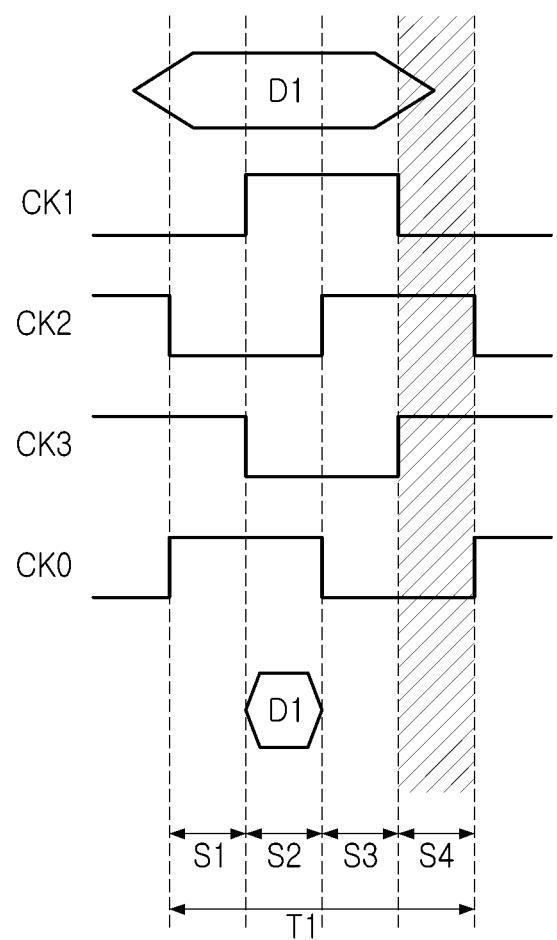

As illustrated in FIGS. 14A and 14B, the logic values of the second, third, fourth, and first internal clock signals CK1, CK2, CK3, and CK0 may form a bit stream of "0110" in the fourth period S4 in a single cycle T1 of each of the internal clock signals. The fourth PMOS transistor P4, the fifth PMOS transistor P5, the fourth NMOS transistor N4, and the fifth NMOS transistor N5 may be turned off, and the second NMOS transistor N2, the third NMOS transistor N3, the second PMOS transistor P2, and the third PMOS transistor P3 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the second data selector 500D may have a high impedance Hi-Z state in the fourth period S4 in the single cycle T1 of each of the internal clock signals.

Referring to FIGS. 11A to 14A and 11B to 14B, the second data selectors 500A-500D may output the input data D1 as valid data in the second period S2 in the single cycle T1 of each of the internal clock signals, and may a high impedance Hi-Z state regardless of the logic level of the data D1 in the first period S1, the third period S3, and the fourth period S4.

Referring to FIGS. 15A to 18A, each of third data selectors 600A-600D may include a third data input circuit 610, a third data connection circuit 620, and a third data output circuit 630.

Referring to FIGS. 15A to 18A and 15B to 18B, as for operations of the third data selector 600A-600D, the third data selectors 600A-600D may receive the internal clock signals in an arrangement of the third internal clock signal CK2, the fourth internal clock signal CK3, the first internal clock signal CK0, and the second internal clock signal CK1. The third data input circuit 610 may operate in response to the third data D2. When the logic level of the third data D2 is a first level (e.g., low level), the first PMOS transistor P1 may be turned on, and the first NMOS transistor N1 may be turned off. The third data connection circuit 620 may operate in response to the first to fourth internal clock signals CK0-CK3. The third data output circuit 630 may operate in response to the levels of the second node ND2 and the fourth node ND4.

Figure 15A:
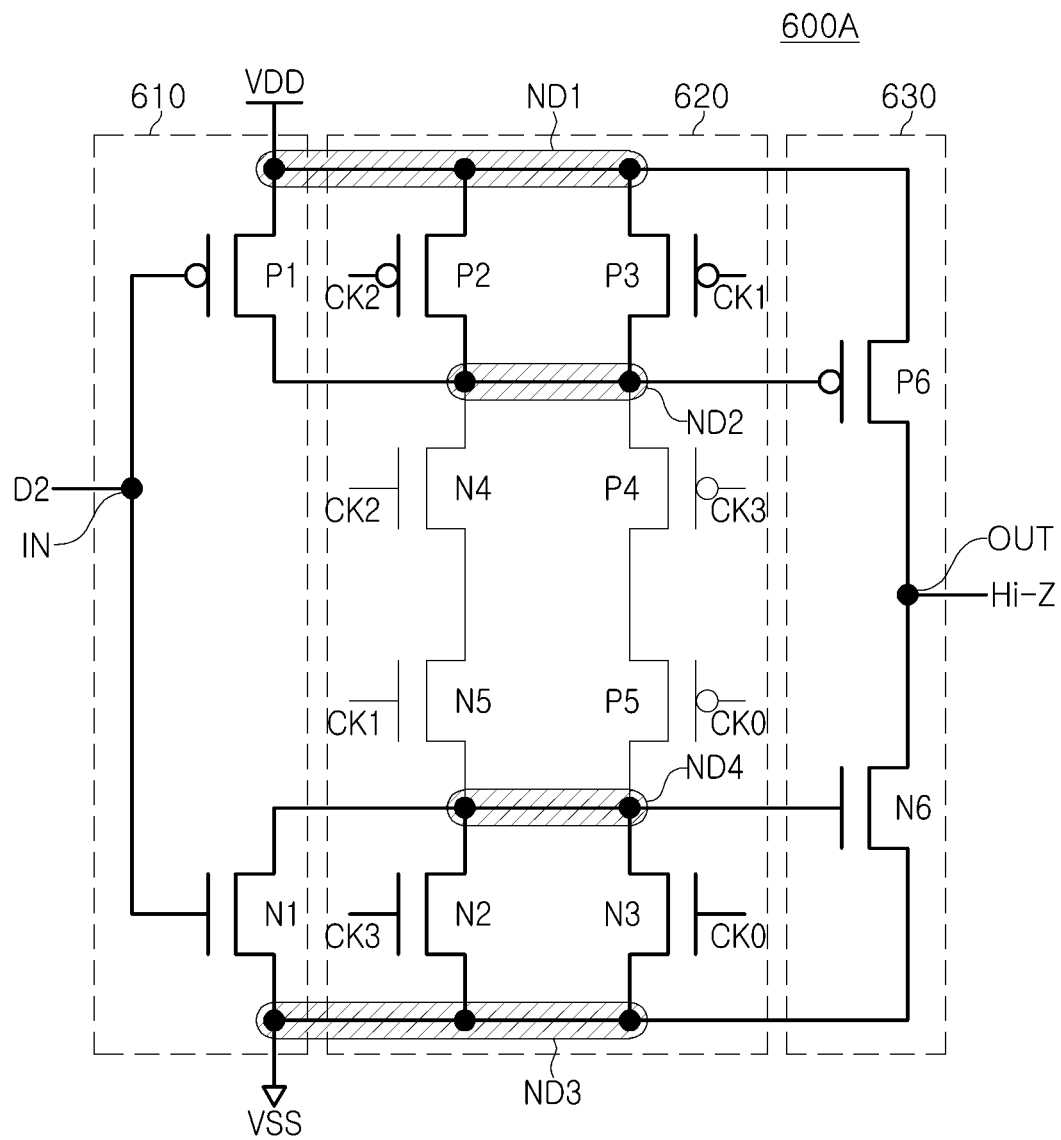
Figure 15B:
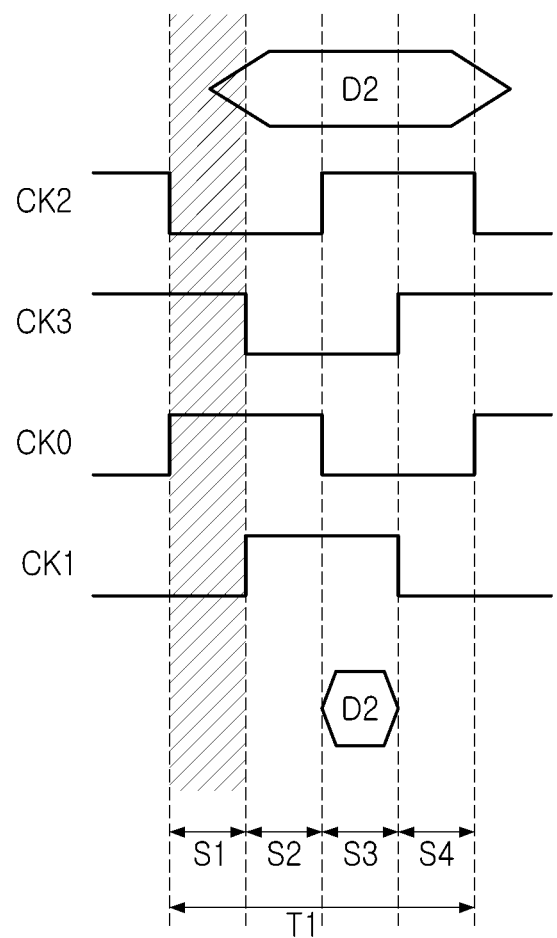

As illustrated in FIGS. 15A and 15B, the logic values of the third, fourth, first, and second internal clock signals CK2, CK3, CK0, and CK1 may form a bit stream of "0110" in the first period S1 in a single cycle T1 of each of the internal clock signals. The fourth PMOS transistor P4, the fifth PMOS transistor P5, the fourth NMOS transistor N4, and the fifth NMOS transistor N5 may be turned off, and the second NMOS transistor N2, the third NMOS transistor N3, the second PMOS transistor P2, and the third PMOS transistor P3 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the third data selector 600A may have a high impedance Hi-Z state in the first period S1 in the single cycle T1 of each of the internal clock signals.

Figure 16A:
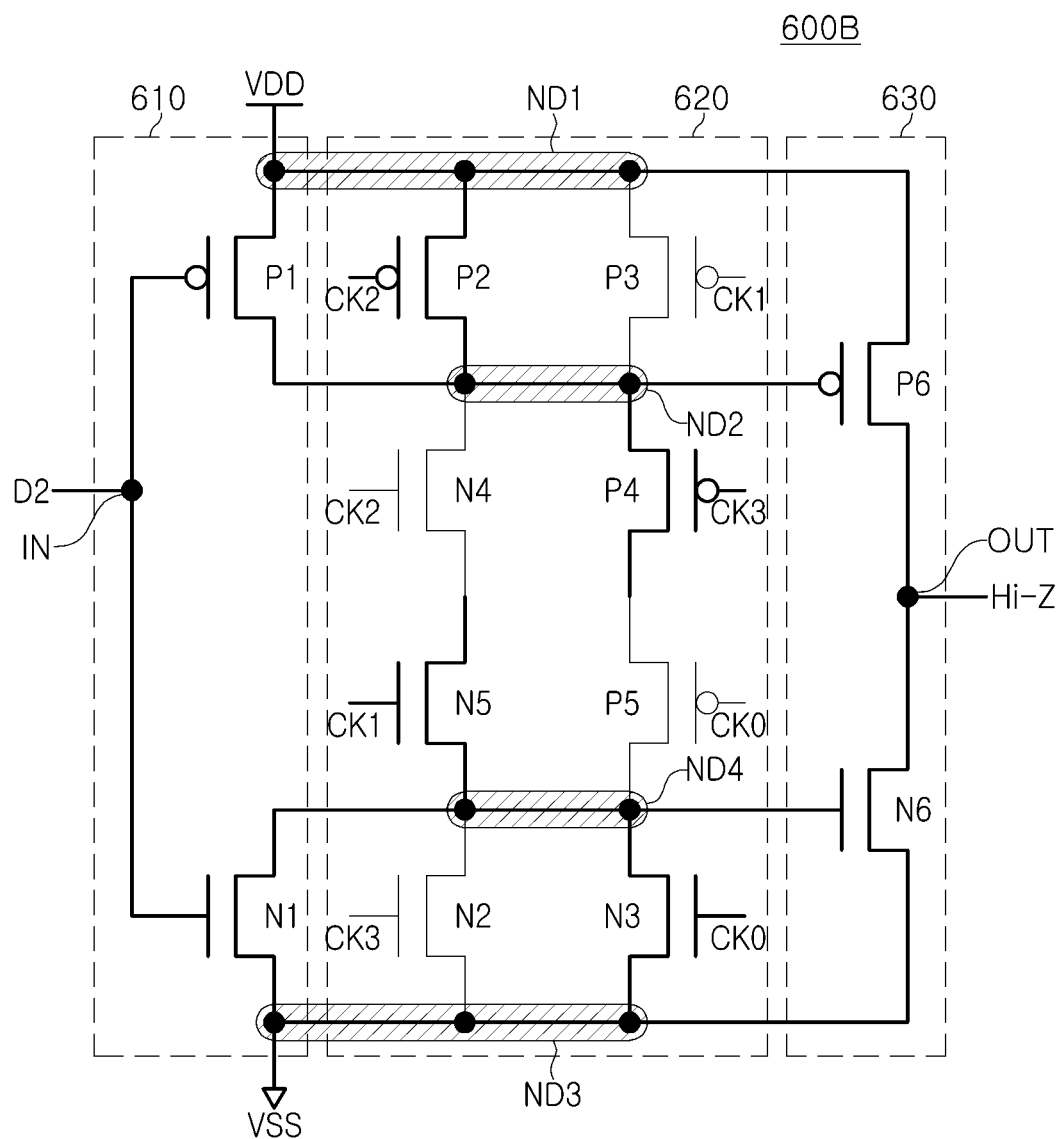
Figure 16B:
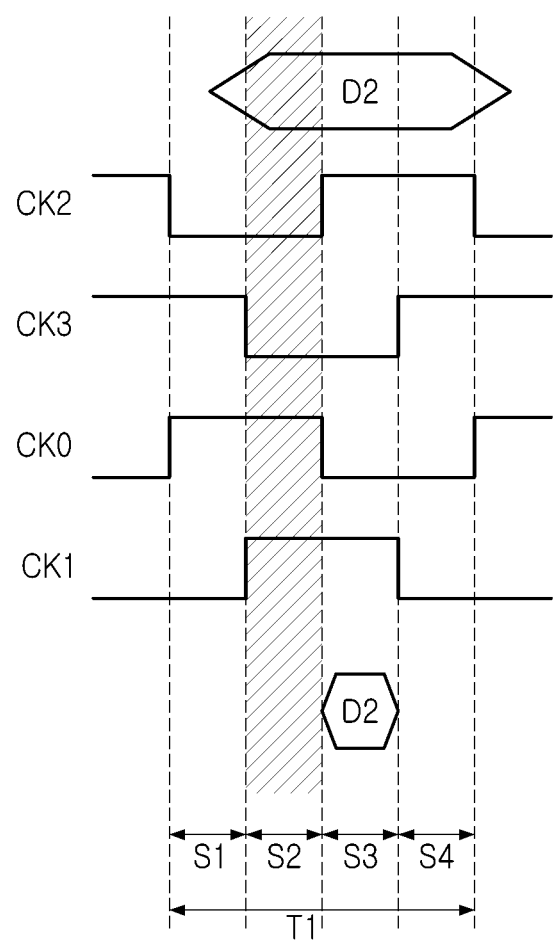

Referring to FIGS. 16A and 16B, the logic values of the third, fourth, first, and second internal clock signals CK2, CK3, CK0, and CK1 may form a bit stream of "0011" in the second period S2 in a single cycle T1 of each of the internal clock signals. The third PMOS transistor P3, the fifth PMOS transistor P5, the fourth NMOS transistor N4, and the second NMOS transistor N2 may be turned off, and the fifth NMOS transistor N5, the third NMOS transistor N3, the second PMOS transistor P2, and the fourth PMOS transistor P4 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the third data selector 600B may have a high impedance Hi-Z state in the second period S2 in the single cycle T1 of each of the internal clock signals.

Figure 17A:
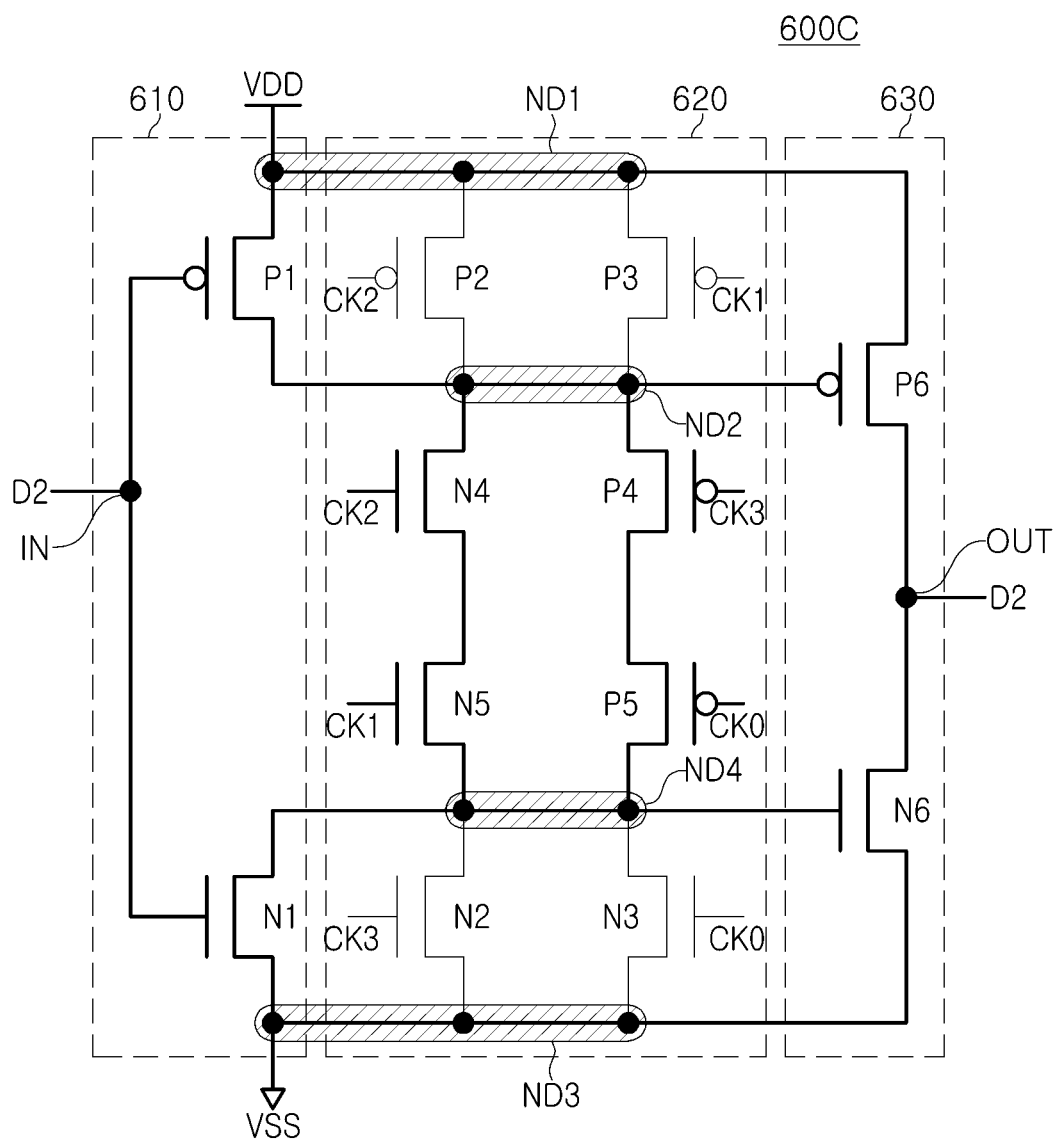
Figure 17B:
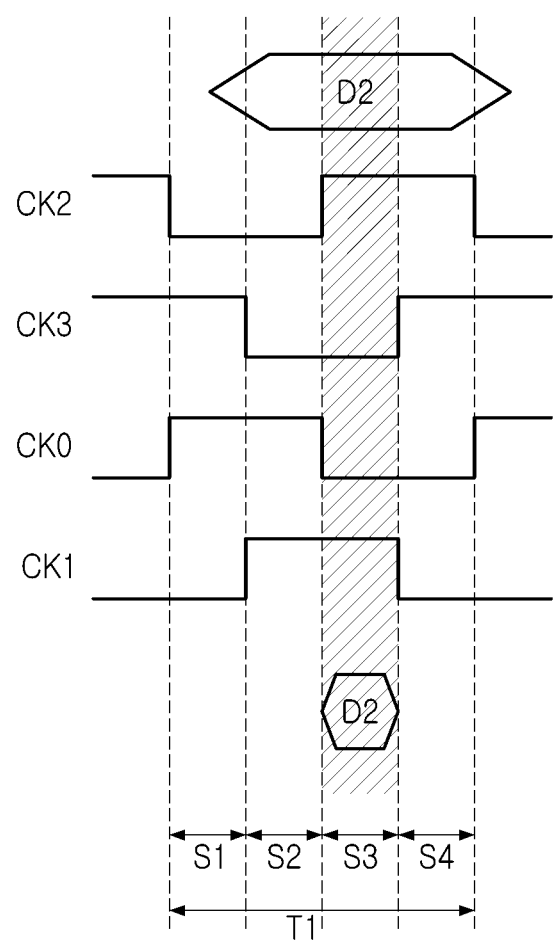

As illustrated in FIGS. 17A and 17B, the logic values of the third, fourth, first, and second internal clock signals CK2, CK3, CK0, and CK1 may form a bit stream of "1001" in the third period S3 in a single cycle T1 of each of the internal clock signals. The second PMOS transistor P2, the third PMOS transistor P3, the second NMOS transistor N2, and the third NMOS transistor N3 may be turned off, and the fourth NMOS transistor N4, the fifth NMOS transistor N5, the fourth PMOS transistor P4, and the fifth PMOS transistor P5 may be turned on. Accordingly, the second node ND2 may be electrically connected to the fourth node ND4.

When the third data D2 has a first level (e.g., low level), the second node ND2 may have a second level (e.g., high level) by the power voltage VDD, and the fourth node ND4 electrically connected to the second node ND2 may also have the second level.

The sixth PMOS transistor P6 may be turned off by the level of the second node ND2 having the second level (e.g., high level), and the sixth NMOS transistor N6 may be turned on by the level of the fourth node ND4 having the second level (e.g., high level). The output node OUT may have the same first level as the logic level of the third data D2 by the ground voltage VSS.

When the third data D2 has a second level (e.g., high level), the fourth node ND4 may have a first level (e.g., low level) by the ground voltage VSS, and the second node ND2 electrically connected to the fourth node ND4 may also have the first level.

The sixth PMOS transistor P6 may be turned on by the level of the second node ND2 having the first level (e.g., low level), and the sixth NMOS transistor N6 may be turned off by the level of the fourth node ND4 having the first level (e.g., low level). The output node OUT may have the same second level as the logic level of the third data D2 by the power voltage VDD.

Accordingly, the third data selector 600C may output the input data D2 as valid data in the third period S3 in the single cycle T1 of each of the internal clock signals, and may operate as an equivalent circuit in which two inverters are connected to each other.

Figure 18A:
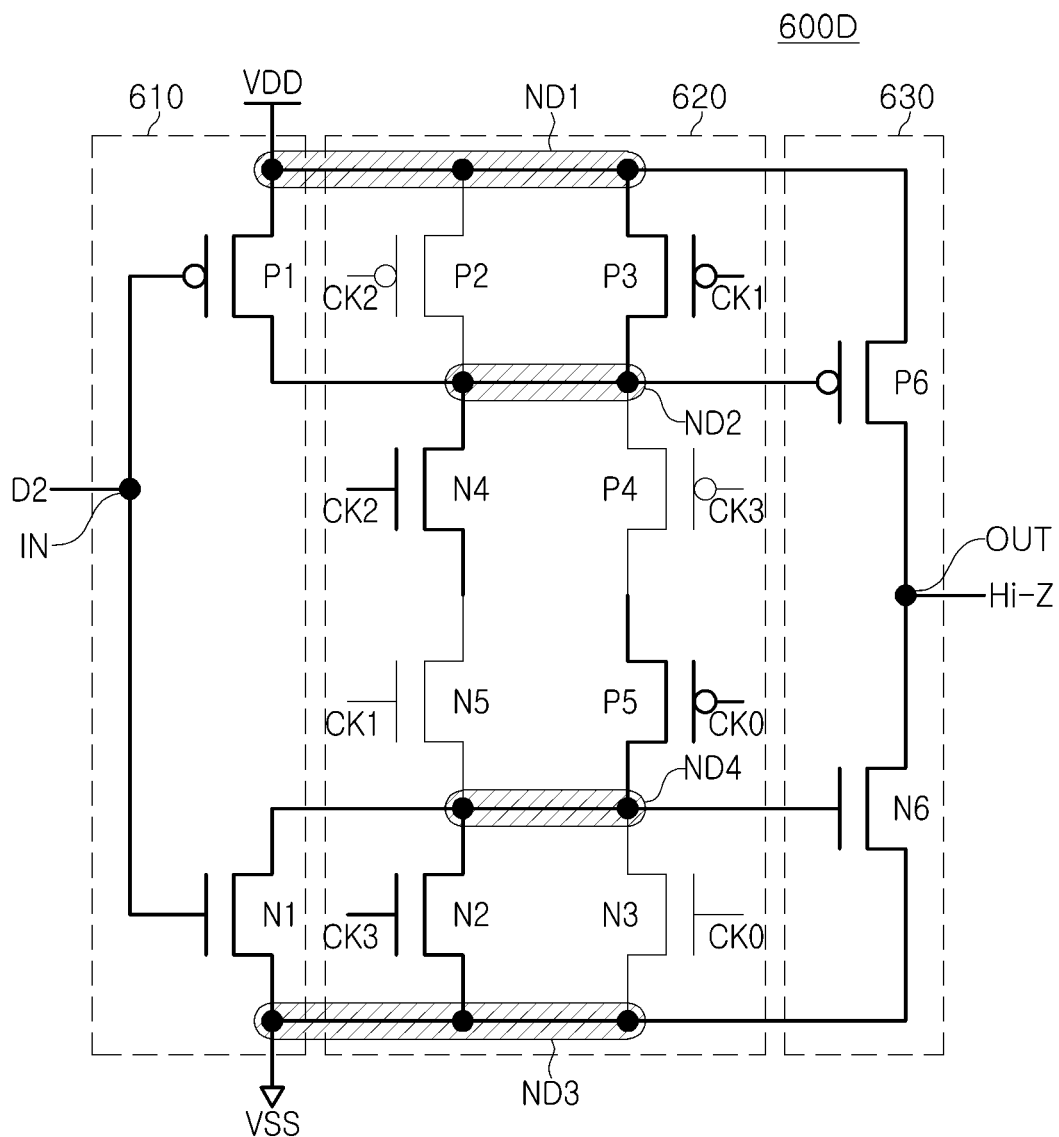
Figure 18B:
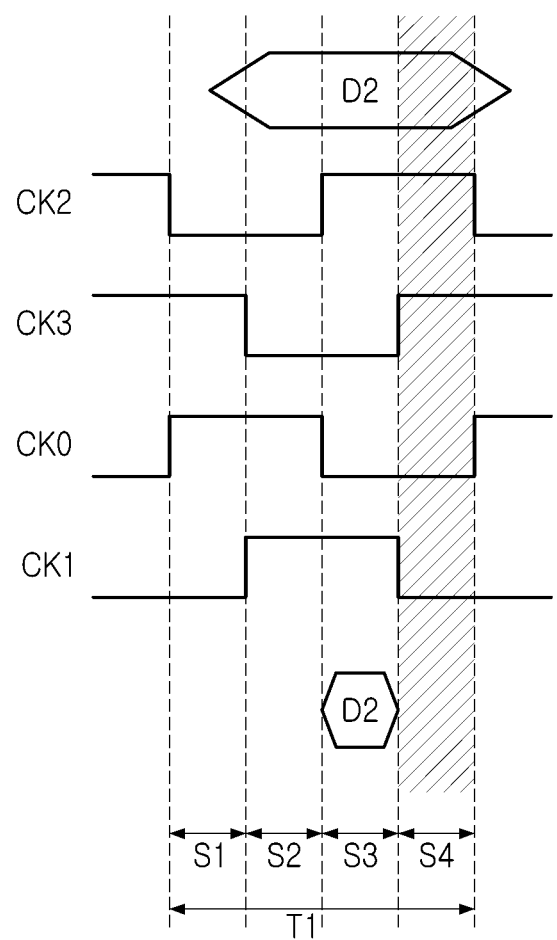

As illustrated in FIGS. 18A and 18B, the logic values of the third, fourth, first, and second internal clock signals CK2, CK3, CK0, and CK1 may form a bit stream of "1100" in the fourth period S4 in a single cycle T1 of each of the internal clock signals. The second PMOS transistor P2, the fourth PMOS transistor P4, the third NMOS transistor N3, and the fifth NMOS transistor N5 may be turned off, and the second NMOS transistor N2, the fourth NMOS transistor N4, the third PMOS transistor P3, and the fifth PMOS transistor P5 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the third data selector 600D may have a high impedance Hi-Z state in the fourth period S4 in the single cycle T1 of each of the internal clock signals.

Referring to FIGS. 15A to 18A and 15B to 18B, the third data selectors 600A-600D may output the input data D2 as valid data in the third period S3 in a single cycle T1 of each of the internal clock signals, and may have a high impedance Hi-Z state regardless of the logic level of the data D2 in the first period S1, the second period S2, and the fourth period S4.

Referring to FIGS. 19A to 22A, each of second data selectors 700A-700D may include a fourth data input circuit 710, a fourth data connection circuit 720, and a fourth data output circuit 730.

Referring to FIGS. 19A to 22A and 19B to 22B, as for operations of the fourth data selectors 700A-700D, the fourth data selectors 700A-700D may receive the internal clock signals in an arrangement of the fourth internal clock signal CK3, the first internal clock signal CK0, the second internal clock signal CK1, and the third internal clock signal CK2. The fourth data input circuit 710 may operate in response to the fourth data D3. When the logic level of the fourth data D3 is a first level (e.g., low level), the first PMOS transistor P1 may be turned on, and the first NMOS transistor N1 may be turned off. The fourth data connection circuit 720 may operate in response to the fourth, first, second, and third internal clock signals CK3, CK0, CK1, and CK2. The fourth data output circuit 730 may operate in response to the levels of the second node ND2 and the fourth node ND4.

Figure 19A:
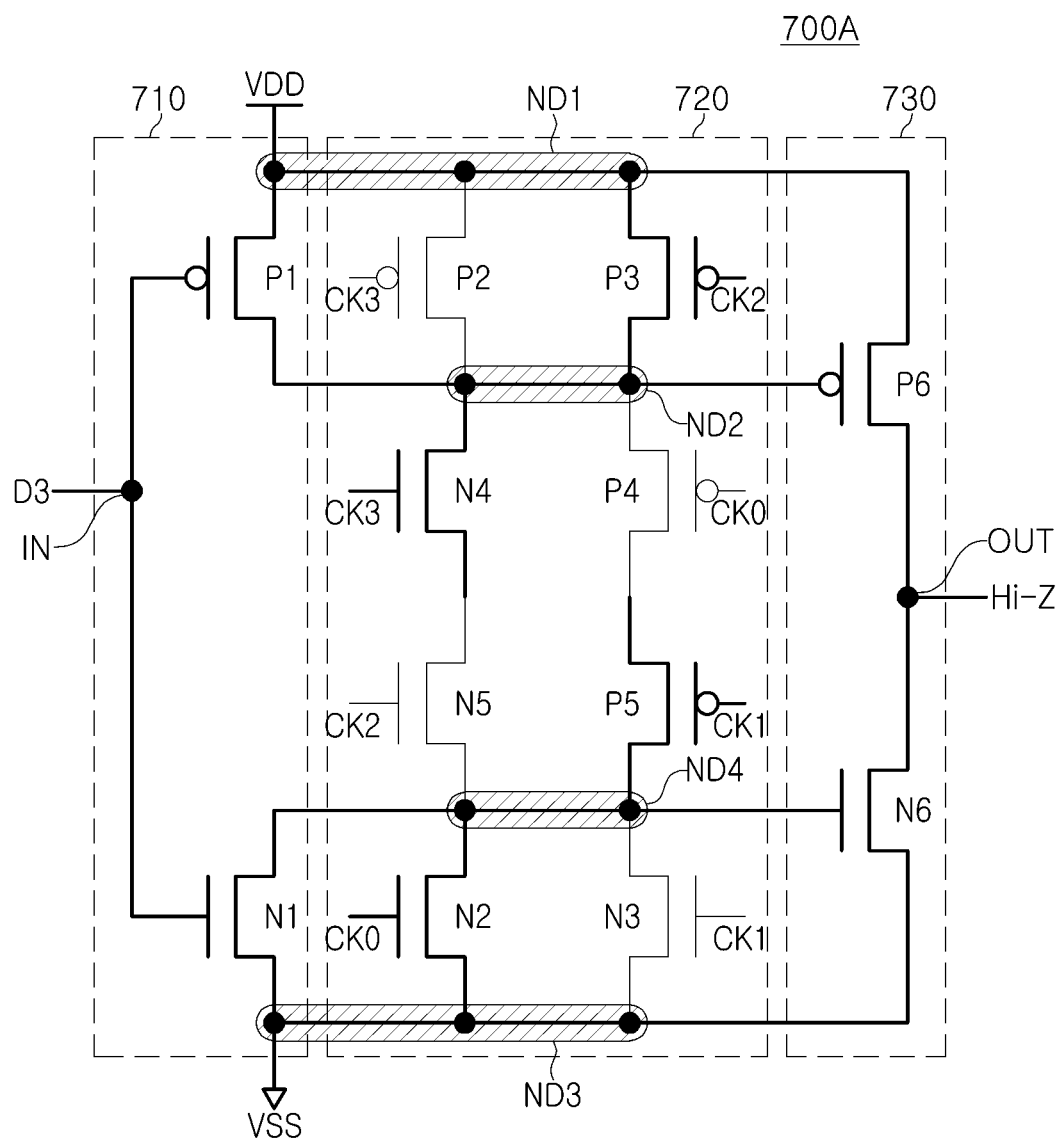
Figure 19B:
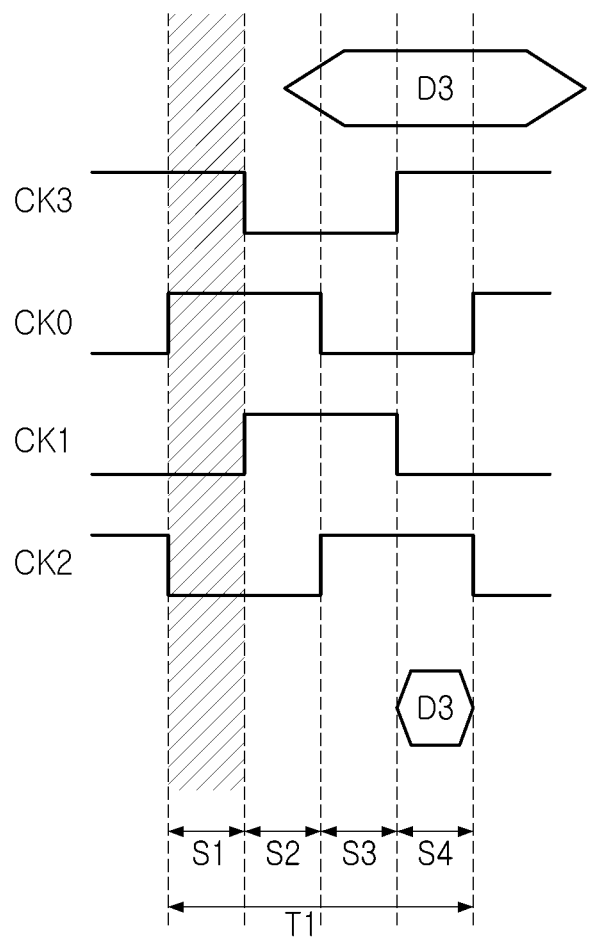

Referring to FIGS. 19A and 19B, the logic values of the fourth, first, second, and third internal clock signals CK3, CK0, CK1, and CK2 may form a bit stream of "1100" in the first period S1 in a single cycle T1 of each of the internal clock signals. The second PMOS transistor P2, the fourth PMOS transistor P4, the third NMOS transistor N3, and the fifth NMOS transistor N5 may be turned off, and the second NMOS transistor N2, the fourth NMOS transistor N4, the third PMOS transistor P3, and the fifth PMOS transistor P5 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the fourth data selector 700A may have a high impedance Hi-Z state in the first period S1 in the single cycle T1 of each of the internal clock signals.

Figure 20A:
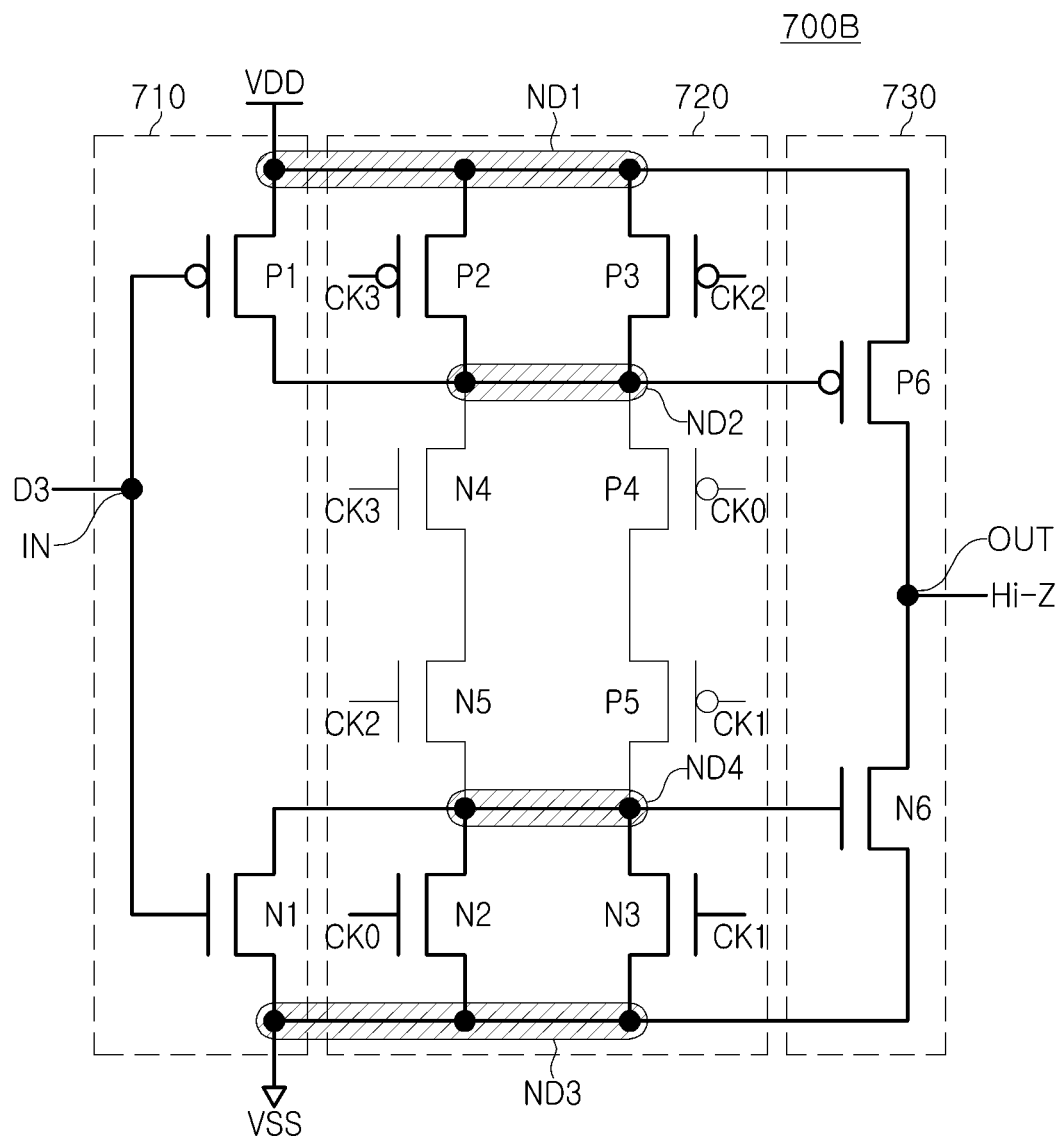
Figure 20B:
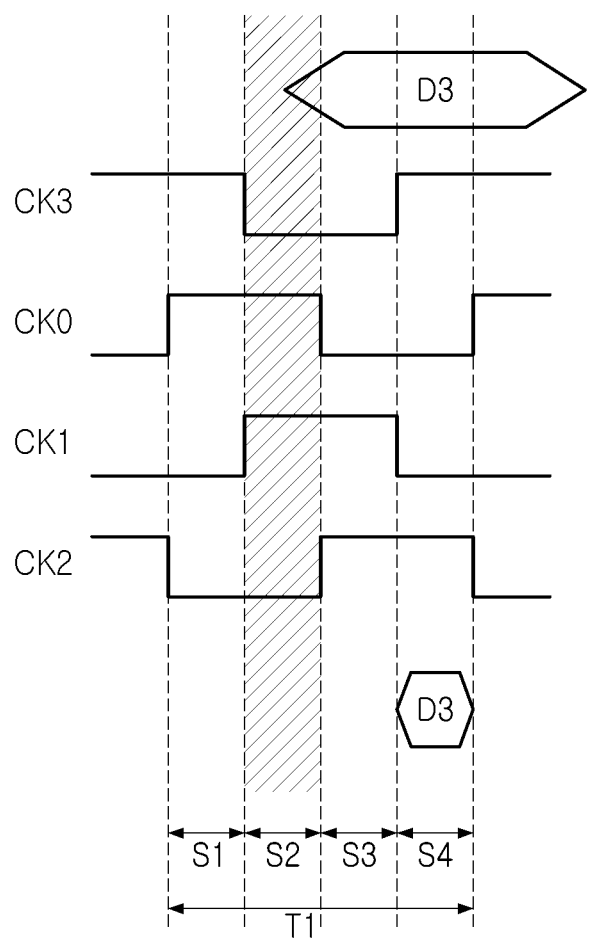

As illustrated in FIGS. 20A and 20B, the logic values of the fourth, first, second, and third internal clock signals CK3, CK0, CK1, and CK2 may form a bit stream of "0110" in the second period S2 in a single cycle T1 of each of the internal clock signals. The fourth PMOS transistor P4, the fifth PMOS transistor P5, the fourth NMOS transistor N4, and the fifth NMOS transistor N5 may be turned off, and the second NMOS transistor N2, the third NMOS transistor N3, the second PMOS transistor P2, and the third PMOS transistor P3 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the fourth data selector 700B may have a high impedance Hi-Z state in the second period S2 in the single cycle T1 of each of the internal clock signals.

Figure 21A:
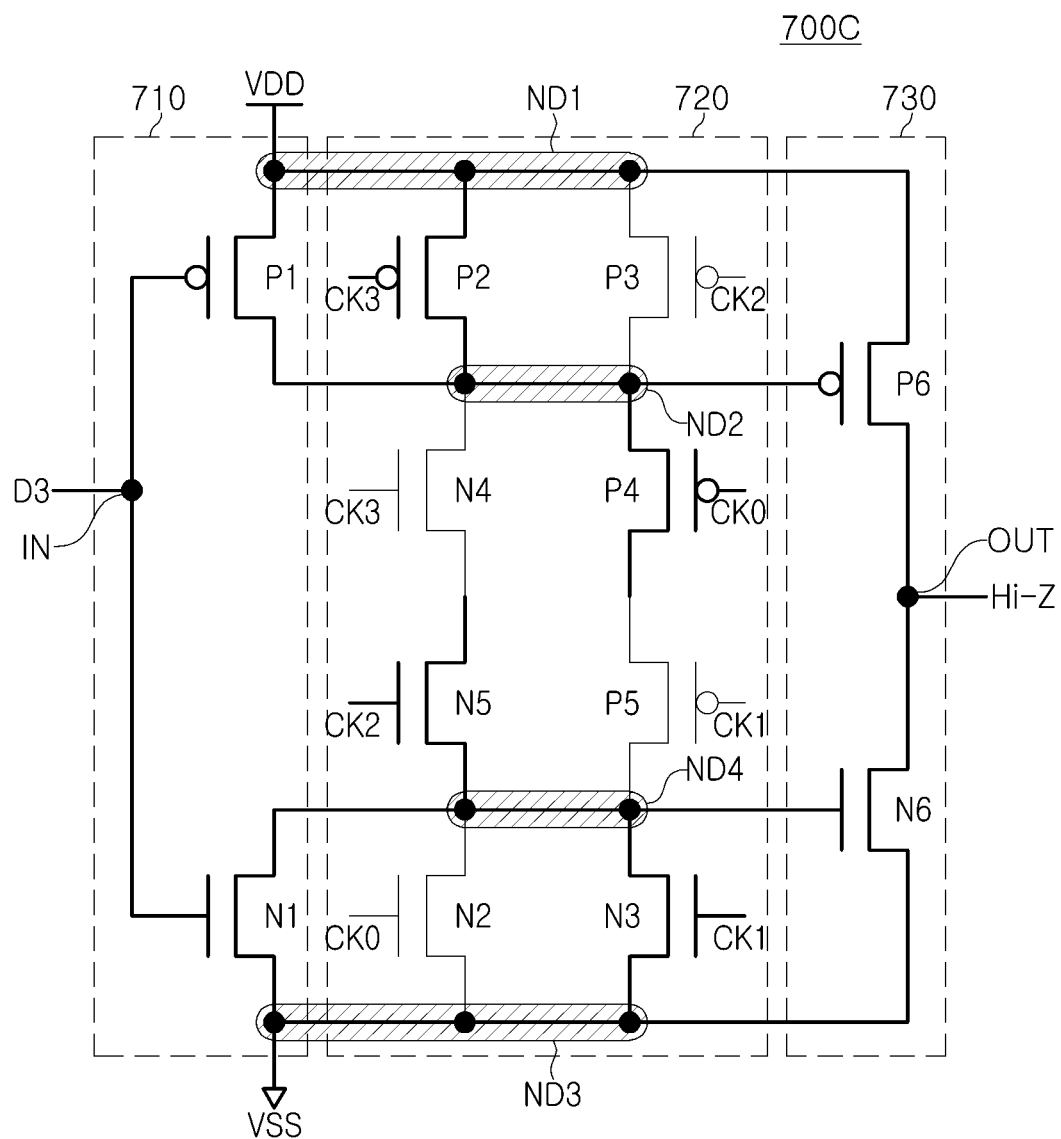
Figure 21B:
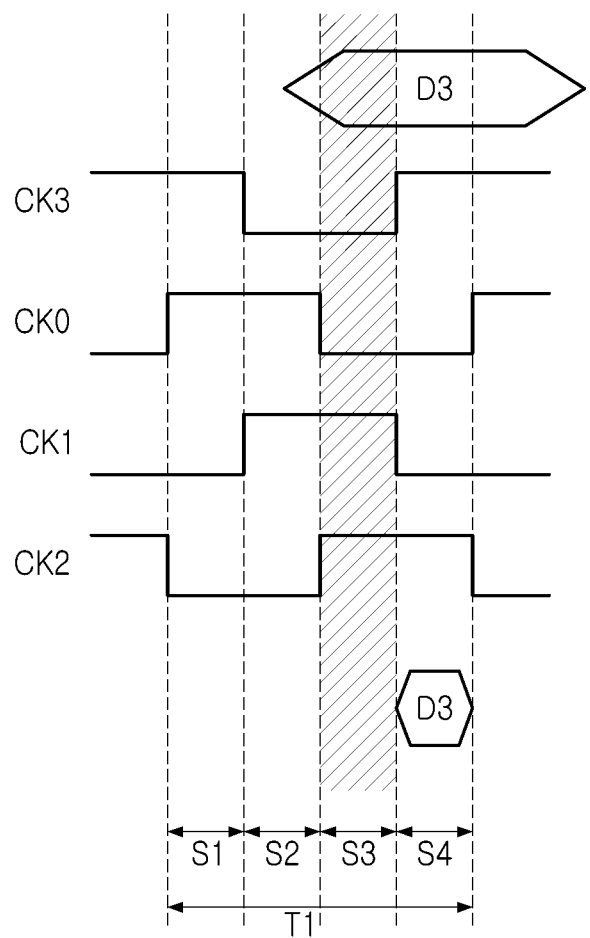

As illustrated in FIGS. 21A and 21B, the logic values of the fourth, first, second, and third internal clock signals CK3, CK0, CK1, and CK2 may form a bit stream of "0011" in the third period S3 in a single cycle T1 of each of the internal clock signals. The third PMOS transistor P3, the fifth PMOS transistor P5, the fourth NMOS transistor N4, and the second NMOS transistor N2 may be turned off, and the fifth NMOS transistor N5, the third NMOS transistor N3, the second PMOS transistor P2, and the fourth PMOS transistor P4 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the fourth data selector 700C may have a high impedance Hi-Z state in the third period S3 in the single cycle T1 of each of the internal clock signals.

Figure 22A:
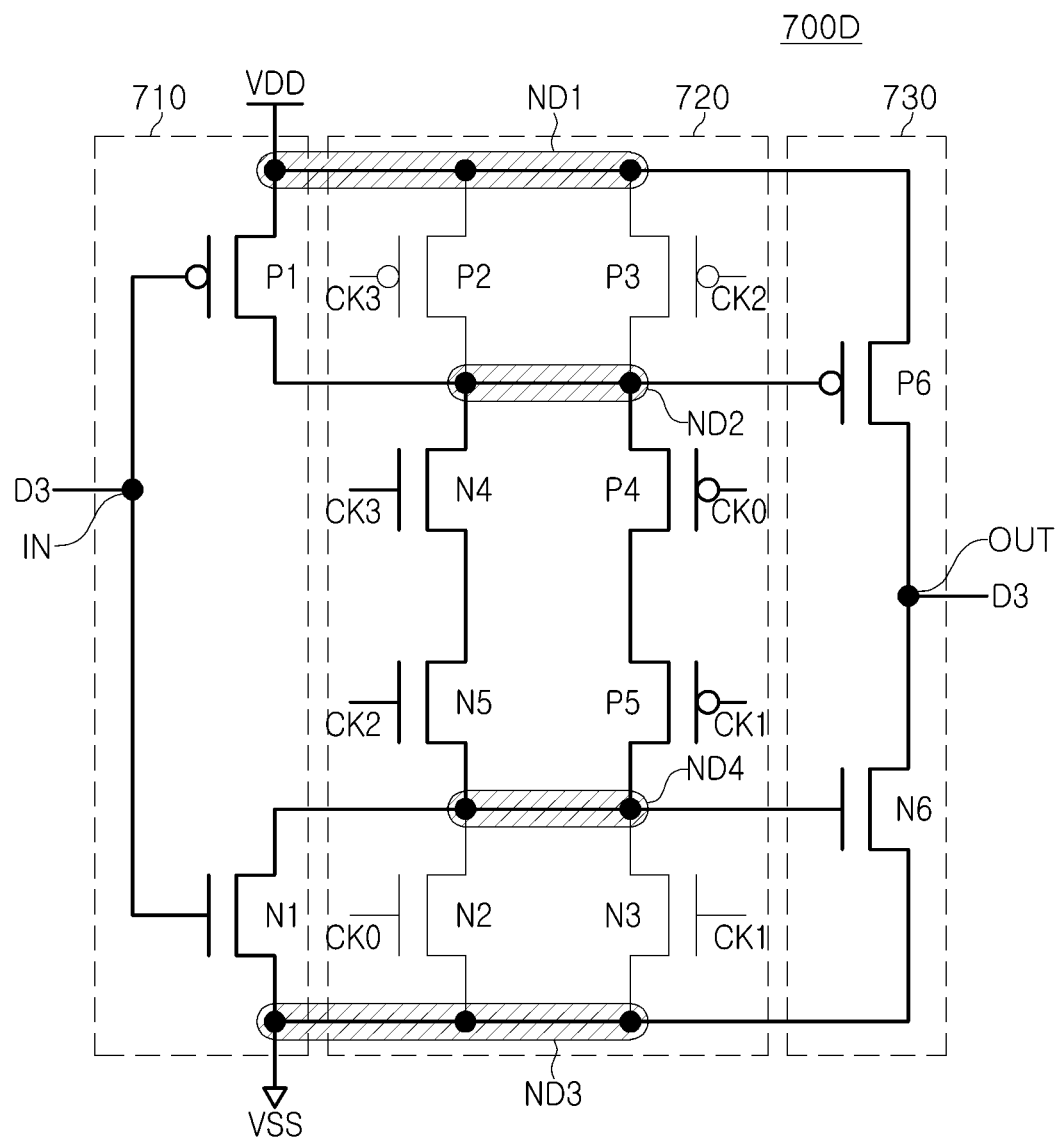
Figure 22B:
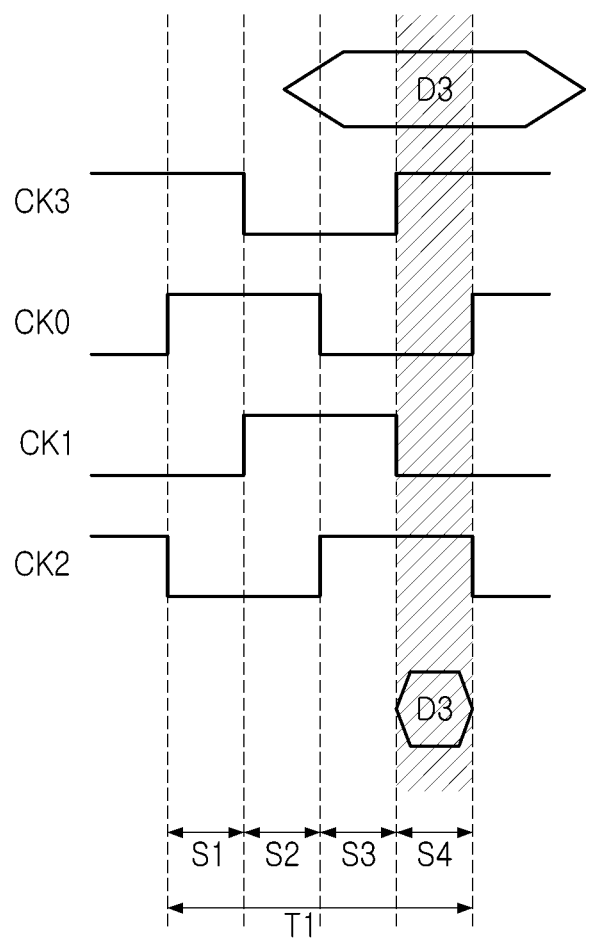

As illustrated in FIGS. 22A and 22B, the logic values of the fourth, first, second, and third internal clock signals CK3, CK0, CK1, and CK2 may form a bit stream of "1001" in the fourth period S4 in a single cycle T1 of each of the internal clock signals. The second PMOS transistor P2, the third PMOS transistor P3, the second NMOS transistor N2, and the third NMOS transistor N3 may be turned off, and the fourth NMOS transistor N4, the fifth NMOS transistor N5, the fourth PMOS transistor P4, and the fifth PMOS transistor P5 may be turned on. Accordingly, the second node ND2 may be electrically connected to the fourth node ND4.

When the fourth data D3 has a first level (e.g., low level), the second node ND2 may have a second level (e.g., high level) by the power voltage VDD, and the fourth node ND4 electrically connected to the second node ND2 may also have the second level.

The sixth PMOS transistor P6 may be turned off by the level of the second node ND2 having the second level (e.g., high level), and the sixth NMOS transistor N6 may be turned on by the level of the fourth node ND4 having the second level (e.g., high level). The output node OUT may have the same first level same as the logic level of the fourth data D3 by the ground voltage VSS.

When the fourth data D3 has a second level (e.g., high level), the fourth node ND4 may have a first level (e.g., low level) by the ground voltage VSS, and the second node ND2 electrically connected to the fourth node ND4 may also have the first level.

The sixth PMOS transistor P6 may be turned on by the level of the second node ND2 having the first level (e.g., low level), and the sixth NMOS transistor N6 may be turned off by the level of the fourth node ND4 having the first level (e.g., low level). The output node OUT may have the same second level as the logic level of the fourth data D3 by the power voltage VDD.

Accordingly, the first data selector 700D may output the input data D3 as valid data in the fourth period S4 in a single cycle T1 of each of the internal clock signals, and may operate as an equivalent circuit in which two inverters are connected to each other.

As described with reference to FIGS. 19A to 22A and 19B to 22B, the fourth data selectors 700A-700D may output the input data D3 as valid data in the fourth period S4 in a single cycle T1 of each of the internal clock signals, and may have a high impedance Hi-Z state in the first to third periods S1 to S3 regardless of the logic level of the data D3.

Hereinafter, a 6:1 serializer for serializing six pieces of parallel data using internal clock signals having different phases will be described as an example.

Figure 23:
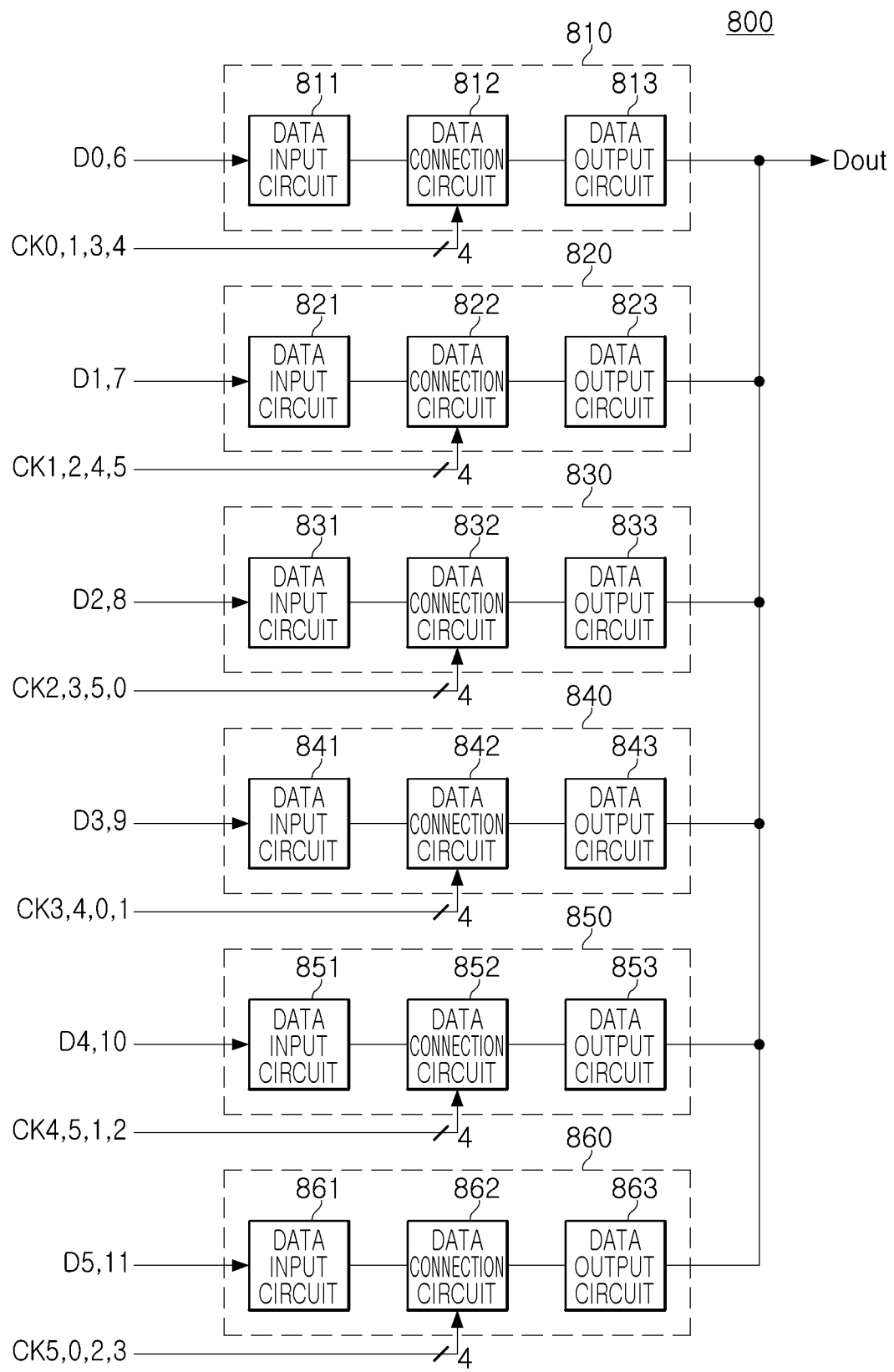
FIG. 23 is a block diagram illustrating a serializer according to an example embodiment of the present disclosure.
Figure 24:
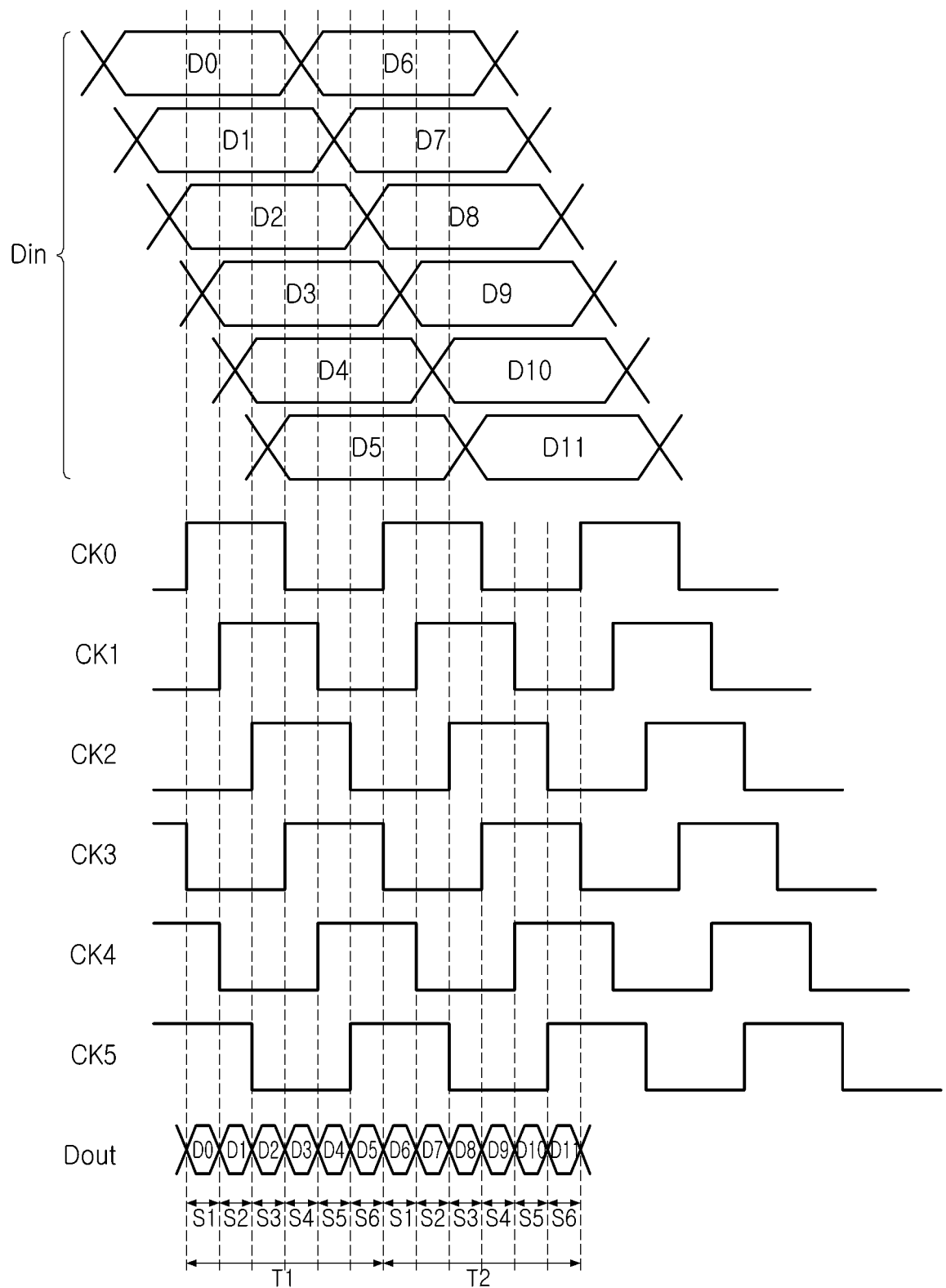
FIG. 24 is a timing diagram illustrating an operation of a serializer according to an example embodiment of the present disclosure.

FIG. 23 is a block diagram illustrating a serializer according to an example embodiment. FIG. 24 is a timing diagram illustrating an operation of a serializer according to an example embodiment.

Referring to FIG. 23, a serializer 800 may include first to sixth data selectors 810-860. The first to sixth data selectors 810 to 860 may receive internal clock signals CK0 to CK5 having different phases in different arrangements. The first to sixth data selectors 810-860 may serialize data D0-D5 input in parallel in response to the internal clock signals CK0-CK5 and may output the serialized data Dout.

Each of the first to sixth data selectors 810-860 may have the same structure. The first to sixth data selectors 810-860 may include data input circuits 811, 821, 831, 841, 851, and 861, data connection circuits 812, 822, 832, 842, 852, and 862, and data output circuits 813, 823, 833, 843, 853, and 863.

The data input circuits 811, 821, 831, 841, 851, and 861 may receive the data D0-D5 in parallel, respectively.

The data connection circuits 812, 822, 832, 842, 852, and 862 may receive the internal clock signals CK0-CK5 having different phases in different arrangements. Accordingly, circuits corresponding to each other in the data connection circuits 812, 822, 832, 842, 852, and 862 may receive different internal clock signals. For example, when the internal clock signals are input to the first data connection circuit 812 in an arrangement of first internal clock signal CK0, the second internal clock signal CK1, the fourth internal clock signal CK3, and the fifth internal clock signal CK4, the internal clock signals may be input to the second data connection circuit 822 in an arrangement of the second internal clock signal CK1, the third internal clock signal CK2, the fifth internal clock signal CK4, and the sixth internal clock signal CK5, the internal clock signals may be input to the third data connection circuit 832 in an arrangement of the third internal clock signal CK2, the fourth internal clock signal CK3, the sixth internal clock signal CK5, and the first internal clock signal CK0, the internal clock signals may be input to the fourth data connection circuit 842 in an arrangement of the fourth internal clock signal CK3, the fifth internal clock signal CK4, the first internal clock signal CK0, and the second internal clock signal CK1, the internal clock signals may be input to the fifth data connection circuit 852 in an arrangement of the fifth internal clock signal CK4, the sixth internal clock signal CK5, the second internal clock signal CK1, and the third internal clock signal CK2, and the internal clock signals may be input to the sixth data connection circuit 862 in an arrangement of the sixth internal clock signal CK5, the first internal clock signal CK0, the third internal clock signal CK2, and the fourth internal clock signal CK3. The data connection circuits 812, 822, 832, 842, 852, and 862 may activate the data selectors 810-860 in sequence in a single cycle (e.g., T1) of the internal clock signal.

As the data selectors 810-860 are activated in sequence, the data output circuits 813, 823, 833, 843, 853, and 863 may transmit the data D0-D5 in sequence in a single cycle (e.g., T1) of the internal clock signal.

Referring to FIGS. 23 and 24 together, phases of the first to sixth internal clock signals CK0-CK5 may be shifted from each other by 60 degrees. The first to sixth internal clock signals CK0-CK5 may have the same logic value or different logic values in six periods S1-S6 in a single cycle T1 of each of the internal clock signals.

For example, since the first data connection circuit 812 may receive internal clock signals in an arrangement of the first internal clock signal CK0, the second internal clock signal CK1, the fourth internal clock signal CK3, and the fifth internal clock signal CK4, logical values of the internal clock signals CK0, CK1, CK3, and CK4 may form a bit stream of "1001" in the first period S1, may form a bit stream of "1100" in the second section S2, may form a bit stream of "1100" in the third period S3, may form a bit stream of "0110" in the fourth period S4, may form a bit stream of "0011" in the fifth period S5, and may form a bit stream of "0011" in the sixth section S6. The first period S1 in which the logical values of the internal clock signals CK0, CK1, CK3, and CK4 form a bit stream of "1001" may be defined as an enable period, and the second to sixth periods S2-S6 may be defined as a disable period. Accordingly, when the first data input circuit 811 receives the first data D0, the first data output circuit 813 may output the first data D0 as valid data in the first period S1, and may have a high impedance Hi-Z state in the second to sixth periods S2-S6.

Similarly, the second data selector 820 may receive internal clock signals in an arrangement of the second internal clock signal CK1, the third internal clock signal CK2, the fifth internal clock signal CK4, and the sixth internal clock signal CK5. Accordingly, when the second data selector 820 receives the second data D1, the second data selector 820 may output the second data D1 as valid data in the second period S2, and may have a high impedance Hi-Z state in the first period S1 and the third to sixth periods S3-S6.

The third data selector 830 may receive internal clock signals in an arrangement of the third internal clock signal CK2, the fourth internal clock signal CK3, the sixth internal clock signal CK5, and the first internal clock signal CK0. Accordingly, when the third data selector 830 receives the third data D2, the third data selector 830 may output the third data D2 as valid data in the third period S3, and may have a high impedance Hi-Z state in the first period S1, the second period S2, and the fourth to sixth periods S4-S6.

The fourth data selector 840 may receive internal clock signals in an arrangement of the fourth internal clock signal CK3, the fifth internal clock signal CK4, the first internal clock signal CK0, and the second internal clock signal CK1. Accordingly, when the fourth data selector 840 receives the third data D3, the fourth data selector 840 may output the third data D3 as valid data in the fourth period S4, and may have a high impedance Hi-Z state in the first to third periods S1-S3, the fifth period S5, and the sixth period S6.

The fifth data selector 850 may receive internal clock signals in an arrangement of the fifth internal clock signal CK4, the sixth internal clock signal CK5, the second internal clock signal CK1, and the third internal clock signal CK2. Accordingly, when the fifth data selector 850 receives the fifth data D4, the fifth data selector 850 may output the fifth data D4 as valid data in the fifth period S5, and may have a high impedance Hi-Z state in the first to fourth periods S1-S4 and the sixth period S6.

The sixth data selector 860 may receive internal clock signals in an arrangement of the sixth internal clock signal CK5, the first internal clock signal CK0, the third internal clock signal CK2, and the fourth internal clock signal CK3. Accordingly, when the sixth data selector 860 receives the sixth data D5, the sixth data selector 860 may output the sixth data D5 as valid data in the sixth period S6, and may have a high impedance Hi-Z state in the first to fifth periods S1-S5.

In an example embodiment, the first to sixth data selectors 810-860 may receive internal clock signals CK0-CK5 having different phases in different arrangements such that the first to sixth data selectors 810-860 may be activated in sequence in the single cycle T1 of each of the internal clock signals. The first to sixth data selectors 810-860 activated in sequence may output data D0-D5 input in parallel in sequence. Since the first to sixth data selectors 810-860 may sample data using the internal clock signals CK0-CK5 as is, the transmission path of the internal clock signals CK0-CK5 may be reduced. Also, since it is not necessary to convert the internal clock signals CK0-CK5 into signals having a pulse width corresponding to the UI of the output data, a phase skew of a signal which may occur due to the clock selector may be eliminated.

In an example embodiment, the first to sixth data selectors 810-860 may receive internal clock signals CK0-CK5 having different phases in different arrangements such that the first to sixth data selectors 810-860 may be activated in sequence in a single cycle T2 of each of the internal clock signals after the single cycle T1. The first to sixth data selectors 810-860 activated in sequence may output data D6-D11 input in parallel in sequence.

FIGS. 25A to 30A and 25B to 30B are diagrams illustrating an operation of a first data selector according to an example embodiment.

Referring to FIGS. 25A to 30A, each of first data selectors 900A-900F may include a first data input circuit 910, a first data connection circuit 920, and a first data output circuit 930.

According to FIGS. 25A to 30A and 25B to 30B, as for operations of the first data selectors 900A-900F, the first data connection circuit 920 may receive internal clock signals in an arrangement of a first internal clock signal CK0, a second internal clock signal CK1, a fourth internal clock signal CK3, and a fifth internal clock signal CK4. The first data input circuit 910 may operate in response to the first data D0. When a logic level of the first data D0 is a first level (e.g., low level), a first PMOS transistor P1 may be turned on, and a first NMOS transistor N1 may be turned off. The first data connection circuit 920 may operate in response to the first internal clock signal CK0, the second internal clock signal CK1, the fourth internal clock signal CK3, and the fifth internal clock signal CK4. The first data output circuit 930 may operate in response to levels of the second node ND2 and the fourth node ND4.

Figure 25A:
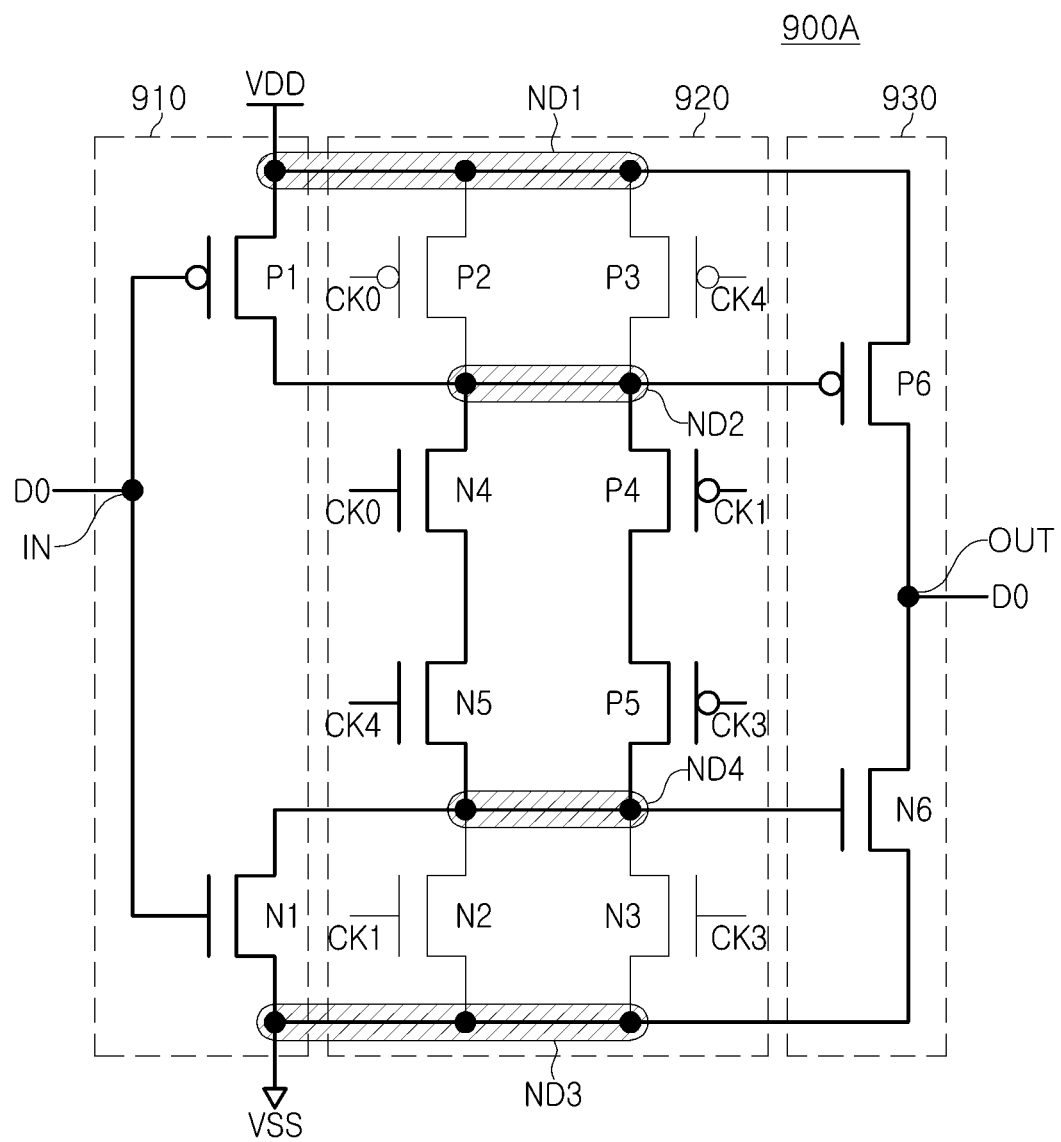
Figure 25B:
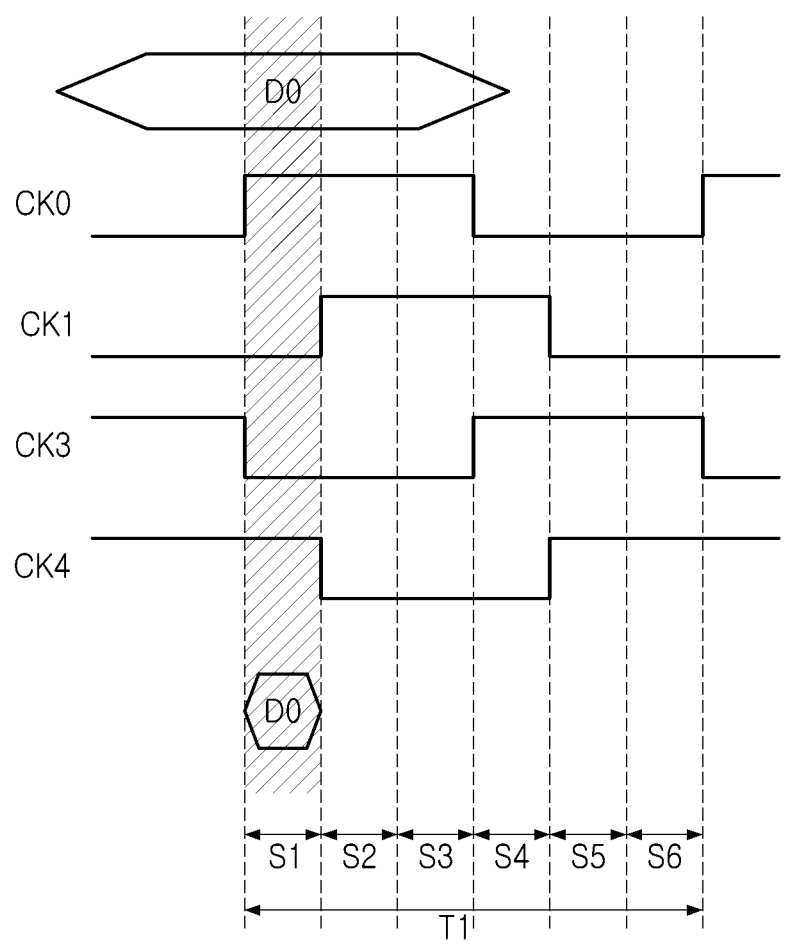

As illustrated in FIGS. 25A and 25B, the logic values of the internal clock signals CK0, CK1, CK3, and CK4 may form a bit stream of "1001" in a first period S1 in a single cycle T1 of each of the internal clock signals. The second PMOS transistor P2, the third PMOS transistor P3, the second NMOS transistor N2, and the third NMOS transistor N3 may be turned off, and the fourth NMOS transistor N4, the fifth NMOS transistor N5, the fourth PMOS transistor P4, and the fifth PMOS transistor P5 may be turned on. Accordingly, the second node ND2 may be electrically connected to the fourth node ND4.

When the first data D0 has a first level (e.g., low level), the second node ND2 may have a second level (e.g., high level) by a power voltage VDD, and the fourth node ND4 electrically connected to the second node ND2 may also have the second level.

The sixth PMOS transistor P6 may be turned off by the level of the second node ND2 having a second level (e.g., high level), and the sixth NMOS transistor N6 may be turned on by the level of the fourth node ND4 having the second level. An output node OUT may have the same first level as the logic level of the first data D0 by a ground voltage VSS.

When the first data D0 has a second level (e.g., high level), the fourth node ND4 may have a first level (e.g., low level) by the second voltage VSS, and the second node ND2 electrically connected to the fourth node ND4 may also have the first level.

The sixth PMOS transistor P6 may be turned on by the level of the second node ND2 having the first level (e.g., low level), and the sixth NMOS transistor N6 may be turned off by the level of the fourth node ND4 having the first level (e.g., low level). The output node OUT may have the same second level as the logic level of the first data D0 by the power voltage VDD.

Accordingly, the first data selector 900A may output the input data D0 as valid data in the first period S1 in the single cycle T1 of each of the internal clock signals, and may operate as an equivalent circuit in which two inverters are connected to each other.

Figure 26A:
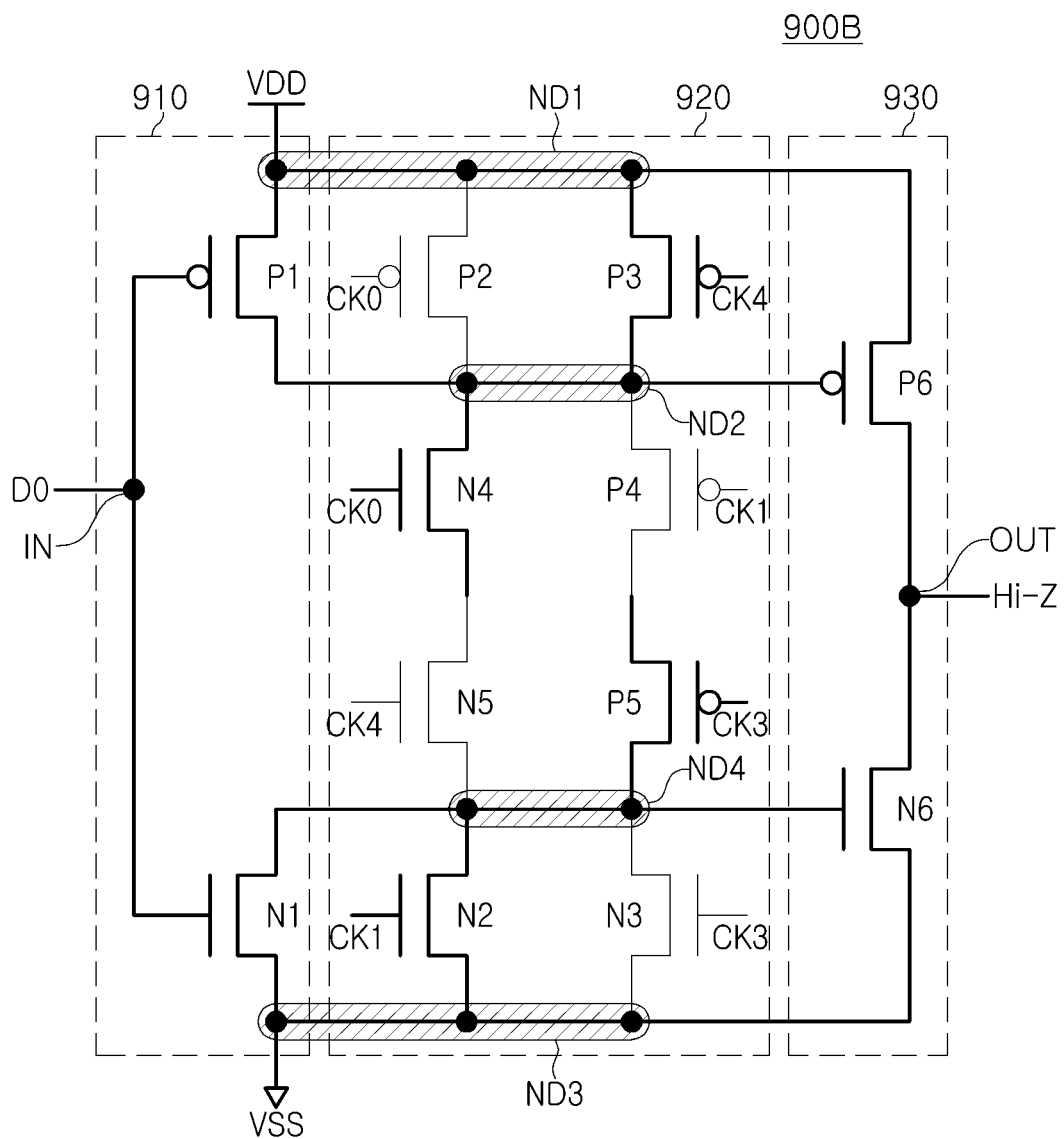
Figure 26B:
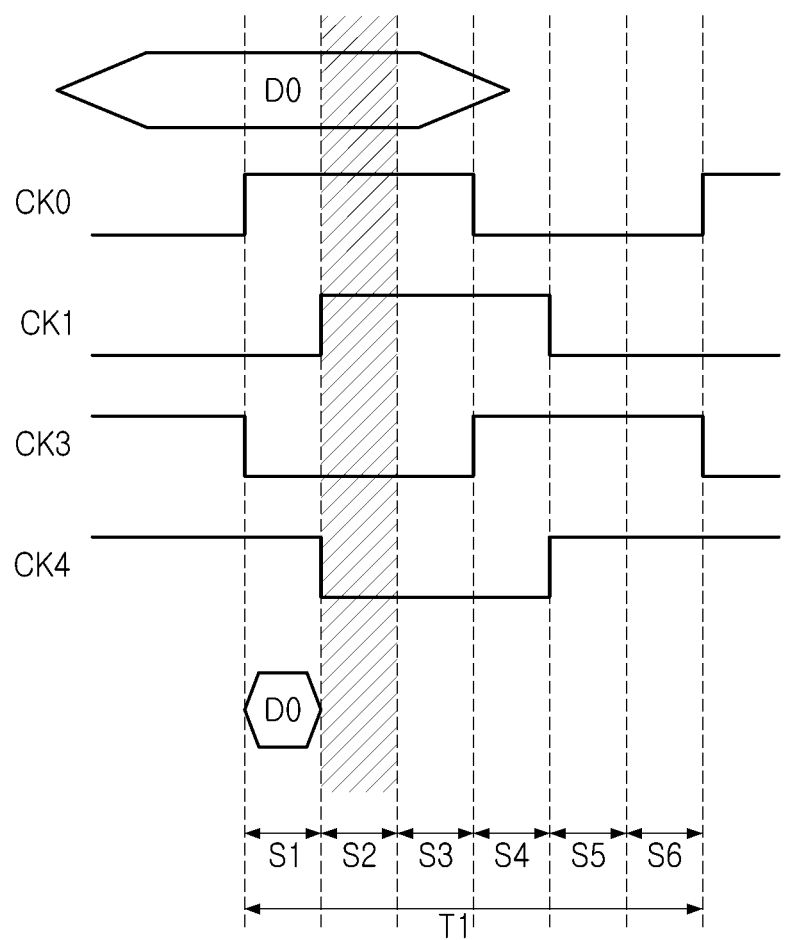

As illustrated in FIGS. 26A and 26B, the logic values of the internal clock signals CK0, CK1, CK3, and CK4 may form a bit stream of "1100" in the second period S2 in the single cycle T1 of each of the internal clock signals. The second PMOS transistor P2, the fourth PMOS transistor P4, the fifth NMOS transistor N5, and the third NMOS transistor N3 may be turned off, and the fourth NMOS transistor N4, the second NMOS transistor N2, the third PMOS transistor P3, and the fifth PMOS transistor P5 may be turned on. Accordingly, the section between the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 900B may have a high impedance Hi-Z state in the second period S2 in the single cycle T1 of each of the internal clock signals.

Figure 27A:
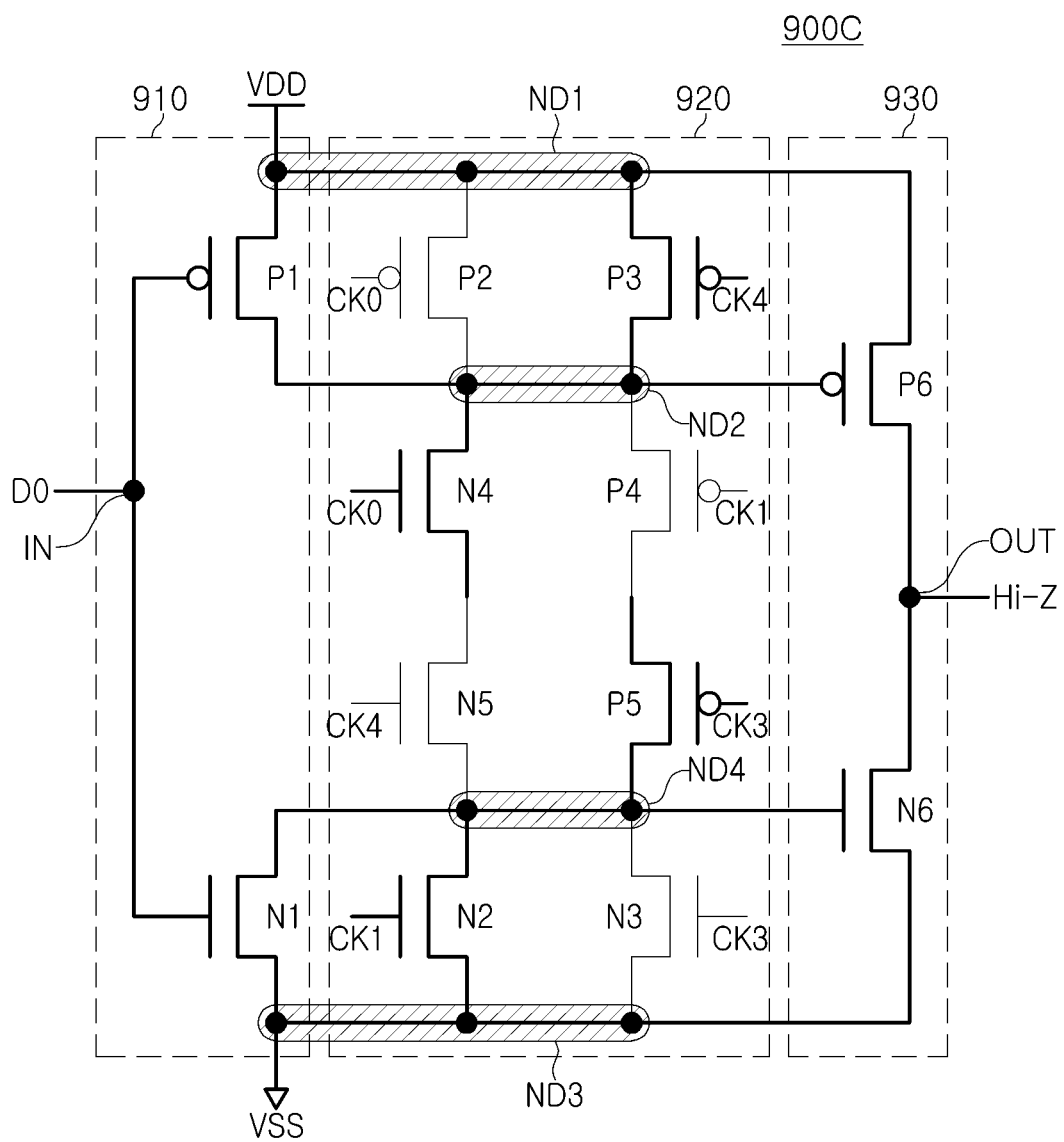
Figure 27B:
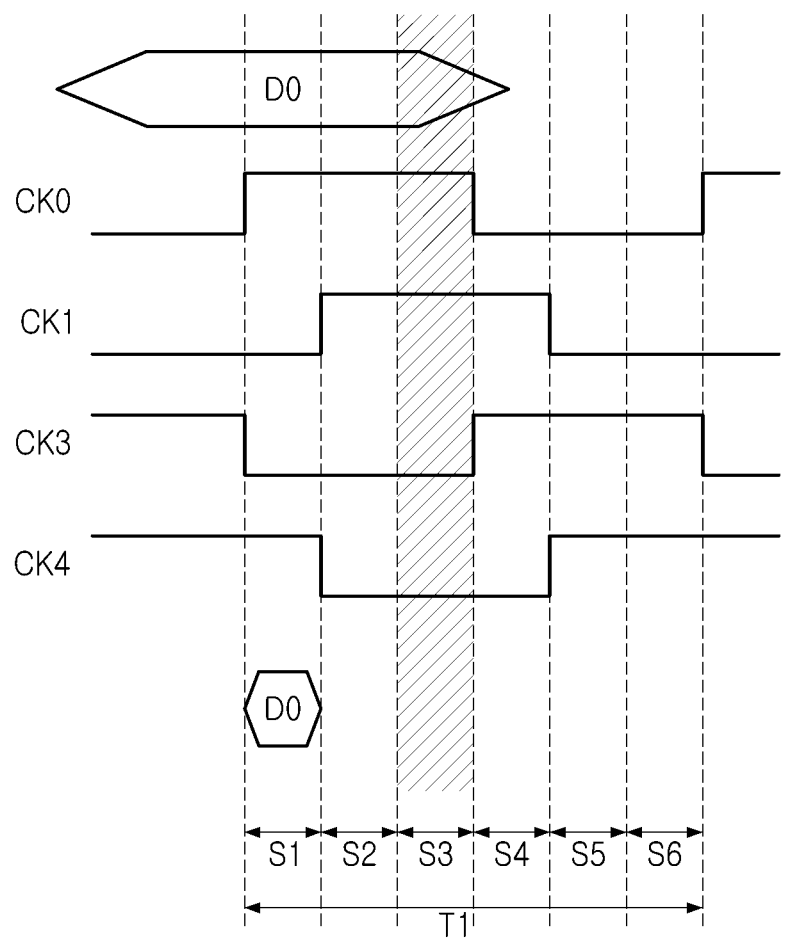

Referring to FIGS. 27A and 27B, the logic values of the internal clock signals CK0, CK1, CK3, and CK4 may form a bit stream of "1100" in the third period S3 in the single cycle T1 of each of the internal clock signals. The second PMOS transistor P2, the fourth PMOS transistor P4, the fifth NMOS transistor N5, and the third NMOS transistor N3 may be turned off, and the fourth NMOS transistor N4, the second NMOS transistor N2, the third PMOS transistor P3, and the fifth PMOS transistor P5 may be turned on. Accordingly, the section between the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 900C may have a high impedance Hi-Z state in the third period S3 in the single cycle T1 of each of the internal clock signals.

Figure 28A:
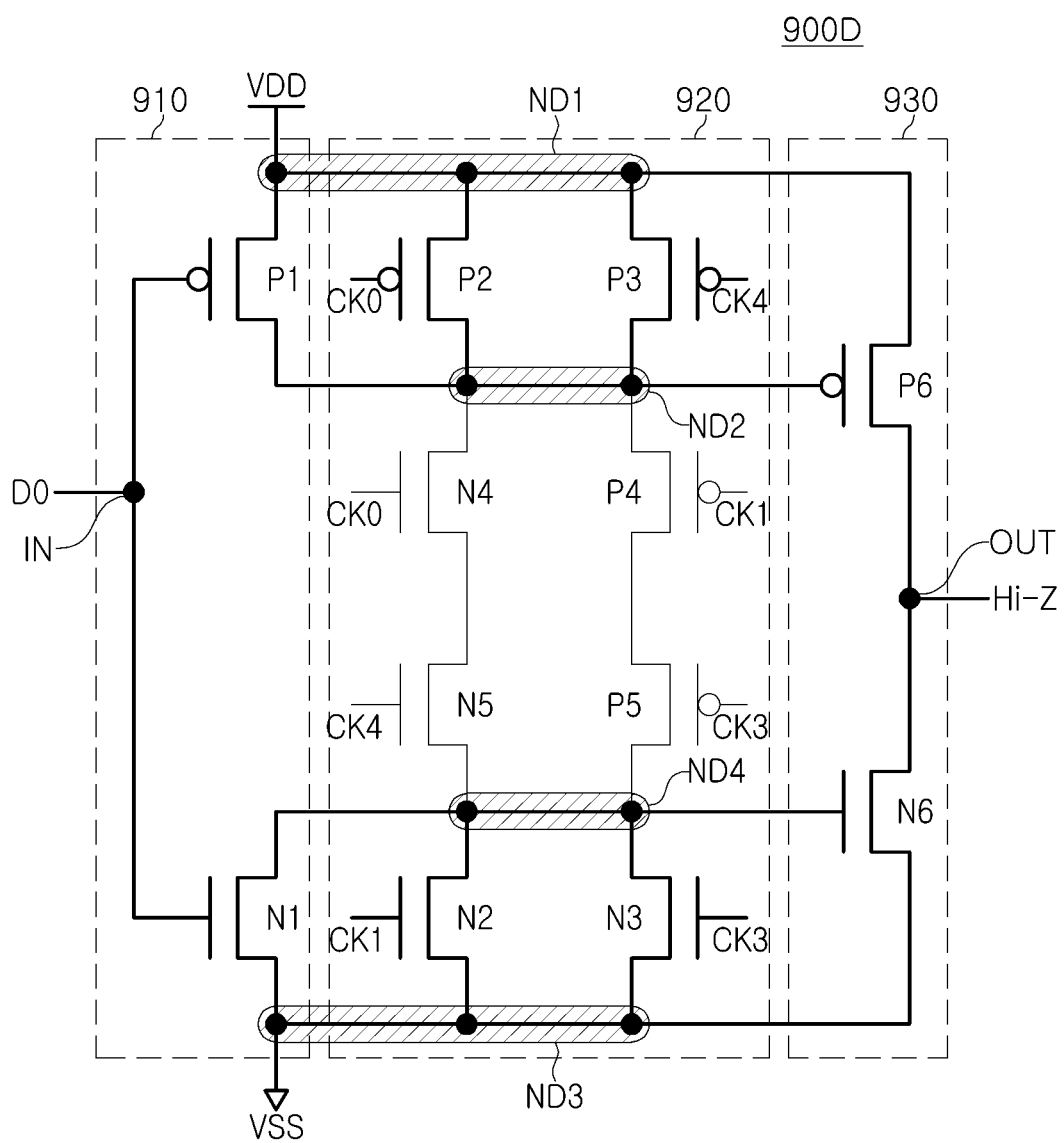
Figure 28B:
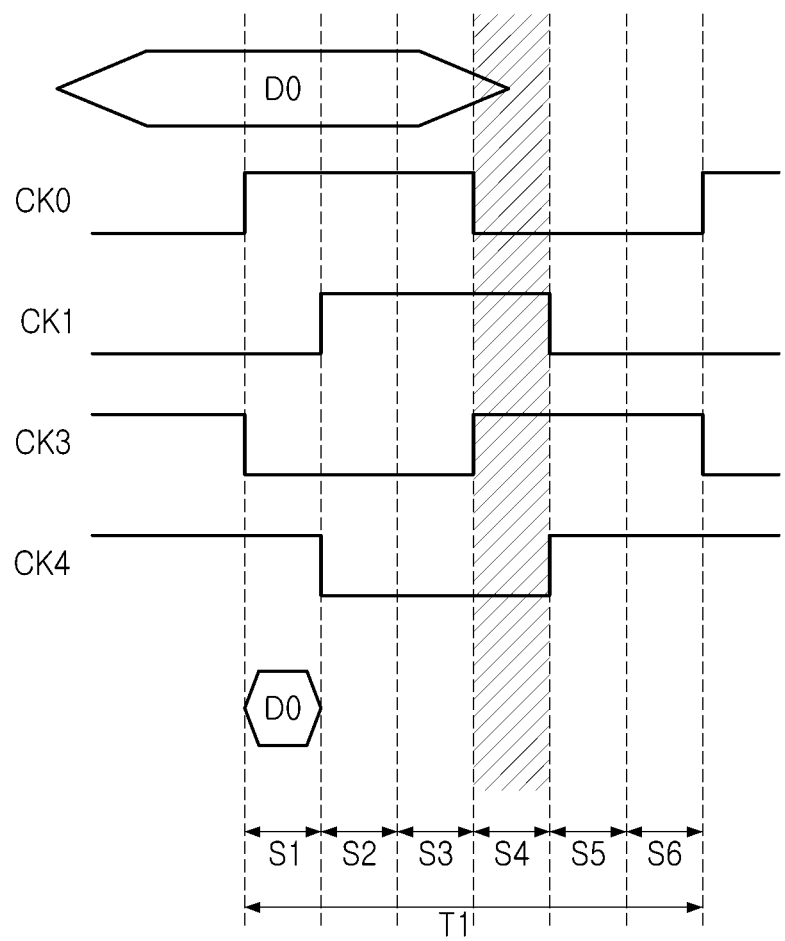

As illustrated in FIGS. 28A and 28B, the logic values of the internal clock signals CK0, CK1, CK3, and CK4 may form a bit stream of "0110" in the fourth period S4 in the single cycle T1 of each of the internal clock signals. The fourth PMOS transistor P4, the fifth PMOS transistor P5, the fourth NMOS transistor N4, and the fifth NMOS transistor N5 may be turned off, and the second NMOS transistor N2, the third NMOS transistor N3, the second PMOS transistor P2, and the third PMOS transistor P3 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 900D may have a high impedance Hi-Z state in the fourth period S4 in the single cycle T1 of each of the internal clock signals.

Figure 29A:
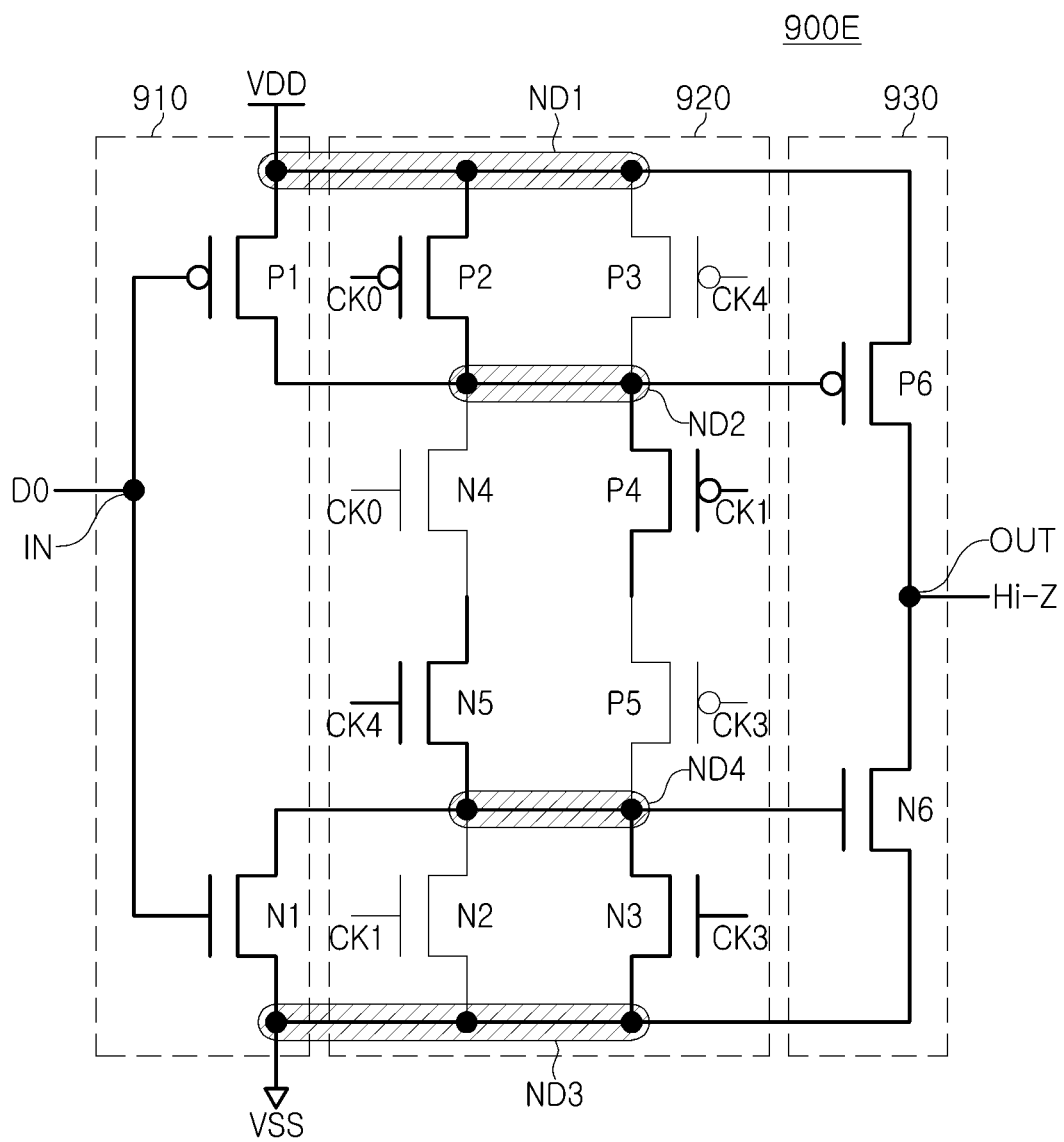
Figure 29B:
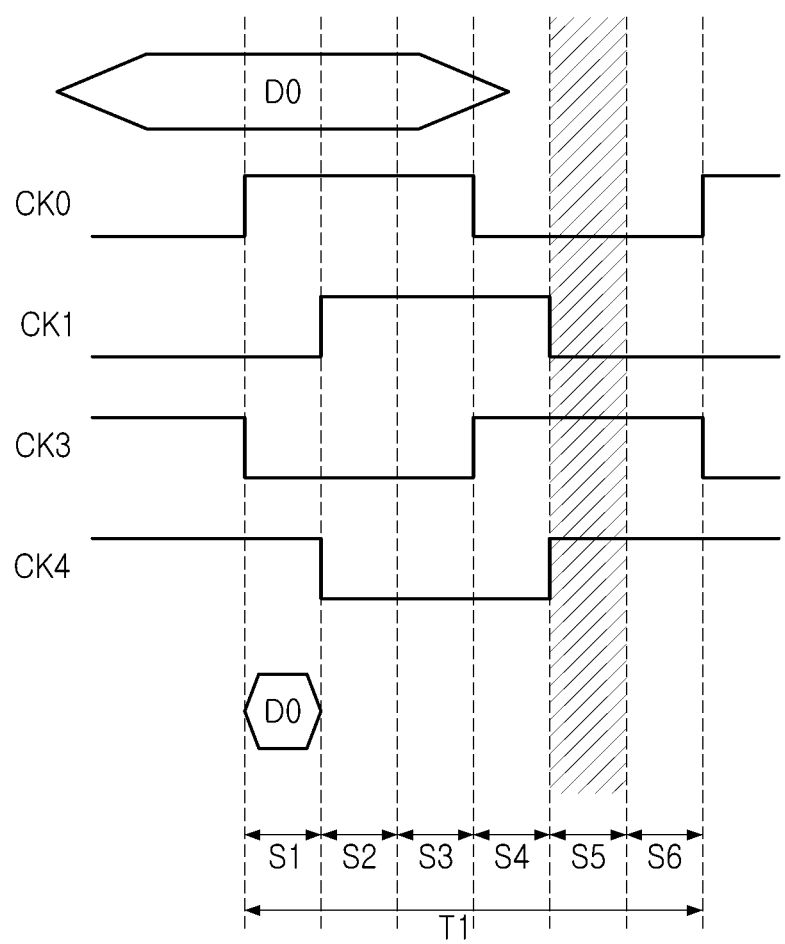

As illustrated in FIGS. 29A and 29B, the logic values of the internal clock signals CK0, CK1, CK3, and CK4 may form a bit stream of "0011" in the fifth period S5 in a single cycle T1 of each of the internal clock signals. The third PMOS transistor P3, the fifth PMOS transistor P5, the fourth NMOS transistor N4, and the second NMOS transistor N2 may be turned off, and the fifth NMOS transistor N5, the third NMOS transistor N3, the second PMOS transistor P2, and the fourth PMOS transistor P4 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 900E may have a high impedance Hi-Z state in the fourth period S4 in the single cycle T1 of each of the internal clock signals.

Figure 30A:
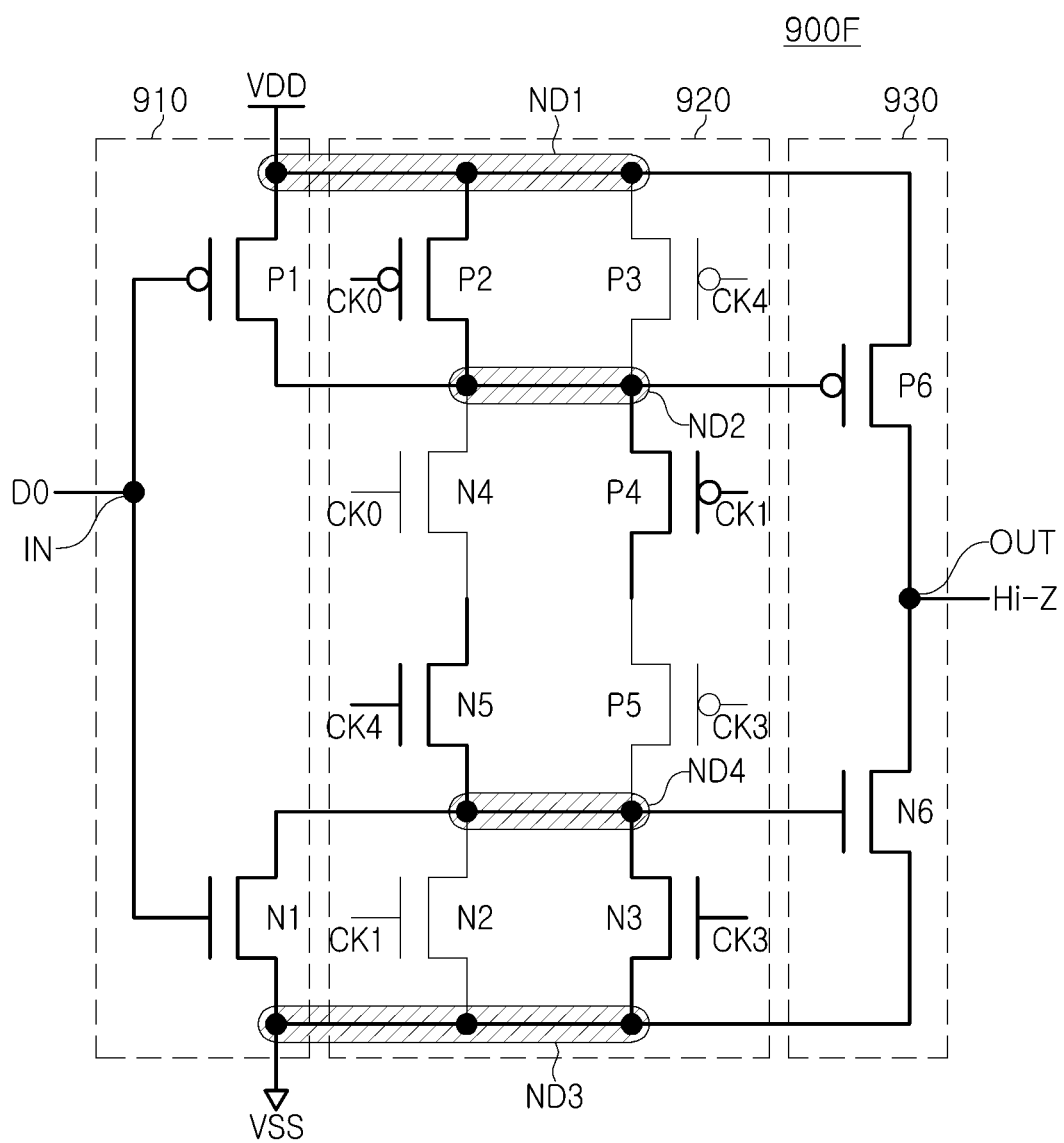
Figure 30B:
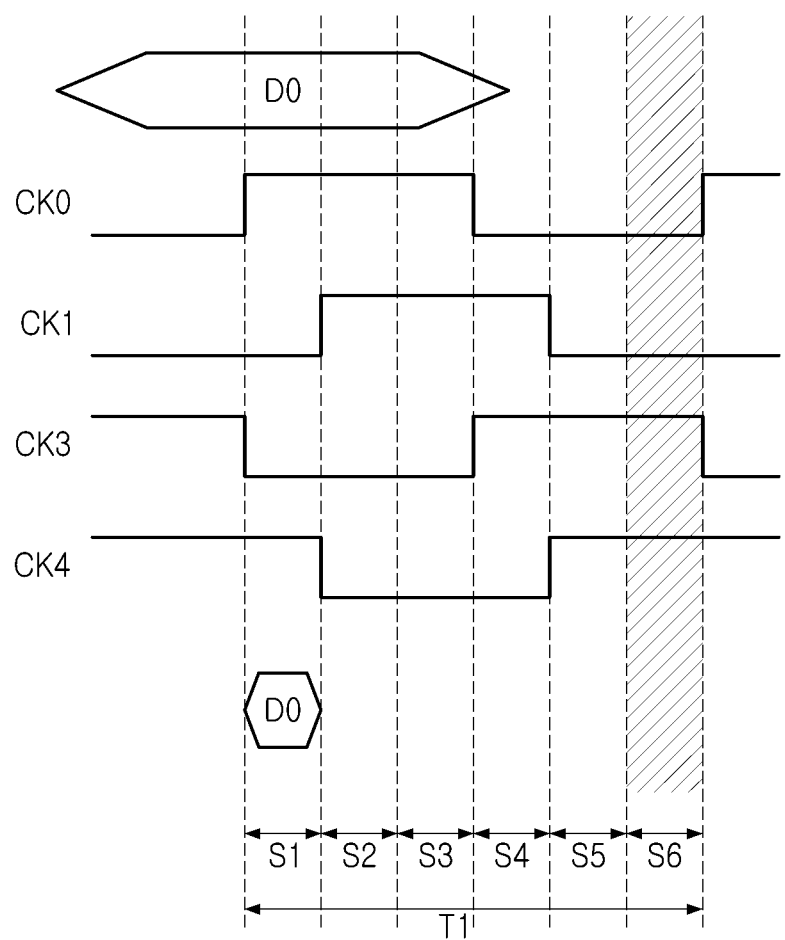

Referring to FIGS. 30A and 30B, the logic values of the internal clock signals CK0, CK1, CK3, and CK4 may form a bit stream of "0011" in the sixth period S6 in a single cycle T1 of each of the internal clock signals. The third PMOS transistor P3, the fifth PMOS transistor P5, the fourth NMOS transistor N4, and the second NMOS transistor N2 may be turned off, and the fifth NMOS transistor N5, the third NMOS transistor N3, the second PMOS transistor P2, and the fourth PMOS transistor P4 may be turned on. Accordingly, the second node ND2 and the fourth node ND4 may be open, or the third circuit may be electrically floated between the second node ND2 and the fourth node ND4. The second node ND2 may have a second level (e.g., high level) by the power voltage VDD, and the fourth node ND4 may have a first level (e.g., low level) by the ground voltage VSS.

The sixth PMOS transistor P6 may be turned off by the level of the second node ND2 having the second level (e.g., high level), and the sixth NMOS transistor N6 may also be turned off by the level of the fourth node ND4 having the first level (e.g., low level).

Accordingly, the first data selector 900F may have a high impedance Hi-Z state in the sixth period S6 in the single cycle T1 of each of the internal clock signals.

As described with reference to FIGS. 25A to 30A and 25B to 30B, the first data selectors 900A-900F may output the input data D0 as valid data in the first period S1 in the single cycle T1 of each of the internal clock signals, and may have a high impedance Hi-Z state in the second to sixth periods S2-S6 regardless of the logic level of the data D0.

Similarly, the second data selector 820 may output the input data D1 as valid data in the second period S2 in the single cycle T1 of each of the internal clock signals, and may have a high impedance Hi-Z state in the first period S1 and the third to sixth periods S3-S6 regardless of the logic level of the data D1.

The third data selector 830 may output the input data D2 as valid data in the third period S3 in the single cycle T1 of each of the internal clock signals, and may have a high impedance Hi-Z state in the first period S1, the second period S2 and the fourth to sixth periods S4-S6 regardless of the logic level of the data D2.

The fourth data selector 840 may output the input data D3 as valid data in the fourth period S4 in the single cycle T1 of each of the internal clock signals, and may have a high impedance Hi-Z state in the first to third periods S1-S3, the fifth period S5, and the sixth period S6 regardless of the logic level of the data D3.

The fifth data selector 850 may output the input data D4 as valid data in a fifth period S5 in the single cycle T1 of each of the internal clock signals, and may have a high impedance Hi-Z state in the first to fourth periods S1-S4 and the sixth period S6 regardless of the logic level of the data D4.

The sixth data selector 860 may output the input data D5 as valid data in the sixth period S6 in the single cycle T1 of each of the internal clock signals, and may have a high impedance Hi-Z state in the first to fifth periods S1-S5 regardless of the logic level of the data D5.

In the description above, the example embodiments have been described based on a 4:1 serializer and a 6:1 serializer as examples, but an example embodiment thereof is not limited thereto. Since the internal clock signals having different phases may be received in different arrangements such that the data selectors are activated in sequence in a single period of the clock signal, the example embodiments may also be applied to an 8:1 serializer and a 10:1 serializer.

Figure 31:
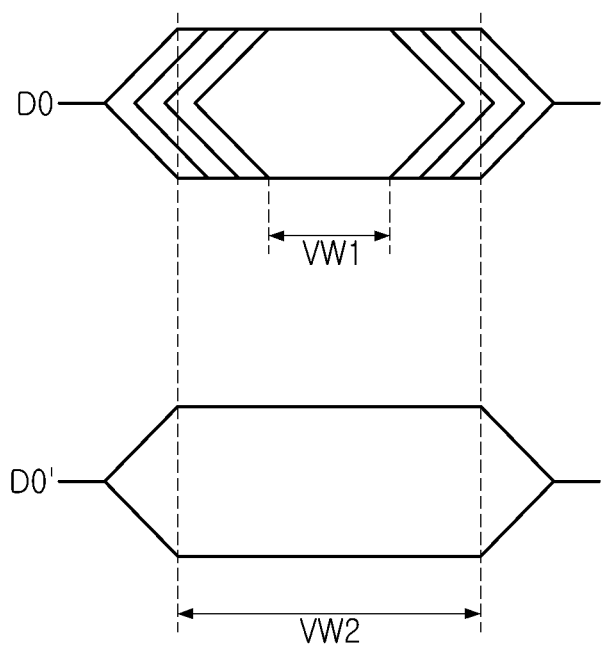
FIG. 31 is a diagram illustrating a valid window of output data according to an example embodiment of the present disclosure.

FIG. 31 is a diagram illustrating a valid window of output data according to an example embodiment. Referring to FIG. 31, when data is sampled by converting internal clock signals into signals having a pulse width corresponding to a UI of output data, a size of an effective window VW1 of data D0 may reduce, which may be disadvantageous in terms of signal integrity (SI).

In the example embodiment, data may be sampled using the internal clock signals as they are without converting the internal clock signals to signals having a pulse width corresponding to the UI of the output data when the data is sampled. Accordingly, the size of the effective window VW2 of the data D0' may relatively increase, such that signal integrity SI may improve.

According to the aforementioned example embodiments, since the serializer does not need to convert the internal clock signals into signals having a pulse width corresponding to a unit period of output data when sampling data, the time for which data is output to an external entity may be reduced.

Also, a phase skew of a signal which may occur by converting the internal clock signals may be eliminated, such that signal integrity may improve.

While the example embodiments have been illustrated and described above, it will be apparent to those skilled in the art that modifications and variations could be made without departing from the scope of the present disclosure as defined by the appended claims.

What is claimed is:

1. A serializer, comprising:
   data input circuits configured to receive N-number of pieces of data in parallel, where N is an even number;
   data connection circuits configured to receive internal clock signals having different phases in different arrangements; and
   data output circuits configured to output the N-number of pieces of data in sequence in a single cycle of each of the internal clock signals,
   wherein the data connection circuits are configured to operate the data output circuits such that the data output circuits, in response to the internal clock signals:
   output corresponding data of the N-number of pieces of data in an enable period in the single cycle, and
   have a high impedance state in a disable period in the single cycle.

2. The serializer of claim 1, wherein logic values of the internal clock signals form different bit streams in the enable period and the disable period.

3. The serializer of claim 1, wherein, in the disable period, each of the data output circuits is configured to have the high impedance state regardless of a logic level of the corresponding data.

4. The serializer of claim 1, wherein each of the data input circuits includes:
   a first PMOS transistor having a first end connected to a first node for receiving a first voltage, a second end connected to a second node, and a gate for receiving a corresponding data; and
   a first NMOS transistor having a first end connected to a third node for receiving a second voltage, a second end connected to a fourth node, and a gate for receiving the corresponding data.

5. The serializer of claim 4, wherein each of the data connection circuits includes:
   fourth and fifth PMOS transistors connected in series between the second node and the fourth node; and
   fourth and fifth NMOS transistors connected in series between the second node and the fourth node.

6. The serializer of claim 5, wherein the fourth and fifth PMOS transistors and the fourth and fifth NMOS transistors are turned on in the enable period.

7. The serializer of claim 5, wherein the second node and the fourth node are electrically floating in the disable period.

8. The serializer of claim 5, wherein each of the data connection circuits further includes:
   second and third PMOS transistors connected in parallel between the first node and the second node; and
   second and third NMOS transistors connected in parallel between the third node and the fourth node.

9. The serializer of claim 8, wherein the second and third PMOS transistors and the second and third NMOS transistors are turned off in the enable period.

10. The serializer of claim 4, wherein each of the data output circuits includes:
    a sixth PMOS transistor having a first end connected to the first node, a second end, and a gate connected to the second node; and
    a sixth NMOS transistor having a first end connected to the third node, a second end connected to the second end of the sixth PMOS transistor, and a gate connected to the fourth node.

11. The serializer of claim 10, wherein the second node is electrically connected to the fourth node in the enable period, and the second node and the fourth node are electrically floating in the disable period.

12. A serializer, comprising:
    a plurality of data selectors configured to receive N-number of pieces of data in parallel, to receive internal clock signals having different phases, and to output the N-number of pieces of data in sequence in a single cycle of each of the internal clock signals, where N is an even number,
    wherein each of the plurality of data selectors includes:
    a first circuit connected between a first node supplied with a first voltage and a second node, and configured to supply the first voltage from the first node to the second node in response to a corresponding data among the N-number of pieces of data and at least a portion of the internal clock signals;
    a second circuit connected between a third node supplied with a second voltage and a fourth node, and configured to supply the second voltage from the third node to the fourth node in response to the corresponding data and at least a portion of the internal clock signals;
    a third circuit configured to electrically connect the second node to the fourth node or to electrically float between the second node and the fourth node in response to at least a portion of the internal clock signals; and
    a fourth circuit configured to output the corresponding data based on a voltage level of the second node and a voltage level of the fourth node.

13. The serializer of claim 12, wherein each of the plurality of data selectors is configured to output the corresponding data in an enable period in the single cycle, and have a high impedance state in a disable period in the single cycle regardless of a logic level of the corresponding data.

14. The serializer of claim 13, wherein a voltage level of the second node and a voltage level of the fourth node are determined depending on a logic level of the corresponding data in the enable period.

15. The serializer of claim 13, wherein the second node is electrically connected to the fourth node in the enable period.

16. The serializer of claim 13, wherein the second node and the fourth node are electrically floating in the disable period.

17. A memory device, comprising:
    an internal clock generation circuit configured to:
    receive a reference clock signal output from a memory controller, and
    generate internal clock signals having different phases based on the reference clock signal; and
    a serializer configured to:
    receive N-number of pieces of data output from a memory core through a data path in parallel, where N is an even number,
    receive the internal clock signals output from the internal clock generation circuit, and
    output the N-number of pieces of data in sequence in a single cycle of each of the internal clock signals in response to the internal clock signals,
    wherein the serializer includes a plurality of data selectors, and wherein the plurality of data selectors are configured to receive the internal clock signals in different arrangements.

18. The memory device of claim 17, wherein each of the plurality of data selectors is configured to:
output a corresponding data in an enable period in the single cycle, and
have a high impedance state in a disable period in the single cycle.

19. The memory device of claim 18, wherein logic values of the internal clock signals form different bit streams in the enable period and the disable period.

20. The memory device of claim 18, wherein, in the disable period, each of the plurality of data selectors is configured to have the high impedance state regardless of a logic level of the corresponding data.

* * * * *